US012451051B2

(12) United States Patent
Lee et al.

(10) Patent No.: US 12,451,051 B2
(45) Date of Patent: Oct. 21, 2025

(54) DISPLAY PANEL

(71) Applicant: Samsung Display Co., Ltd., Yongin-si (KR)

(72) Inventors: Pilsuk Lee, Yongin-si (KR); Yoomin Ko, Yongin-si (KR); Sunho Kim, Yongin-si (KR); Hyewon Kim, Yongin-si (KR); Juchan Park, Yongin-si (KR); Chung Sock Choi, Yongin-si (KR); Sungjin Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/494,873

(22) Filed: Oct. 26, 2023

(65) Prior Publication Data

US 2024/0144865 A1 May 2, 2024

(30) Foreign Application Priority Data

Oct. 27, 2022 (KR) .................. 10-2022-0140301

(51) Int. Cl.
| | |
|---|---|
| G09G 3/32 | (2016.01) |
| G09G 3/20 | (2006.01) |
| G09G 3/3225 | (2016.01) |
| G09G 3/3233 | (2016.01) |
| H10K 59/123 | (2023.01) |
| H10K 59/131 | (2023.01) |
| H10K 59/121 | (2023.01) |

(52) U.S. Cl.
CPC ............... *G09G 3/32* (2013.01); *G09G 3/20* (2013.01); *G09G 3/3225* (2013.01);
(Continued)

(58) Field of Classification Search
CPC .......... H10K 59/131; H10K 59/1213; H10K 59/121; H10K 59/122; H10K 59/00;
(Continued)

(56) References Cited

U.S. PATENT DOCUMENTS 7,936,322 B2 5/2011 Chung et al.
10,755,648 B2 8/2020 Kim
(Continued)

FOREIGN PATENT DOCUMENTS

CN 113363298 9/2021
KR 10-1040816 6/2011
(Continued)

*Primary Examiner* — Dismery Mercedes
(74) *Attorney, Agent, or Firm* — Sughrue Mion, PLLC

(57) ABSTRACT

A display panel includes a base layer including a first display region, a second display region adjacent to the first display region, and a non-display region adjacent to the first display region and the second display region, a demultiplexer circuit overlapping the second display region, a first pixel including a first pixel driver overlapping the first display region, and a first light emitting element overlapping the first display region and electrically connected with the first pixel driver, and a second pixel including a second pixel driver overlapping the first display region, and a second light emitting element and a third light emitting element that are electrically connected with the second pixel driver. At least one of the second light emitting element and the third light emitting element overlaps the second display region and is disposed on the demultiplexer circuit.

30 Claims, 26 Drawing Sheets

(52) U.S. Cl.
CPC ......... *G09G 3/3233* (2013.01); *H10K 59/123* (2023.02); *H10K 59/131* (2023.02); *G09G 2300/0408* (2013.01); *G09G 2300/0426* (2013.01); *G09G 2310/0297* (2013.01); *G09G 2320/0257* (2013.01); *G09G 2320/043* (2013.01); *H10K 59/1213* (2023.02)

(58) Field of Classification Search
CPC ...... H10K 59/12; H10K 59/123; H10K 59/40; G09G 2300/0426; G09G 3/32; G09G 2300/0439; G09G 2320/0257; G09G 2320/043; G09G 2310/0297; G09G 3/3233; G09G 3/3225; G09G 2300/0408; G09G 2310/0262; G09G 2300/0452; G09G 3/20; G09G 2310/0264; G09G 2310/0281
See application file for complete search history.

(56) References Cited

U.S. PATENT DOCUMENTS

| | | |
|---|---|---|
| 11,380,235 B2 | 7/2022 | Huang et al. |
| 2003/0166336 A1* | 9/2003 | Kato .................... G02F 1/1345 438/689 |
| 2008/0068309 A1* | 3/2008 | Kwak .................... H10K 71/00 345/82 |
| 2011/0050741 A1* | 3/2011 | Jeong .................... G09G 3/3233 345/82 |
| 2017/0345878 A1* | 11/2017 | Lin ........................ H10K 59/30 |
| 2018/0183008 A1* | 6/2018 | Song ...................... H10K 50/844 |
| 2019/0079331 A1* | 3/2019 | Miyamoto ........ G02F 1/136227 |
| 2019/0347999 A1* | 11/2019 | Kim ...................... G09G 3/3688 |
| 2020/0380915 A1* | 12/2020 | Yoon ...................... G09G 3/3225 |
| 2021/0104192 A1* | 4/2021 | Huang ...................... G09G 3/20 |
| 2021/0159461 A1* | 5/2021 | Nakamura ........... H10K 50/844 |
| 2021/0241686 A1* | 8/2021 | Cheng .................. H10K 59/352 |
| 2022/0069047 A1* | 3/2022 | Yang .................... H10K 59/131 |
| 2022/0085132 A1 | 3/2022 | Kim et al. |
| 2022/0230573 A1* | 7/2022 | Nakagawa ................ G09F 9/30 |
| 2022/0319411 A1* | 10/2022 | Cheng .................. H10K 59/121 |
| 2023/0337465 A1* | 10/2023 | Huang .................... H10D 86/60 |
| 2024/0005855 A1* | 1/2024 | Chi ........................ H10K 59/131 |
| 2024/0164159 A1* | 5/2024 | Ma ........................ H10K 77/111 |
| 2024/0272734 A1* | 8/2024 | Liu ........................ G09G 3/3614 |

FOREIGN PATENT DOCUMENTS

| | | |
|---|---|---|
| KR | 10-2017-0063281 | 6/2017 |
| KR | 10-2022-0034952 | 3/2022 |

* cited by examiner

DISPLAY PANEL

CROSS-REFERENCE TO RELATED APPLICATION(S)

This application claims priority to and benefits of Korean Patent Application No. 10-2022-0140301 under 35 U.S.C. § 119, filed on Oct. 27, 2022 in the Korean Intellectual Property Office, the entire contents of which are incorporated herein by reference.

BACKGROUND

1. Technical Field

Embodiments of the disclosure described herein relate to a display panel having an extended display region.

2. Description of the Related Art

Multimedia electronic devices, such as televisions, mobile phones, tablet computers, car navigation devices, game machines, and the like, include a display panel for displaying an image.

To meet market demand, research is being conducted to reduce a region in which an image is not displayed on a display panel. At the same time, research is being conducted to extend a display region in which an image is displayed on a display panel and to reduce a bezel.

SUMMARY

Embodiments of the disclosure provide a display panel having a display region extended by decreasing the width of a bezel region. Embodiments of the disclosure provide a display panel including a light emitting element having improved electrical reliability.

According to an embodiment, a display panel may include a base layer including a first display region, a second display region, and a non-display region adjacent to the first display region and the second display region, a demultiplexer circuit overlapping the second display region, a first pixel including a first pixel driver overlapping the first display region, and a first light emitting element overlapping the first display region and electrically connected with the first pixel driver, and a second pixel including a second pixel driver overlapping the first display region, and a second light emitting element and a third light emitting element that are electrically connected with the second pixel driver. At least one of the second light emitting element and the third light emitting element may overlap the second display region and may be disposed on the demultiplexer circuit.

The second light emitting element may overlap the first display region and may be electrically connected with the second pixel driver in the first display region in plan view, and the third light emitting element may overlap the second display region and may be electrically connected with the second pixel driver in the second display region in plan view.

The display panel may further include a first signal selection line and a second signal selection line that provide a first signal selection and a second selection signal to the demultiplexer circuit, respectively. The demultiplexer circuit may include a first switching transistor electrically connected with the first signal selection line, and a second switching transistor electrically connected with the second signal selection line.

At least one of the second light emitting element and the third light emitting element may overlap at least one of the first switching transistor and the second switching transistor and the first signal selection line and the second signal selection line.

The first pixel may include a plurality of first pixels, and the second pixel may include a plurality of second pixels. The display panel may further include a first data line electrically connected to a part of the plurality of first pixels and a part of the plurality of second pixels, a second data line electrically connected to another part of the plurality of first pixels and another part of the plurality of second pixels, and a signal supply line that provides a data signal to the first and second data lines. The first switching transistor may be electrically connected to the first data line and the signal supply line, and the second switching transistor may be electrically connected to the second data line and the signal supply line.

The first switching transistor may include a first electrode electrically connected with the first data line, a second electrode electrically connected with the signal supply line, and a first gate electrode electrically connected with the first signal selection line, and the second switching transistor may include a first electrode electrically connected with the second data line, a second electrode electrically connected with the signal supply line, and a second gate electrode electrically connected with the second signal selection line.

The display panel may further include a first connecting wire that electrically connects the second pixel driver and the third light emitting element, and a shielding electrode, wherein the first and second signal selection lines and the first and second switching transistors are disposed below the shielding electrode, and the third light emitting element and the first connecting wire are disposed on the shielding electrode.

The display panel may further include a connecting electrode disposed between the second pixel driver and the first connecting wire, the first connecting wire being electrically connected to the connecting electrode. The second pixel driver may include a semiconductor pattern to which the connecting electrode is electrically connected, and a gate electrode disposed on the semiconductor pattern. The shielding electrode and the connecting electrode may be disposed on a same layer.

The first and second signal selection lines and the gate electrode may be disposed on a same layer.

The second pixel driver may further include a lower conductive layer disposed under the semiconductor pattern, and the first and second signal selection lines and one of the gate electrode and the lower conductive layer may be disposed on a same layer.

The display panel may further include a first connecting wire that electrically connects the second pixel driver and the third light emitting element.

The second light emitting element may overlap the first display region, the third light emitting element may overlap the second display region. The first connecting wire may include a first connection that is electrically connected with the second pixel driver and overlapping the first display region, and a second connection that is electrically connected with the third light emitting element and overlapping the second display region.

The display panel may further include a second connecting wire that electrically connects the second pixel driver and the second light emitting element and that is spaced apart from the first connecting wire. The second connecting wire may include a third connection electrically connected with the second pixel driver, and a fourth connection electrically connected with the second light emitting element and spaced apart from the third connection in plan view.

The first connecting wire may include a first layer, a second layer disposed on the first layer, and a third layer disposed on the second layer and including a same material as the first layer. An edge of the second layer may be disposed inward of the first connecting wire, compared to edges of the first and third layers.

The third light emitting element may include a first electrode, a second electrode disposed on the first electrode, and an intermediate layer disposed between the first electrode and the second electrode. The second electrode of the third light emitting element may be brought into contact with a side surface of the second layer of the first connecting wire.

The first and second connecting wires may be disposed on a same layer.

The first and second connecting wires may be disposed on different layers.

The display panel may further include an additional connecting wire that is electrically connected with the first connecting wire and that makes contact with a second electrode of the third light emitting element. The first and second connecting wires may be disposed on different layers, and the first connecting wire may be disposed on the second connecting wire. The additional connecting wire and the second connecting wire may be disposed on a same layer.

The first connecting wire may include at least one of a metallic material and transparent conductive oxide.

The second pixel may further include a fourth light emitting element overlapping the second display region and electrically connected with the second pixel driver and spaced apart from the second light emitting element with the third light emitting element between the fourth light emitting element and the second light emitting element.

The display panel may further include a first connecting wire that electrically connects the second pixel driver and the third light emitting element, and a third connecting wire that electrically connects the second pixel driver and the fourth light emitting element.

The display panel may further include a third pixel disposed between the first and second pixels. The first display region may include an inner display region, and an outer display region. The first pixel may overlap the inner display region. The third pixel may include a third pixel driver overlapping the outer display region, and a fifth light emitting element and a sixth light emitting element overlapping the outer display region and electrically connected with the third pixel driver.

The second pixel driver may overlap the outer display region, and the second light emitting element and the third light emitting element may overlap the second display region.

The first light emitting element, the second light emitting element, and the third light emitting element may be sequentially arranged in a direction from the first display region toward the second display region.

The third light emitting element may be disposed on the demultiplexer circuit in the second display region, and a region where light is emitted from the third light emitting element may overlap the demultiplexer circuit.

Each of the first and second pixel drivers may include a driving transistor, and the driving transistor of the first pixel driver and the driving transistor of the second pixel driver may differ from each other in terms of at least one of shape and area.

Each of the first and second pixel drivers may include a capacitor, and capacitance of the capacitor of the first pixel driver may differ from capacitance of the capacitor of the second pixel driver.

The first display region may have a circular or polygonal shape.

According to an embodiment, a display panel may include a base layer including a first display region, a second display region adjacent to the first display region, and a non-display region adjacent to the first display region and the second display region, a first pixel group and a second pixel group that are disposed on the base layer, a first data line and a second data line that are electrically connected to the first pixel group and the second pixel group, respectively, a demultiplexer circuit overlapping the second display region and that provides a data signal to the first data line and the second data line, and a signal supply line overlapping the non-display region and that provides the data signal to the demultiplexer circuit. The first pixel group may include a first pixel including a first pixel driver overlapping the first display region, and a first light emitting element overlapping the first display region and electrically connected with the first pixel driver, and a second pixel including a second pixel driver overlapping the first display region, and a second light emitting element and a third light emitting element that are electrically connected with the second pixel driver. At least one of the second light emitting element and the third light emitting element may overlap the second display region and may overlap the demultiplexer circuit.

According to an embodiment, a display panel may include a base layer including a first display region, a second display region adjacent to the first display region, and a non-display region adjacent to the first display region and the second display region, a demultiplexer circuit overlapping the second display region, a first pixel including a first pixel driver overlapping the first display region, and a first light emitting element overlapping the first display region and electrically connected with the first pixel driver, and a second pixel including a second pixel driver overlapping the first display region, and a second light emitting element overlapping the first and second display regions and electrically connected with the second pixel driver. The second light emitting element may overlap the demultiplexer circuit.

A region where light is emitted from the second light emitting element may have a larger area than a region where light is emitted from the first light emitting element.

BRIEF DESCRIPTION OF THE DRAWINGS

The above and other aspects and features of the disclosure will become apparent by describing in detail embodiments thereof with reference to the accompanying drawings, of which.

DETAILED DESCRIPTION OF THE EMBODIMENTS

Figure 1:
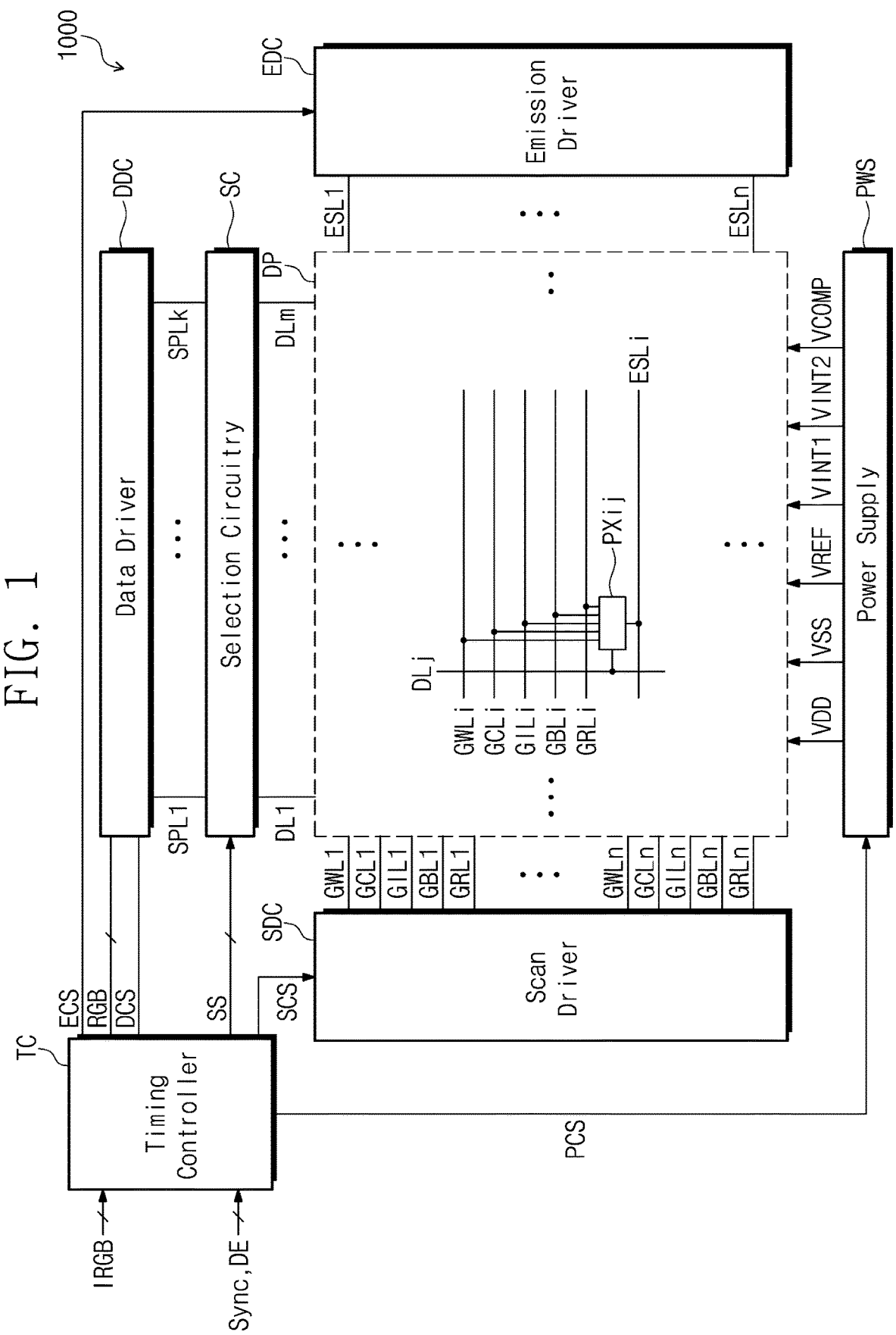
FIG. 1 is a schematic block diagram of a display device according to an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity Like numbers refer to like elements throughout.

In this specification, when it is mentioned that a component (or an area, a layer, a part, etc.) is referred to as being "on", "connected to" or "coupled to" another component, this means that the component may be directly on, connected to, or coupled to the other component or a third component may be present therebetween.

It will be understood that the terms "connected to" or "coupled to" may include a physical and/or electrical connection or coupling.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

Terms such as "first," "second," and the like may be used to describe various components, but the components should not be limited by the terms. The terms may be used only for distinguishing one component from other components. For example, without departing the scope of the disclosure, a first component may be referred to as a second component, and similarly, the second component may also be referred to as the first component. Terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

Unless otherwise defined or implied herein, all terms used herein, including technical or scientific terms, have the same meanings as those generally understood by those skilled in the art to which the disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the application.

FIG. 1 is a schematic block diagram of a display device 1000 according to an embodiment of the disclosure.

Referring to FIG. 1, the display device 1000 may include a timing controller TC, a panel driver, and a display panel DP. In this embodiment, the display panel DP is described as an emissive display panel. The emissive display panel may include an organic light emitting display panel or a quantum-dot light emitting display panel. The panel driver may include a scan driver SDC, an emission driver EDC, and a data driver DDC.

The display panel DP may include scan lines GWL1 to GWLn, GCL1 to GCLn, GIL1 to GILn, GBL1 to GBLn, and GRL1 to GRLn, emission lines ESL1 to ESLn, and data lines DL1 to DLm. The display panel DP may include multiple pixels connected to the scan lines GWL1 to GWLn, GCL1 to GCLn, GIL1 to GILn, GBL1 to GBLn, and GRL1 to GRLn, the emission lines ESL1 to ESLn, and the data lines DL1 to DLm (m and n being integers of 1 or more).

For example, a pixel PXij (i and j being integers of 1 or more) located on an i-th horizontal line (or an i-th pixel row) and a j-th vertical line (or a j-th pixel column) may be connected to the i-th first scan line GWLi, the i-th second scan line GCLi, the i-th third scan line GILi, the i-th fourth scan line GBLi, the i-th fifth scan line GRLi, the j-th data line DLj, and the i-th emission line ESLi.

The pixel PXij may include multiple transistors and multiple capacitors. The pixel PXij may receive a first power supply voltage (or a first driving voltage VDD), a second power supply voltage (or a second driving voltage VSS), a third power supply voltage (or a reference voltage VREF), a fourth power supply voltage (or a first initialization voltage VINT1), a fifth power supply voltage (or a second initialization voltage VINT2), and a sixth power supply voltage (or a compensation voltage VCOMP) through the power supply PWS.

The voltage values of the first power supply voltage VDD and the second power supply voltage VSS may be set such that an electric current is able to flow in a light emitting element. For example, the first power supply voltage VDD may be set to a voltage higher than the second power voltage VSS.

The third power supply voltage VREF may be a voltage for initializing a gate of a driving transistor included in the pixel PXij. The third power supply voltage VREF may be used to implement a predetermined or selected grayscale by using a voltage difference with a data signal. To this end, the third power supply voltage VREF may be set to a predetermined or selected voltage within a voltage range of the data signal.

The fourth power supply voltage VINT1 may be a voltage for initializing a storage capacitor included in the pixel PXij. The fourth power voltage VINT1 may be set to a voltage lower than the third power voltage VREF. For example, the fourth power supply voltage VINT1 may be set to a voltage lower than a difference between the third power supply voltage VREF and a threshold voltage Vth of the driving transistor. For example, the fourth power supply voltage VINT1 may be set to 4V or more and 12V or less. In a case in which the fourth power supply voltage VINT1 is set to a potential of 4V or more, overcoming characteristics of an N-type transistor may be more readily achievable. However, the disclosure is not limited thereto.

The fifth power supply voltage VINT2 may be set to a DC voltage. The fifth power supply voltage VINT2 may be a voltage for initializing a cathode of the light emitting element included in the pixel PXij.

The sixth power supply voltage VCOMP may supply a predetermined or selected current to the driving transistor in case that the threshold voltage of the driving transistor is compensated for.

Each of the fifth and sixth power supply voltages VINT2 and VCOMP may be set to a voltage lower than the first power supply voltage VDD or the fourth power supply voltage VINT1, or may be set to a voltage similar or equal to the third power supply voltage VREF. However, the disclosure is not limited thereto, and each of the fifth and sixth power supply voltages VINT2 and VCOMP may be set to a voltage similar or equal to the first power supply voltage VDD.

Although it is illustrated in FIG. 1 that all of the first to sixth power supply voltages VDD, VSS, VREF, VINT1, VINT2, and VCOMP are supplied by the power supply PWS, the disclosure is not limited thereto. For example, both the first power supply voltage VDD and the second power supply voltage VSS may be supplied irrespective of the structure of the pixel PXij, and at least one voltage among the third power supply voltage VREF, the fourth power supply voltage VINT1, the fifth power supply voltage VINT2, and the sixth power supply voltage VCOMP may not be supplied depending on the structure of the pixel PXij.

In an embodiment of the disclosure, signal lines connected to the pixel PXij may be diversely set depending on a circuit structure of the pixel PXij.

The scan driver SDC may receive a first control signal SCS from the timing controller TC and may supply scan signals to the first scan lines GWL1 to GWLn, the second scan lines GCL1 to GCLn, the third scan lines GIL1 to GILn, the fourth scan lines GBL1 to GBLn, and the fifth scan lines GRL1 to GRLn, based on the first control signal SCS.

The scan signals may be set to gate-on voltages such that the transistors receiving the scan signals are turned on.

For example, a scan signal supplied to a P-channel metal oxide semiconductor (PMOS) transistor may be set to a logic low level, and a scan signal supplied to an N-channel metal oxide semiconductor (NMOS) transistor may be set to a logic high level. Hereinafter, when a scan signal is supplied, it may mean that the scan signal is supplied at a logic level that turns on a transistor controlled by the scan signal.

In FIG. 1, for convenience of description, the scan driver SDC is illustrated as a single component. However, the disclosure is not limited thereto. In some embodiments, multiple scan drivers may be included to supply the scan signals to the first scan lines GWL1 to GWLn, the second scan lines GCL1 to GCLn, the third scan lines GIL1 to GILn, the fourth scan lines GBL1 to GBLn, and the fifth scan lines GRL1 to GRLn, respectively.

The emission driver EDC may supply emission signals to the emission lines ESL1 to ESLn, based on a second control signal ECS. For example, the emission signals may be sequentially supplied to the emission lines ESL1 to ESLn.

The transistors connected to the emission lines ESL1 to ESLn of the disclosure may be implemented with NMOS transistors. The emission signals supplied to the emission lines ESL1 to ESLn may be set to gate-off voltages (e.g., a logic high level). The transistors receiving the emission signals may be turned off in case that the emission signals are supplied, and may be turned on in other cases.

The second control signal ECS may include an emission start signal and clock signals, and the emission driver EDC may be implemented with a shift register that sequentially generates and outputs emission signals in a pulse form by sequentially shifting the pulsed emission start signal using the clock signals.

The data driver DDC may receive a third control signal DCS and image data RGB from the timing controller TC. The data driver DDC may convert the digital image data RGB into analog data signals (e.g., data signals). The data driver DDC may supply the data signals to the data lines DL1 to DLm in response to the third control signal DCS.

The third control signal DCS may include a data enable signal, a horizontal start signal, and a data clock signal that instruct output of effective data signals. For example, the data driver DDC may include a shift register that generates a sampling signal by shifting the horizontal start signal in synchronization with the data clock signal, a latch that latches the image data RGB in response to the sampling signal, a digital-analog converter (or a decoder) that converts the latched image data (e.g., digital data) into analog data signals, and buffers (or amplifiers) that output the data signals to the data lines DL1 to DLm.

The power supply PWS may supply, to the display panel DP, the first power supply voltage VDD, the second power supply voltage VSS, and the third power supply voltage VREF for driving the pixel PXij. Furthermore, the power supply PWS may supply, to the display panel DP, at least one voltage among the fourth power supply voltage VINT1, the fifth power supply voltage VINT2, and the sixth power supply voltage VCOMP.

For example, the power supply PWS may supply, to the display panel DP, the first power supply voltage VDD, the second power supply voltage VSS, the third power supply voltage VREF, the fourth power supply voltage VINT1, the fifth power supply voltage VINT2, and the sixth power supply voltage VCOMP through a first power line (or a first driving voltage line) VDL (refer to FIG. 2A), a second power line (or a second driving voltage line) VSL (refer to FIG. 2A), a third power line (or a reference voltage line) VRL (refer to FIG. 2A), a fourth power line (or a first initialization voltage line) VIL1 (refer to FIG. 2A), a fifth power line (or a second initialization voltage line) VIL2 (refer to FIG. 2A), and a sixth power line (or a compensation voltage line) VCL (refer to FIG. 2A) that are not illustrated.

The power supply PWS may be implemented with a power management IC (PMIC), but is not limited thereto.

The timing controller TC may generate the first control signal SCS, the second control signal ECS, the third control signal DCS, a fourth control signal PCS, and selection signals SS, based on input image data IRGB, a synchronization signal Sync (e.g., a vertical synchronization signal, a horizontal synchronization signal, and the like), a data enable signal DE, and a clock signal. The first control signal SCS may be supplied to the scan driver SDC, the second control signal ECS may be supplied to the emission driver EDC, the third control signal DCS may be supplied to the data driver DDC, and the fourth control signal PCS may be supplied to the power supply PWS. The selection signals SS may be supplied to selection circuitry SC. The timing controller TC may generate the image data RGB (or frame data) by rearranging the input image data IRGB depending on the arrangement of the pixel PXij in the display panel DP.

The selection circuitry SC may be connected between the data driver DDC and the data lines DL1 to DLm, and signal supply lines SPL1 to SPLk receiving the data signals from the data driver DDC may be selectively connected with the data lines DL1 to DLm in response to the selection signals SS. Accordingly, the selection circuitry SC may selectively connect the data lines DL1 to DLm and pixels PX11 to PXnm.

At least one of the scan driver SDC, the emission driver EDC, the data driver DDC, the power supply PWS, and the timing controller TC may be formed on the display panel DP, or may be implemented with an integrated circuit and may be connected to the display panel DP. Furthermore, at least two of the scan driver SDC, the emission driver EDC, the data driver DDC, the power supply PWS, and the timing controller TC may be implemented with an integrated circuit. For example, the data driver DDC and the timing controller TC may be implemented with an integrated circuit.

Although the display device 1000 according to an embodiment has been described above with reference to FIG. 1, the display device of the disclosure is not limited thereto. Signal lines may be added or omitted depending on the configuration of the pixels. Furthermore, a connection relationship between a pixel and the signal lines may be changed. In a case in which one of the signal lines is omitted, another signal line may replace the omitted signal line.

Figure 2A:
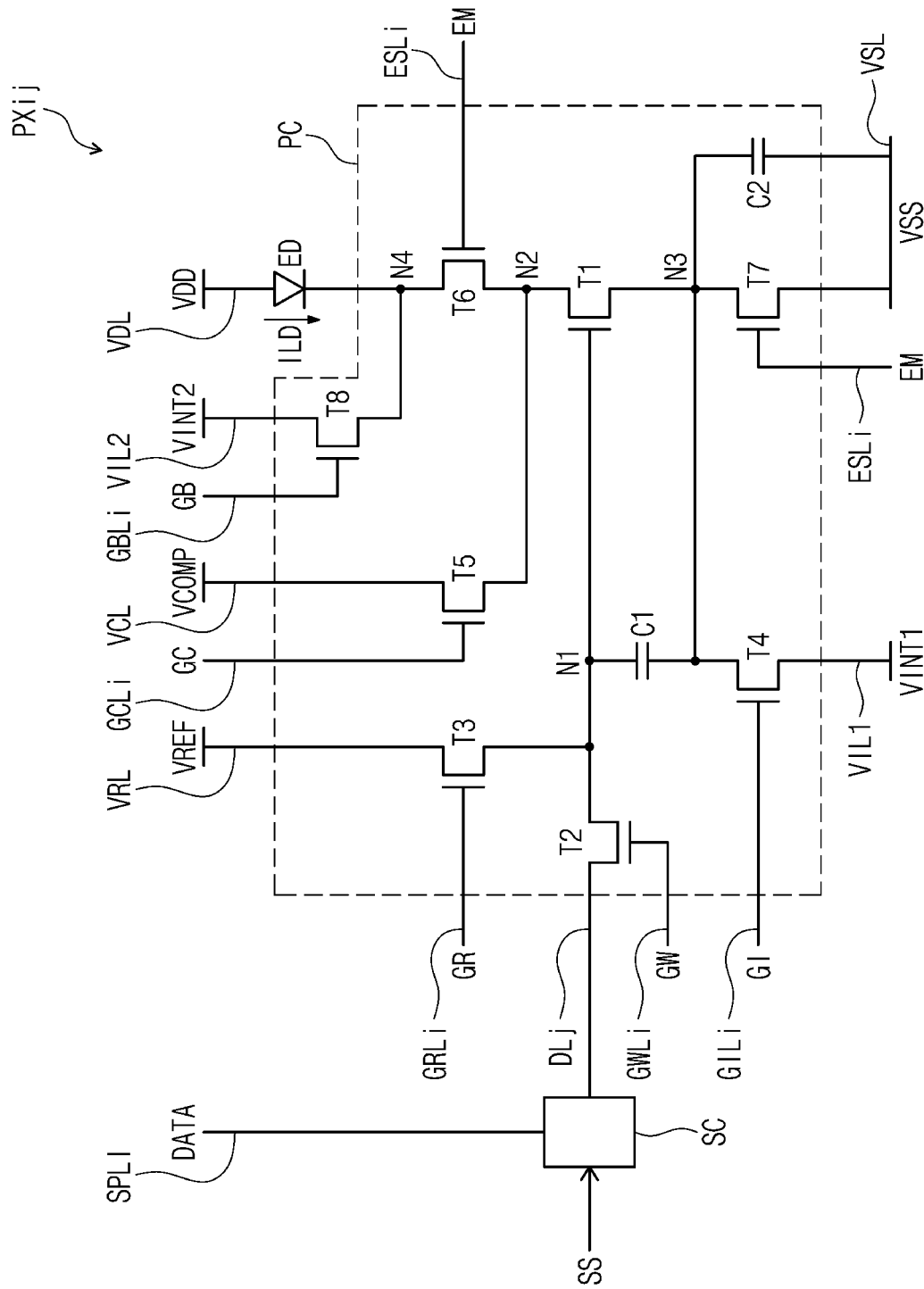
FIGS. 2A and 2B are schematic diagrams of equivalent circuits of pixels according to embodiments.
Figure 2B:
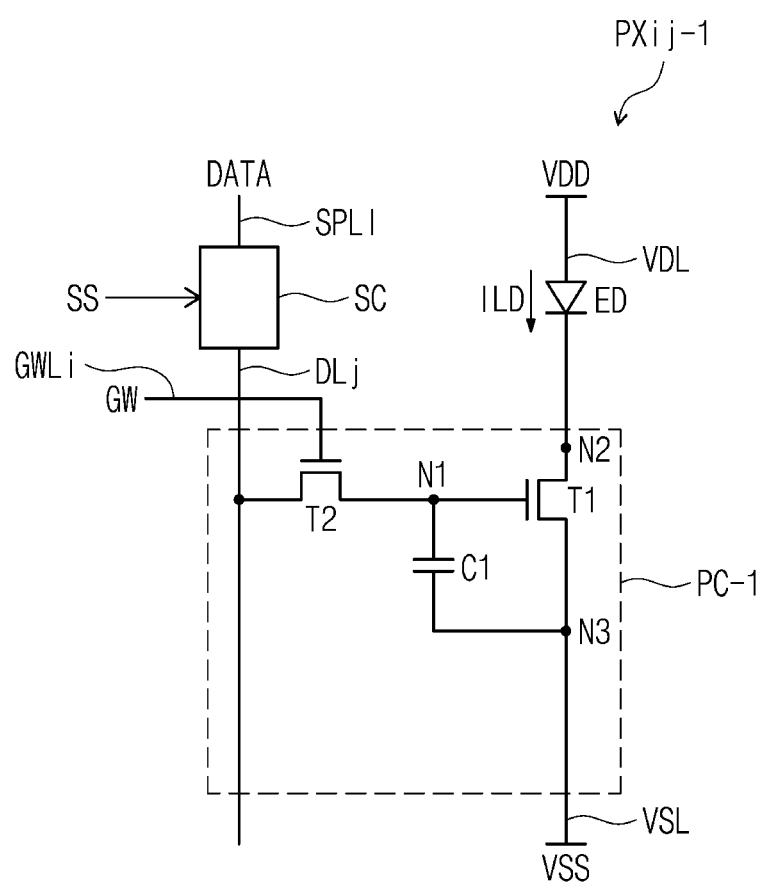

FIGS. 2A and 2B are schematic diagrams of equivalent circuits of pixels according to embodiments. Equivalent circuit diagrams of pixels PXij and PXij-1 connected to the i-th first scan line GWLi (hereinafter, referred to as the first scan line) and the j-th data line DLj are illustrated in FIGS. 2A and 2B. Furthermore, FIGS. 2A and 2B illustrate that the 1-th signal supply line SPL1 is connected to the j-th data line DLj in response to a selection signal SS, and a data signal DATA transmitted to the 1-th signal supply line SPL1 may be supplied to the j-th data line DLj (hereinafter, referred to as the data line).

As illustrated in FIG. 2A, the pixel PXij may include a light emitting element ED and a pixel driver PC. The light emitting element ED may be connected to the first driving voltage line VDL and the pixel driver PC.

The pixel driver PC may be connected to the scan lines GWLi, GCLi, GILi, GBLi, and GRLi, the data line DLj, the emission line ESLi, and the power lines VDL, VSL, VIL1, VIL2, VRL, and VCL. The pixel driver PC may include first to eighth transistors T1, T2, T3, T4, T5, T6, T7, and T8, a first capacitor C1, and a second capacitor C2. Hereinafter, it will be discussed as an example that all of the first to eighth transistors T1, T2, T3, T4, T5, T6, T7, and T8 are N-type transistors. However, the disclosure is not limited thereto. Some of the first to eighth transistors T1, T2, T3, T4, T5, T6, T7, and T8 may be N-type transistors, and the other transistors may be P-type transistors. Each of the first to eighth transistors T1, T2, T3, T4, T5, T6, T7, and T8 may be a P-type transistor. The disclosure is not limited to any one embodiment.

A gate of the first transistor T1 may be connected to a first node N1. A first electrode of the first transistor T1 may be connected to a second node N2, and a second electrode of the first transistor T1 may be connected to a third node N3. The first transistor T1 may be a driving transistor. In response to a voltage of the first node N1, the first transistor T1 may control a driving current ILD flowing from the first driving voltage line VDL to the second driving voltage line VSL via the light emitting element ED. At this time, the first power supply voltage VDD may be set to a voltage having a higher potential than the second power supply voltage VSS.

The expression "the transistor is electrically connected to the signal line or the transistor is electrically connected to the transistor" used herein means that a source, a drain, or a gate of the transistor may be integral with the signal line (or a source, drain or gate of transistor) or connected to the signal line (or transistor) through a connecting electrode.

The second transistor T2 may include a gate connected to the first scan line GWLi, a first electrode connected to the data line DLj, and a second electrode connected to the first node N1. The second transistor T2 may supply the data signal DATA to the first node N1 in response to the write scan signal GW transmitted through the first scan line GWLi. The second transistor T2 may be a switching transistor. The second transistor T2 may be turned on to electrically connect the data line DLj and the first node N1 in case that the write scan signal GW is supplied to the first scan line GWLi.

The third transistor T3 may be connected between the first node N1 and the reference voltage line VRL. A first electrode of the third transistor T3 may receive the reference voltage VREF through the reference voltage line VRL, and a second electrode of the third transistor T3 may be connected to the first node N1. In this embodiment, a gate of the third transistor T3 may receive a reset scan signal GR through the i-th fifth scan line GRLi (hereinafter, referred to as the fifth scan line). The third transistor T3 may be turned on to provide the reference voltage VREF to the first node N1 in case that the reset scan signal GR is supplied to the fifth scan line GRLi.

The fourth transistor T4 may be connected between the third node N3 and the first initialization voltage line VIII. A first electrode of the fourth transistor T4 may be connected to the third node N3, and a second electrode of the fourth transistor T4 may be connected to the first initialization voltage line VIL1 that provides the first initialization voltage VINT1. A gate of the fourth transistor T4 may receive an initialization scan signal GI through the i-th third scan line GILi (hereinafter, referred to as the third scan line). The fourth transistor T4 may be turned on to supply the first initialization voltage VINT1 to the third node N3 in case that the initialization scan signal GI is supplied to the third scan line GILi.

The fifth transistor T5 may be connected between the compensation voltage line VCL and the second node N2. A first electrode of the fifth transistor T5 may receive the compensation voltage VCOMP through the compensation voltage line VCL, and a second electrode of the fifth transistor T5 may be connected to the second node N2 and may be electrically connected with the first electrode of the first transistor T1. A gate of the fifth transistor T5 may receive a compensation scan signal GC through the i-th second scan line GCLi (hereinafter, referred to as the second scan line). The fifth transistor T5 may be turned on to provide the compensation voltage VCOMP to the second node N2 in case that the compensation scan signal GC is supplied to the second scan line GCLi, and a threshold voltage Vth of the first transistor T1 may be compensated for during a compensation period.

The sixth transistor T6 may be connected between the first transistor T1 and the light emitting element ED. Specifically, a gate of the sixth transistor T6 may receive an emission signal EM through the i-th emission line ESLi (hereinafter, referred to as the emission line). A first electrode of the sixth transistor T6 may be connected to a cathode of the light emitting element ED through a fourth node N4, and a second electrode of the sixth transistor T6 may be connected with the first electrode of the first transistor T1 through the second node N2. The sixth transistor T6 may be referred to as a first emission control transistor. The sixth transistor T6 may be turned on to electrically connect the light emitting element ED and the first transistor T1 in case that the emission signal EM is supplied to the emission line ESLi.

The seventh transistor T7 may be connected between the second driving voltage line VSL and the third node N3. A first electrode of the seventh transistor T7 may be connected with the second electrode of the first transistor T1 through the third node N3, and a second electrode of the seventh transistor T7 may receive the second power supply voltage VSS through the second driving voltage line VSL. A gate of the seventh transistor T7 may be electrically connected to the emission line ESLi. The seventh transistor T7 may be referred to as a second emission control transistor. The seventh transistor T7 may be turned on to electrically connect the second electrode of the first transistor T1 and the second driving voltage line VSL in case that the emission signal EM is supplied to the emission line ESLi.

In this embodiment, the sixth transistor T6 and the seventh transistor T7 are illustrated as being connected to the same emission line ESLi and turned on through the same emission signal EM. However, this is illustrative, and the sixth transistor T6 and the seventh transistor T7 may be independently turned on by different signals distinguished from each other. Furthermore, in the pixel driver PC according to an embodiment of the disclosure, one of the sixth transistor T6 and the seventh transistor T7 may be omitted.

The eighth transistor T8 may be connected between the second initialization voltage line VIL2 and the fourth node N4. For example, the eighth transistor T8 may include a gate connected to the i-th fourth scan line GBLi (hereinafter, referred to as the fourth scan line), a first electrode connected to the second initialization line VIL2, and a second electrode connected to the fourth node N4. The eighth transistor T8 may be referred to as a second initialization transistor. The eighth transistor T8 may supply the second initialization voltage VINT2 to the fourth node N4 corresponding to the cathode of the light emitting element ED in response to a black scan signal GB transmitted through the fourth scan line GBLi. The cathode of the light emitting element ED may be initialized by the second initialization voltage VINT2.

In this embodiment, some of the second to eighth transistors T2, T3, T4, T5, T6, T7, and T8 may be simultaneously turned on through the same scan signal. For example, the eighth transistor T8 and the fifth transistor T5 may be simultaneously turned on through the same scan signal. For example, the eighth transistor T8 and the fifth transistor T5 may be operated by the same compensation scan signal GC. As the eighth transistor T8 and the fifth transistor T5 are turned on/off by the same compensation scan signal GC, the eighth transistor T8 and the fifth transistor T5 may be simultaneously turned on/off. The second scan line GCLi and the fourth scan line GBLi may be substantially provided as a single scan line. Accordingly, initialization of the cathode of the light emitting element ED and compensation for the threshold voltage of the first transistor T1 may be performed at the same timing. However, this is illustrative, and the disclosure is not limited to any one embodiment.

Furthermore, according to the disclosure, the initialization of the cathode of the light emitting element ED and the compensation for the threshold voltage of the first transistor T1 may be performed by application of the same power supply voltage. For example, the compensation voltage line VCL and the second initialization voltage line VIL2 may be substantially provided as a single voltage line. The cathode initialization operation and the compensation operation of the driving transistor may be performed with one power supply voltage, and thus the driver design may be simplified. However, this is illustrative, and the disclosure is not limited to any one embodiment.

The first capacitor C1 may be disposed between the first node N1 and the third node N3. The first capacitor C1 may store charges corresponding to a voltage difference between the first node N1 and the third node N3. The first capacitor C1 may be referred to as a storage capacitor.

The second capacitor C2 may be disposed between the third node N3 and the second driving voltage line VSL. For example, one electrode of the second capacitor C2 may be connected to the second driving voltage line VSL that receives the second power supply voltage VSS, and an opposite electrode of the second capacitor C2 may be connected to the third node N3. The second capacitor C2 may store charges corresponding to a voltage difference between the second power supply voltage VSS and the third node N3. The second capacitor C2 may be referred to as a hold capacitor. The second capacitor C2 may have a higher storage capacity than the first capacitor C1. Accordingly, the second capacitor C2 may minimize a voltage change at the third node N3 in response to a voltage change at the first node N1.

In this embodiment, the light emitting element ED may be connected with the pixel driver PC through the fourth node N4. The light emitting element ED may include an anode connected to the first driving voltage line VDL and the cathode opposite to the anode. In this embodiment, the light emitting element ED may be connected with the pixel driver PC through the cathode. For example, in the pixel PXij according to the disclosure, a connection node at which the light emitting element ED and the pixel driver PC are connected may be the fourth node N4, and the fourth node N4 may correspond to a connection node between the first electrode of the sixth transistor T6 and the cathode of the light emitting element ED.

Accordingly, the potential of the fourth node N4 may substantially correspond to the potential of the cathode of the light emitting element ED. For example, the anode of the light emitting element ED may be connected to the first driving voltage line VDL and may receive the first power supply voltage VDD that is a constant voltage, and the cathode potential may be controlled by being electrically connected to the first transistor T1 through the sixth transistor T6. For example, the potential of the second node N2 corresponding to the source of the first transistor T1 may not be directly affected by characteristics of the light emitting element ED. Accordingly, even though the characteristics of the light emitting element ED are deteriorated due to the lifespan of the light emitting element ED, an influence on the gate-source voltages Vgs of the transistors constituting the pixel driver PC, particularly, the gate-source voltage Vgs of the driving transistor may be reduced. For example, the range of change in the amount of current due to degradation of the light emitting element ED may be decreased. Thus, an afterimage defect of the display panel DP (refer to FIG. 1) depending on an increase in usage time may be decreased, and the lifespan may be improved.

In another embodiment, as illustrated in FIG. 2B, the pixel PXij-1 may include a pixel driver PC-1 that includes two transistors T1 and T2 and one capacitor C1. The pixel driver PC-1 may be connected to the light emitting element ED, the first scan line GWLi, the data line DLj, and the second driving voltage line VSL. The pixel driver PC-1 illustrated in FIG. 2B may correspond to the pixel driver PC illustrated in FIG. 2A from which the third to eighth transistors T3 to T8 and the one capacitor C2 are omitted.

Each of the first and second transistors T1 and T2 may be an N-type transistor or a P-type transistor. In this embodiment, it will be discussed as an example that each of the first and second transistors T1 and T2 is an N-type transistor.

The first transistor T1 may include a gate connected to a first node N1, a first electrode connected to a second node N2, and a second electrode connected to a third node N3. The second node N2 may be a node connected to the first driving voltage line VDL, and the third node N3 may be a node connected to the second driving voltage line VSL. The first transistor T1 may be connected to the light emitting element ED through the second node N2 and connected to the second driving voltage line VSL through the third node N3. The first transistor T1 may be a driving transistor.

The second transistor T2 may include a gate that receives a scan signal GW through the first scan line GWLi, a first electrode connected to the data line DLj, and a second electrode connected to the first node N1. The second transistor T2 may supply a data signal DATA to the first node N1 in response to the write scan signal GW transmitted through the first scan line GWLi.

The capacitor C1 may include an electrode connected to the first node N1 and an electrode connected to the third node N3. The capacitor C1 may store the data signal DATA transmitted to the first node N1.

The light emitting element ED may include an anode and a cathode. In this embodiment, the anode of the light emitting element ED may be connected with the first driving voltage line VDL, and the cathode of the light emitting element ED may be connected with the pixel driver PC-1 through the second node N2. In this embodiment, the cathode of the light emitting element ED may be connected with the first transistor T1. The light emitting element ED may emit light in response to the amount of current flowing through the first transistor T1 of the pixel driver PC-1.

The second node N2 to which the cathode of the light emitting element ED and the pixel driver PC-1 are connected may correspond to the drain of the first transistor T1. The light emitting element ED may be connected with the pixel driver PC-1 through the second node N2. For example, in the pixel PXij-1 illustrated in FIG. 2B, a connection node at which the light emitting element ED and the pixel driver PC-1 are connected may be the second node N2, and the second node N2 may correspond to a connection node between the first electrode of the first transistor T1 and the cathode of the light emitting element ED.

For example, in a case in which the driving transistor is an N-type transistor, the display panel DP of the disclosure (refer to FIG. 1) may prevent a change in the gate-source voltage of the first transistor T1 by the light emitting element ED. Accordingly, the range of change in the amount of current due to degradation of the light emitting element ED may be decreased. Thus, an afterimage defect of the display panel depending on an increase in usage time may be decreased, and the lifespan may be improved.

FIGS. 2A and 2B illustrate circuits for the pixel drivers PC and PC-1 according to embodiments of the disclosure. As long as a circuit is connected with the cathode of the light emitting element ED, the number or arrangement relationship of transistors and the number or arrangement relationship of capacitors may be diversely designed, and the display panel according to an embodiment of the disclosure is not limited to any one embodiment.

Figure 3:
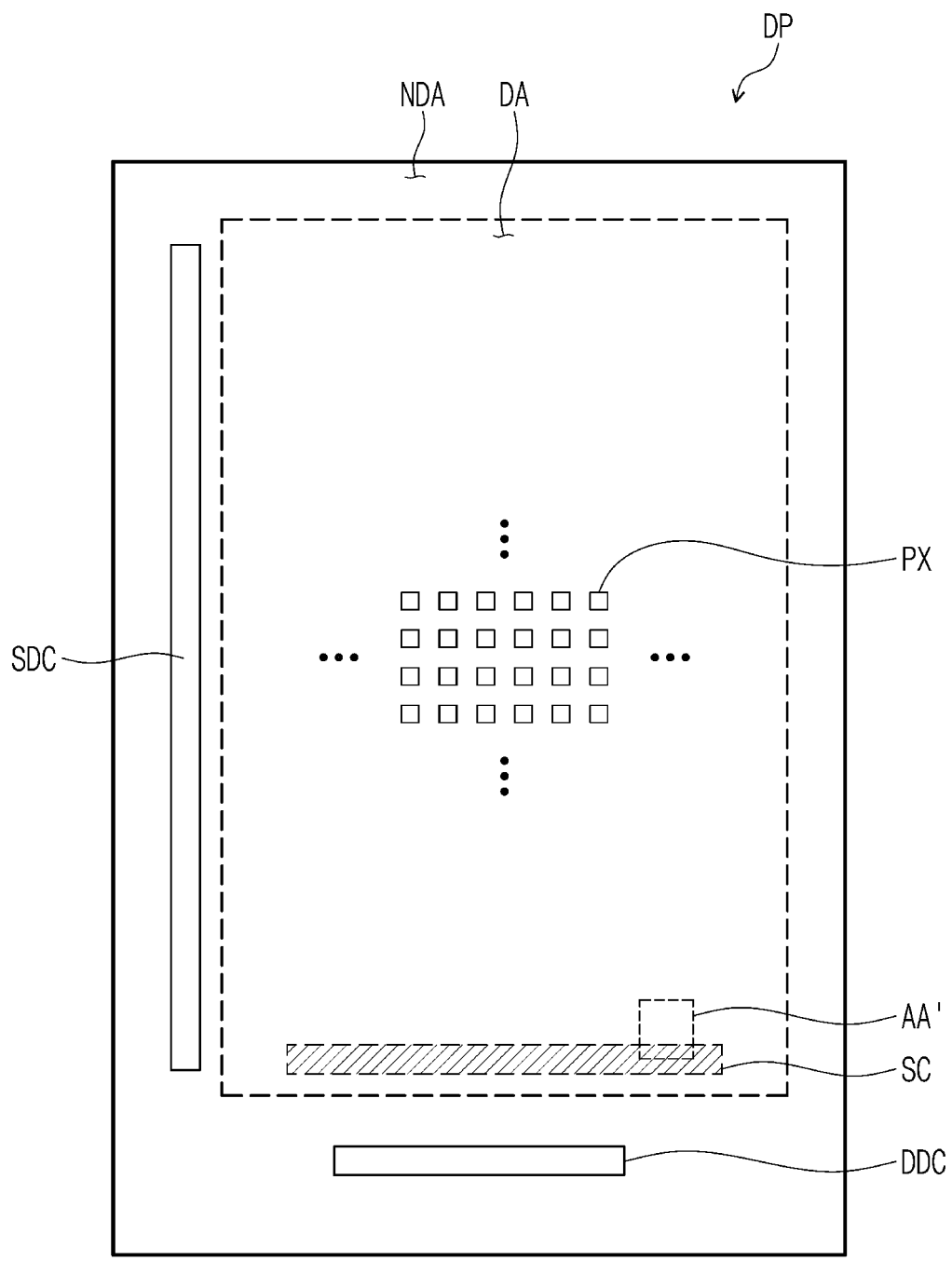
FIG. 3 is a schematic plan view of a display panel according to an embodiment of the disclosure.

FIG. 3 is a schematic plan view illustrating the display panel according to an embodiment of the disclosure. Some components are omitted in FIG. 3. Hereinafter, a direction substantially perpendicular to a plane defined by a first direction DR1 and a second direction DR2 is defined as a third direction DR3 Furthermore, the expression "in plan view" used herein may mean that it is viewed in third direction DR3.

A thickness direction of the display panel DP may be a direction parallel to the third direction DR3 that is a normal direction for the plane defined by the first direction DR1 and the second direction DR2. In this specification, front surfaces (or upper surfaces) and rear surfaces (or lower surfaces) of members constituting the display device 1000 (refer to FIG. 1) may be defined based on the third direction DR3. In this specification, "thickness" may represent a numerical value measured in the third direction DR3, and "width" may represent a numerical value measured in the first direction DR1 or the second direction DR2 that is a horizontal direction.

Referring to FIG. 3, the display panel DP of one embodiment may be divided into a display region DA and a non-display region NDA. The display region DA may be a region in which the pixels PX are disposed. The non-display region NDA may be adjacent to the display region DA. In this embodiment, the non-display region NDA is illustrated in a shape surrounding the periphery of the display region DA. However, this is illustrative, and the non-display region NDA may be disposed on a side of the display region DA or may be omitted and is not limited to any one embodiment.

In this embodiment, the scan driver SDC, the data driver DDC, and the selection circuitry SC may be mounted on the display panel DP. In an embodiment, the selection circuitry SC may be disposed on the display region DA, and the scan driver SDC and the data driver DDC may be disposed on the non-display region NDA. The selection circuitry SC may overlap at least some of the pixels PX in plan view. According to the disclosure, as the selection circuitry SC is disposed on the display region DA, the area of the non-display region NDA may be decreased, as compared with a case where the selection circuitry SC is disposed on the non-display region NDA. Accordingly, the area of the display region DA may be increased, and the display device 1000 (refer to FIG. 1) having a narrow bezel may be readily implemented.

The scan driver SDC may include two circuits divided from each other. The two scan drivers SDC may be spaced apart from each other with the center of the display region DA therebetween in the left/right direction. In another embodiment, two or more scan drivers SDC may be provided. However, the disclosure is not limited to any one embodiment.

The scan driver SDC and/or the data driver DDC may also be disposed on the display region DA. Some of the pixels PX may overlap the scan driver SDC and/or the data driver DDC in plan view.

Figure 4A:
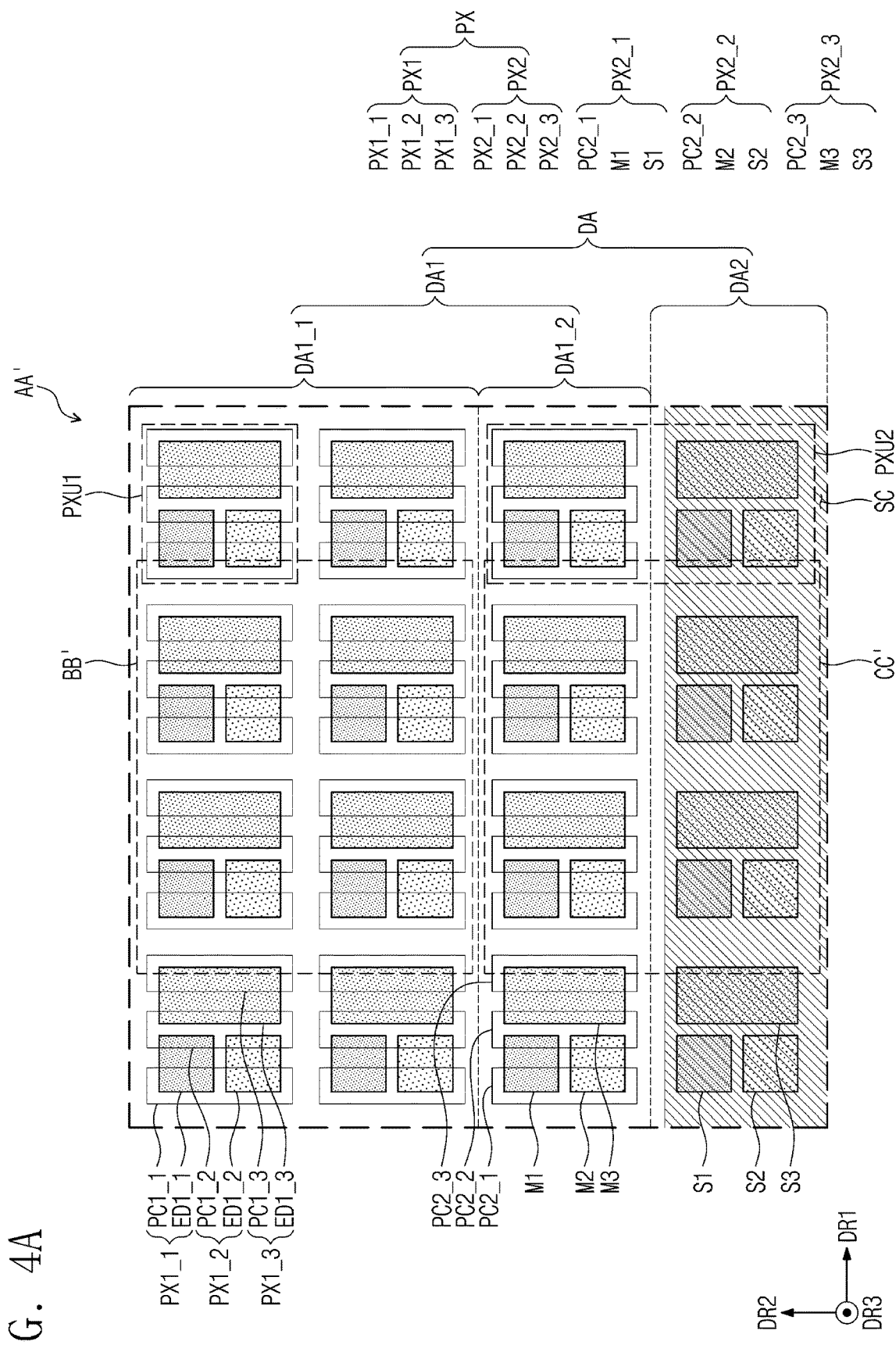
FIG. 4A is an enlarged schematic plan view of region AA' in FIG. 3 according to an embodiment of the disclosure.
Figure 4B:
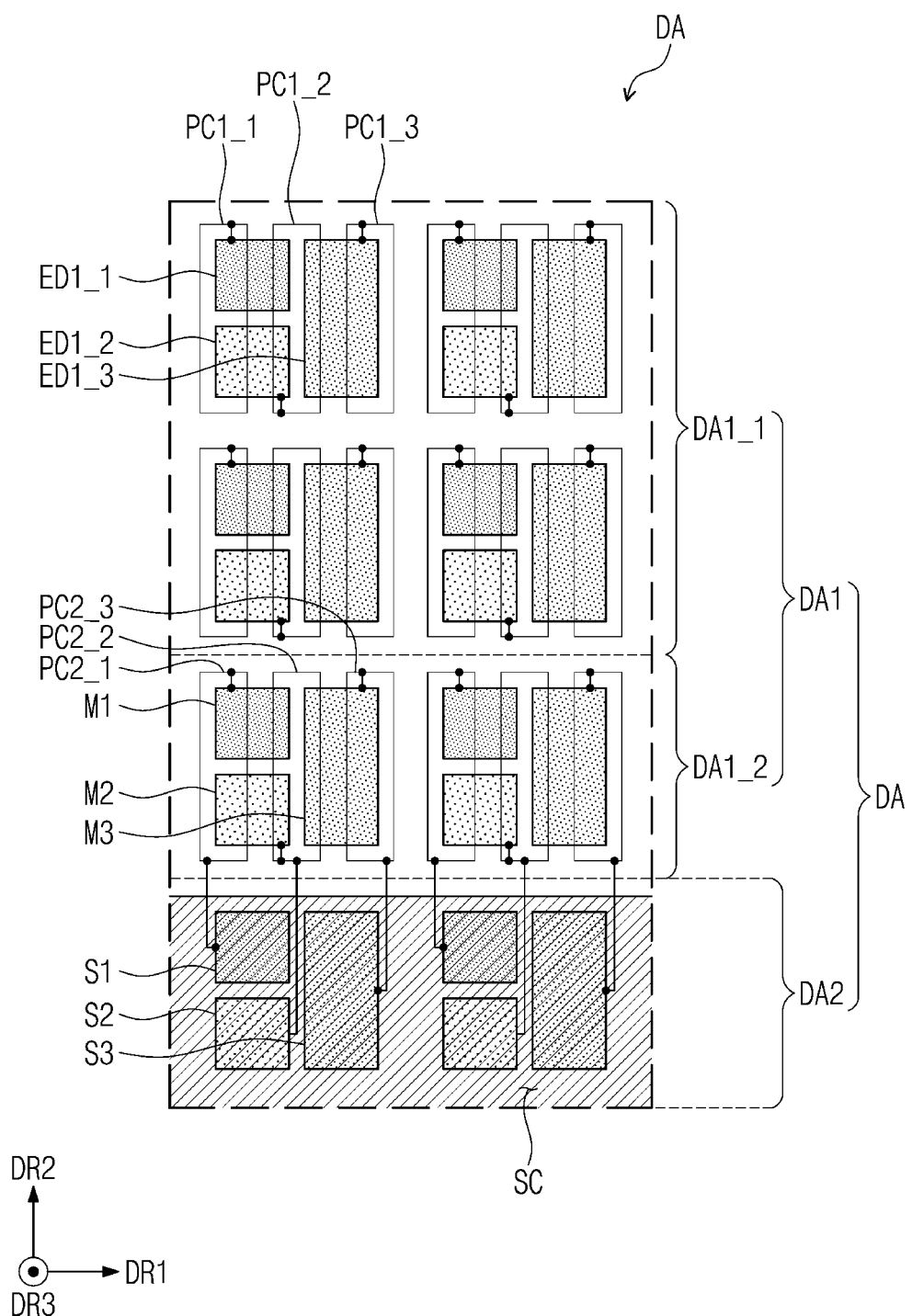
FIG. 4B is a schematic view illustrating a connection relationship between light emitting elements and pixel drivers in a region illustrated in FIG. 4A.

FIG. 4A is an enlarged schematic plan view of region AA' in FIG. 3 according to an embodiment of the disclosure. FIG. 4B is a schematic view illustrating a connection relationship between light emitting elements and pixel drivers in a region illustrated in FIG. 4A.

Referring to FIGS. 4A and 4B, the display region DA may include a first display region DA1 and a second display region DA2, and the first display region DA1 may include an inner display region DA1_1 and an outer display region DA1_2 adjacent to the second display region DA2. The inner display region DA1_1, the outer display region DA1_2, and the second display region DA2 may sequentially extend in a direction opposite to the second direction DR2.

The pixels PX may include a normal pixel PX1 (or a first pixel) and an extended pixel PX2 (or a second pixel). The normal pixel PX1 may be disposed in the inner display region DA1_1 of the first display region DAL Multiple normal pixels PX1 (hereinafter, referred to as the normal pixels) may be arranged to form a normal pixel unit PXU1. Normal pixel units PXU1 may be arranged in the first and second directions DR1 and DR2.

The normal pixels PX1 may include first normal pixels PX1_1, second normal pixels PX1_2, and third normal pixels PX1_3. In an embodiment, a first normal pixel PX1_1, a second normal pixel PX1_2, and a third normal pixel PX1_3 may form a normal pixel unit PXU1. However, the configuration of the normal pixel unit PXU1 is not limited to any one embodiment, and in the normal pixel unit PXU1, a part of the first to third normal pixels PX1_1, PX1_2, and PX1_3 may be provided in plural.

The first normal pixel PX1_1 may include a first normal pixel driver PC1_1 and a first normal light emitting element ED1_1. The first normal pixel driver PC1_1 may be electrically connected to the first normal light emitting element ED1_1 corresponding thereto and may control driving of the first normal light emitting element ED1_1.

The second normal pixel PX1_2 may include a second normal pixel driver PC1_2 and a second normal light emitting element ED1_2. The second normal pixel driver PC1_2 may be electrically connected to the second normal light emitting element ED1_2 corresponding thereto and may control driving of the second normal light emitting element ED1_2.

The third normal pixel PX1_3 may include a third normal pixel driver PC1_3 and a third normal light emitting element ED1_3. The third normal pixel driver PC1_3 may be electrically connected to the third normal light emitting element ED1_3 corresponding thereto and may control driving of the third normal light emitting element ED1_3.

In this specification, one of the first to third normal pixel drivers PC1_1, PC1_2, and PC1_3 may be referred to as a "first pixel driver", and one of the first to third normal light emitting elements ED1_1, ED1_2, and ED1_3 may be referred to as a "first light emitting element".

In an embodiment, the first normal light emitting element ED1_1 may output red light, the second normal light emitting element ED1_2 may output green light, and the third normal light emitting element ED1_3 may output blue light. However, the colors of light beams emitted from the first to third normal light emitting elements ED1_1, ED1_2, and ED1_3 are not limited to any one embodiment.

In this embodiment, the first to third normal pixel drivers PC1_1, PC1_2, and PC1_3 included in the normal pixel unit PXU1 may be sequentially arranged in the first direction DR1. First to third normal pixel drivers PC1_1, PC1_2, and PC1_3 included in adjacent normal pixel units PXU1 may have the same arrangement structure.

In this embodiment, the first and second normal light emitting elements ED1_1 and ED1_2 included in one normal pixel unit PXU1 may be arranged in the second direction DR2, and the third normal light emitting element ED1_3 included in the one normal pixel unit PXU1 may be spaced apart from the first and second normal light emitting elements ED1_1 and ED1_2 included in the one normal pixel unit PXU1 in the first direction DR1. First to third normal light emitting elements ED1_1, ED1_2, and ED1_3 included in the adjacent normal pixel units PXU1 may have the same arrangement structures.

The arrangement of the first to third normal light emitting elements ED1_1, ED1_2, and ED1_3 may differ from the arrangement of the first to third normal pixel drivers PC1_1, PC1_2, and PC1_3. Detailed description thereabout will be given below. The arrangement of the first to third normal pixel drivers PC1_1, PC1_2, and PC1_3 and the arrangement of the first to third normal light emitting elements ED1_1, ED1_2, and ED1_3 are illustrated as an example in FIGS. 4A and 4B and are not limited to any one embodiment. For example, the arrangement of the first to third normal pixel drivers PC1_1, PC1_2, and PC1_3 and the arrangement of the first to third normal light emitting elements ED1_1, ED1_2, and ED1_3 may correspond to each other.

The extended pixel PX2 may be disposed in the outer display region DA1_2 of the first display region DA1 and the second display region DA2. Multiple extended pixels PX2 (hereinafter, referred to as the extended pixels) may be arranged to form an extended pixel unit PXU2. In this embodiment, extended pixel units PXU2 may be spaced apart from the normal pixel units PXU1 in the second direction DR2 and may be arranged in the first direction DR1.

The extended pixels PX2 may include first extended pixels PX2_1, second extended pixels PX2_2, and third extended pixels PX2_3. In an embodiment, one first extended pixel PX2_1, one second extended pixel PX2_2, and one third extended pixel PX2_3 may form one extended pixel unit PXU2. However, the configuration of the extended pixel unit PXU2 is not limited to any one embodiment, and in the extended pixel unit PXU2, a part of the first to third extended pixels PX2_1, PX2_2, and PX2_3 may be provided in plural.

The first extended pixel PX2_1 may include a first extended pixel driver PC2_1 and two first extended light emitting elements M1 and S1. The two first extended light emitting elements M1 and S1 may include the first main light emitting element M1 and the first sub-light emitting element S1 (or the first copy light emitting element). In this embodiment, the first main light emitting element M1 may be disposed in the outer display region DA1_2, and the first sub-light emitting element S1 may be disposed in the second display region DA2.

The first extended pixel driver PC2_1 may be commonly connected to the two first extended light emitting elements M1 and S1. For example, the first extended pixel driver PC2_1 may simultaneously control driving of the two first extended light emitting elements M1 and S1. For example, the first extended pixel driver PC2_1 may commonly apply corresponding image data to the first main light emitting element M1 and the first sub-light emitting element S1.

The second extended pixel PX2_2 may include a second extended pixel driver PC2_2 and two second extended light emitting elements M2 and S2. The two second extended light emitting elements M2 and S2 may include the second main light emitting element M2 and the second sub-light emitting element S2 (or the second copy light emitting element). In this embodiment, the second main light emitting element M2 may be disposed in the outer display region DA1_2, and the second sub-light emitting element S2 may be disposed in the second display region DA2.

The second extended pixel driver PC2_2 may be commonly connected to the two second extended light emitting elements M2 and S2. For example, the second extended pixel driver PC2_2 may simultaneously control driving of the two second extended light emitting elements M2 and S2. For example, the second extended pixel driver PC2_2 may commonly apply corresponding image data to the second main light emitting element M2 and the second sub-light emitting element S2.

The third extended pixel PX2_3 may include a third extended pixel driver PC2_3 and two third extended light emitting elements M3 and S3. The two third extended light emitting elements M3 and S3 may include the third main light emitting element M3 and the third sub-light emitting element S3 (or the third copy light emitting element). In this embodiment, the third main light emitting element M3 may be disposed in the outer display region DA1_2, and the third sub-light emitting element S3 may be disposed in the second display region DA2.

The third extended pixel driver PC2_3 may be commonly connected to the two third extended light emitting elements M3 and S3. For example, the third extended pixel driver PC2_3 may simultaneously control driving of the two third extended light emitting elements M3 and S3. For example, the third extended pixel driver PC2_3 may commonly apply corresponding image data to the third main light emitting element M3 and the third sub-light emitting element S3.

In this embodiment, equivalent circuit diagrams of the first to third extended pixel drivers PC2_1, PC2_2, and PC2_3 may be substantially the same as equivalent circuit diagrams of the first to third normal pixel drivers PC1_1, PC1_2, and PC1_3, except that two light emitting elements may be connected in parallel. For example, in a normal pixel and an extended pixel, circuit diagrams of pixel drivers may be the same as each other, and circuit diagrams of the pixels may differ from each other due to a difference in connection relationship between light emitting elements. However, since the first to third extended pixel drivers PC2_1, PC2_2, and PC2_3 have to simultaneously control the multiple light emitting elements, driving currents higher than those of the first to third normal pixel drivers PC1_1, PC1_2, and PC1_3 may flow through the first to third extended pixel drivers PC2_1, PC2_2, and PC2_3.

Accordingly, in an embodiment, the area of a driving transistor T1 (refer to FIGS. 2A and 2B) in the first extended pixel driver PC2_1 may be designed to be larger than the area of a driving transistor T1 (refer to FIGS. 2A and 2B) in the first normal pixel driver PC1_1. The area may be increased by a method of deforming the shape of the driving transistor T1 (refer to FIGS. 2A and 2B) in the first extended pixel driver PC2_1. In another embodiment, the capacity of a first capacitor C1 (refer to FIGS. 2A and 2B) in the first extended pixel driver PC2_1 may be designed to be greater than the capacity of a first capacitor C1 (refer to FIGS. 2A and 2B) in the first normal pixel driver PC1_1.

In this specification, the extended pixel driver of one of the first to third extended pixel drivers PC2_1, PC2_2, and PC2_3 may be referred to as the "second pixel driver", the main light emitting element of one of the first to third main light emitting elements M1, M2, and M3 may be referred to as the "second light emitting element", and the sub-light emitting element of one of the first to third sub-light emitting elements S1, S2, and S3 may be referred to as the "third light emitting element".

In an embodiment, the first extended light emitting elements M1 and S1 may output red light, the second extended light emitting elements M2 and S2 may output green light, and the third extended light emitting elements M3 and S3 may output blue light.

In this embodiment, the first to third extended pixel drivers PC2_1, PC2_2, and PC2_3 included in the extended pixel unit PXU2 may be sequentially arranged in the first direction DR1. First to third extended pixel drivers PC2_1, PC2_2, and PC2_3 included in adjacent extended pixel units PXU2 may have the same arrangement structure.

In this embodiment, the first and second main light emitting elements M1 and M2 included in one extended pixel unit PXU2 may be arranged in the second direction DR2, and the third main light emitting element M3 included in the one extended pixel unit PXU2 may be spaced apart from the first and second main light emitting elements M1 and M2 included in the one extended pixel unit PXU2 in the first direction DR1. The first to third main light emitting elements M1, M2, and M3 included in the adjacent extended pixel units PXU2 may have the same arrangement structure. The arrangement structure of the first to third sub-light emitting elements S1, S2, and S3 may be the same as the arrangement structure of the first to third main light emitting elements M1, M2, and M3.

The arrangement of the first to third main light emitting elements M1, M2, and M3 and the first to third sub-light emitting elements S1, S2, and S3 may differ from the arrangement of the first to third extended pixel drivers PC2_1, PC2_2, and PC2_3. Detailed description thereabout will be given below. The arrangement of the first to third extended pixel drivers PC2_1, PC2_2, and PC2_3, the arrangement of the first to third main light emitting elements M1, M2, and M3, and the arrangement of the first to third sub-light emitting elements S1, S2, and S3 are illustrated as an example in FIGS. 4A and 4B and are not limited to any one embodiment. For example, the arrangement of the first to third extended pixel drivers PC2_1, PC2_2, and PC2_3 and the arrangement of the first to third main light emitting elements M1, M2, and M3 may correspond to each other.

The selection circuitry SC may be disposed in the second display region DA2. According to the disclosure, at least one of the first to third main light emitting elements M1, M2, and M3 and the first to third sub-light emitting elements S1, S2, and S3 may overlap the selection circuitry SC. In this embodiment, the first to third sub-light emitting elements S1, S2, and S3 may overlap the selection circuitry SC in plan view.

Figure 5A:
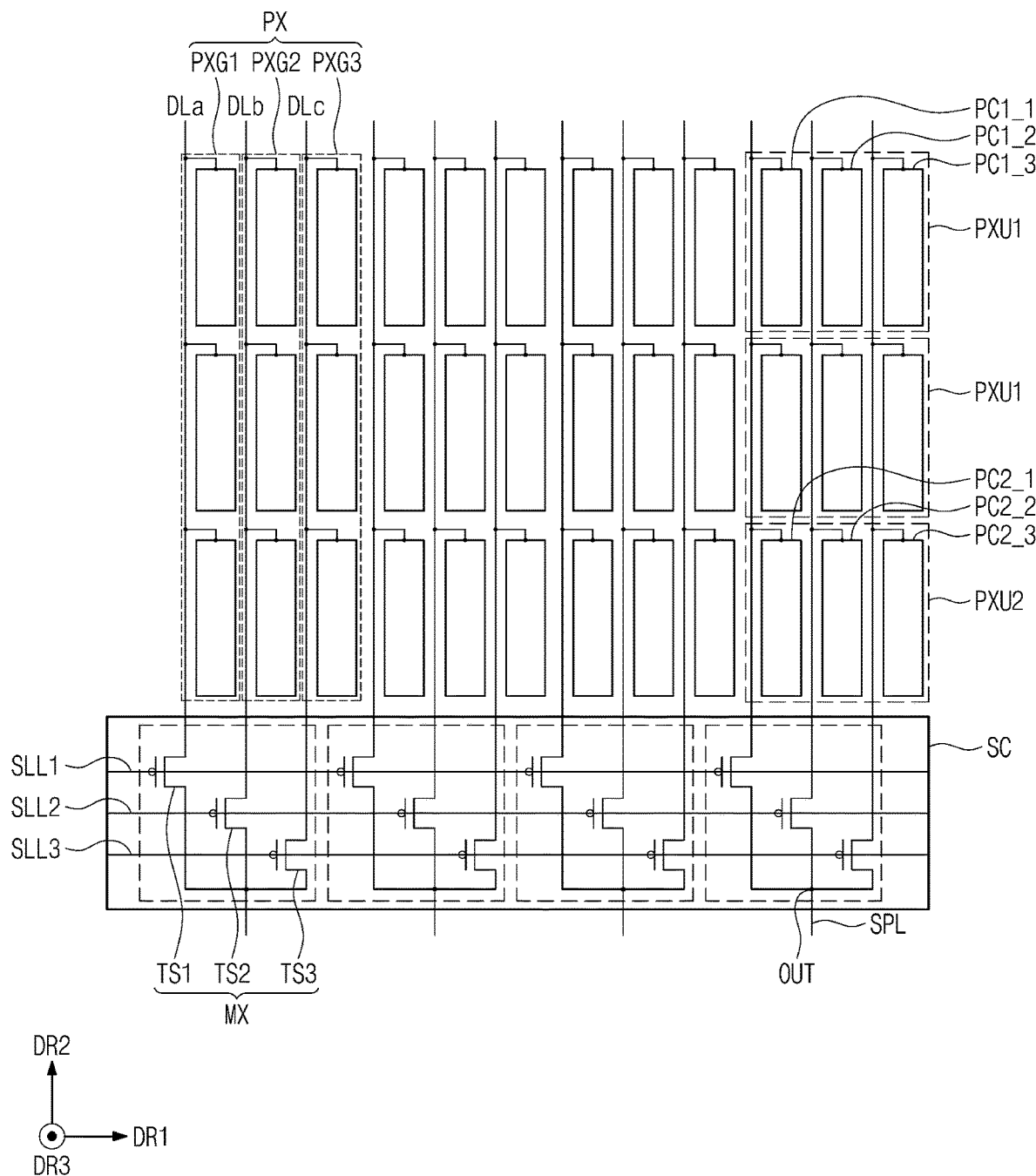
FIGS. 5A and 5B are schematic views illustrating a connection relationship between pixel drivers, data lines, and selection circuitry.
Figure 5B:
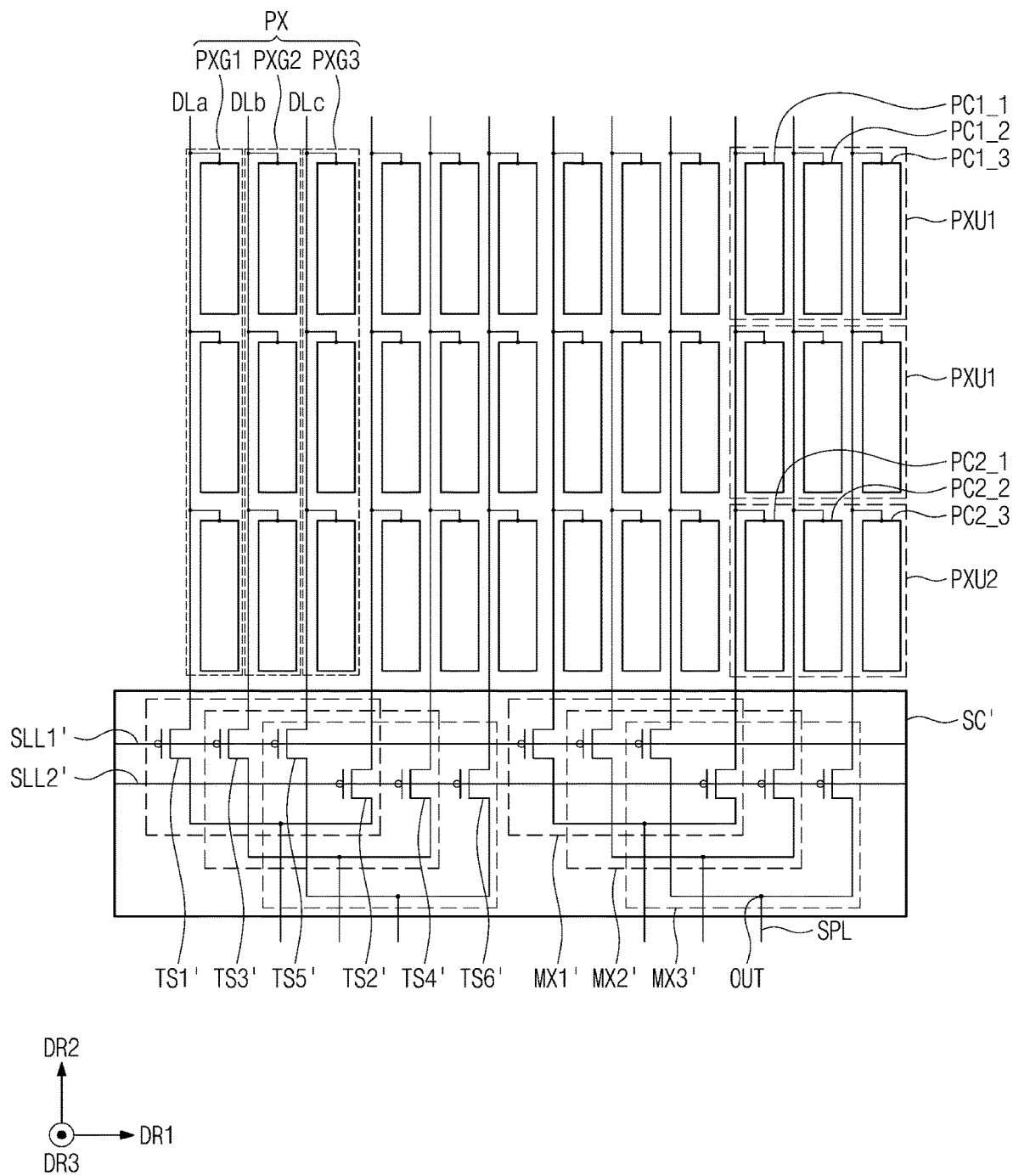

FIGS. 5A and 5B are schematic views illustrating a connection relationship between pixel drivers, data lines, and selection circuitry.

Referring to FIG. 5A, the display panel DP (refer to FIG. 3) according to an embodiment of the disclosure may include pixels PX, data lines DLa, DLb, and DLc, signal selection lines SLL1, SLL2, and SLL3, signal supply lines SPL, and selection circuitry SC. First to third normal pixel drivers PC1_1, PC1_2, and PC1_3 included in normal pixel units PXU1 at the fourth column and second row among the pixels PX and first to third extended pixel drivers PC2_1, PC2_2, and PC2_3 included in extended pixel units PXU2 at the fourth column and first row are illustrated in FIG. 5A. For convenience of description, first to third normal light emitting elements ED1_1, ED1_2, and ED1_3 (refer to FIG. 4A) included in the normal pixel units PXU1 and first to third main light emitting elements M1, M2, and M3 (refer to FIG. 4A) and first to third sub-light emitting elements S1, S2, and S3 (refer to FIG. 4A) included in the extended pixel units PXU2 are omitted in FIG. 5A.

In this embodiment, the pixels PX may be divided into first to third pixel groups PXG1, PXG2, and PXG3. The first to third pixel groups PXG1, PXG2, and PXG3 may be constituted by the first to third normal pixel drivers PC1_1, PC1_2, PC1_3 and the first to third extended pixel drivers PC2_1, PC2_2, PC2_3 that form the same columns and that are arranged in the second direction DR2.

The first pixel group PXG1 may be constituted by first normal pixels PX1_1 (refer to FIG. 4A) and a first extended pixel PX2_1 (refer to FIG. 4A) that include the first normal pixel drivers PC1_1 and the first extended pixel driver PC2_1, respectively, which are arranged in the same column. The second pixel group PXG2 may be constituted by second normal pixels PX1_2 (refer to FIG. 4A) and a second extended pixel PX2_2 (refer to FIG. 4A) that include the second normal pixel drivers PC1_2 and the second extended pixel driver PC2_2, respectively, which are arranged in the same column. The third pixel group PXG3 may be constituted by third normal pixels PX1_3 (refer to FIG. 4A) and a third extended pixel PX2_3 (refer to FIG. 4A) that include the third normal pixel drivers PC1_3 and the third extended pixel driver PC2_3, respectively, which are arranged in the same column.

In this embodiment, the data lines DL1 to DLm (refer to FIG. 1) may include the first data lines DLa, the second data lines DLb, and the third data lines DLc. The first to third data lines DLa, DLb, and DLc may extend in the second direction DR2 and may be repeatedly arranged in the first direction DR1 in the sequence of the first data line DLa, the second data line DLb, and the third data line DLc.

The first data lines DLa may be electrically connected to the first pixel groups PXG1. For example, each of the first data lines DLa may be connected to the first normal pixel drivers PC1_1 and the first extended pixel driver PC2_1 arranged in the same column. The second data lines DLb may be electrically connected to the second pixel groups PXG2. For example, each of the second data lines DLb may be connected to the second normal pixel drivers PC1_2 and the second extended pixel driver PC2_2 arranged in the same column. The third data lines DLc may be electrically connected to the third pixel groups PXG3. For example, each of the third data lines DLc may be connected to the third normal pixel drivers PC1_3 and the third extended pixel driver PC2_3 arranged in the same column.

The selection circuitry SC may include DEMUX (demultiplexer) circuits MX. The DEMUX circuits MX may electrically connect the data lines DLa, DLb, and DLc and the signal supply lines SPL. The DEMUX circuits MX may be electrically connected with the signal selection lines SLL1, SLL2, and SLL3.

In this embodiment, the signal selection lines SLL1, SLL2, and SLL3 may include the first signal selection line SLL1, the second signal selection line SLL2, and the third signal selection line SLL3. The first signal selection line SLL1 may receive a first selection signal, the second signal selection line SLL2 may receive a second selection signal, and the third signal selection line SLL3 may receive a third selection signal. The first to third selection signals may be sequentially activated. Accordingly, the DEMUX circuits MX may selectively connect the first to third data lines DLa, DLb, and DLc to the signal supply lines SPL in response to the first to third selection signals.

Each of the DEMUX circuits MX may include an output node OUT. Each of the DEMUX circuits MX may electrically connect a corresponding data line among the first to third data lines DLa, DLb, and DLc and the output node OUT in response to the first to third selection signals.

Each of the DEMUX circuits MX may include multiple switching transistors TS1, TS2, and TS3. In this embodiment, each of the DEMUX circuits MX may include the first switching transistor TS1, the second switching transistor TS2, and the third switching transistor TS3.

The first switching transistor TS1 may include a first electrode connected to the corresponding first data line DLa, a second electrode connected with the corresponding output node OUT, and a gate electrode connected with the first signal selection line SLL1 that receives the first selection signal. The second switching transistor TS2 may include a first electrode connected to the corresponding second data line DLb, a second electrode connected with the corresponding output node OUT, and a gate electrode connected with the second signal selection line SLL2 that receives the second selection signal. The third switching transistor TS3 may include a first electrode connected to the corresponding third data line DLc, a second electrode connected with the corresponding output node OUT, and a gate electrode connected with the third signal selection line SLL3 that receives the third selection signal. The first to third selection signals received by the first to third signal selection lines SLL1, SLL2, and SLL3 may correspond to the selection signals SS described above with reference to FIG. 1.

In this embodiment, each of the DEMUX circuits MX may electrically connect one of the first to third normal pixel drivers PC1_1, PC1_2, and PC1_3 included in the normal pixel unit PXU1 with the output node OUT. Furthermore, each of the DEMUX circuits MX may electrically connect one of the first to third extended pixel drivers PC2_1, PC2_2, and PC2_3 included in the extended pixel unit PXU2 with the output node OUT.

In an embodiment, each of the first to third switching transistors TS1, TS2, and TS3 may be implemented with a P-type transistor. However, without being limited thereto, each of the first to third switching transistors TS1, TS2, and TS3 may be implemented with an N-type transistor. In case that the first to third switching transistors TS1, TS2, and TS3 are implemented with P-type transistors, activation periods of the first to third selection signals may have a low level, and in case that the first to third switching transistors TS1, TS2, and TS3 are implemented with N-type transistors, the activation periods of the first to third selection signals may have a high level.

In this embodiment, fewer signal supply lines SPL than the data lines DLa, DLb, and DLc may be included since the selection circuitry SC includes the DEMUX circuits MX. Accordingly, the area occupied by the signal supply lines SPL in the non-display region NDA (refer to FIG. 3) adjacent to the second display region DA2 (refer to FIG. 4A) of the display panel DP (refer to FIG. 3) may be reduced.

Six DEMUX circuits MX1', MX2', and MX3' are illustrated as an example in FIG. 5B. Referring to FIG. 5B, selection circuitry SC' according to an embodiment of the disclosure may include the first DEMUX circuits MX1', the second DEMUX circuits MX2', and the third DEMUX circuits MX3'. Each of the first to third DEMUX circuits MX1', MX2', and MX3' may include a first signal selection line SLL1' that receives a first selection signal and a second signal selection line SLL2' that receives a second selection signal.

In this embodiment, each of the first DEMUX circuits MX1' may include a first switching transistor TS1' and a second switching transistor TS2'.

The first switching transistor TS1' may include a first electrode connected to the odd-numbered first data line DLa, a second electrode connected with the corresponding output node OUT, and a gate electrode connected with the first signal selection line SLL1' that receives the first selection signal. The second switching transistor TS2' may include a first electrode connected to the even-numbered first data line DLa, a second electrode connected with the corresponding output node OUT, and a gate electrode connected with the second signal selection line SLL2' that receives the second selection signal. Each of the first DEMUX circuits MX1' may electrically connect one of the odd-numbered first data line DLa and the even-numbered first data line DLa with the output node OUT. The first and second selection signals received by the first and second signal selection lines SLL1' and SLL2' may correspond to the selection signals SS described above with reference to FIG. 1.

Each of the second DEMUX circuits MX2' may include a third switching transistor TS3' and a fourth switching transistor TS4'. The third switching transistor TS3' may be connected with the odd-numbered second data line DLb and the first signal selection line SLL1', and the fourth switching transistor TS4' may be connected with the even-numbered second data line DLb and the second signal selection line SLL2'. Accordingly, each of the second DEMUX circuits MX2' may electrically connect one of the odd-numbered second data line DLb and the even-numbered second data line DLb with the output node OUT.

Each of the third DEMUX circuits MX3' may include a fifth switching transistor TS5' and a sixth switching transistor TS6'. The fifth switching transistor TS5' may be connected with the odd-numbered third data line DLc and the first signal selection line SLL1', and the sixth switching transistor TS6' may be connected with the even-numbered third data line DLc and the second signal selection line SLL2'. Accordingly, each of the third DEMUX circuits MX3' may electrically connect one of the odd-numbered third data line DLc and the even-numbered third data line DLc with the output node OUT.

Although FIGS. 5A and 5B illustrate the selection circuitry SC and SC', the number of switching transistors TS1, TS2, TS3, TS1', TS2', TS3', TS4', TS5', and TS6' and the number of signal selection lines SLL1, SLL2, SLL3, SLL1', and SLL2' that constitute the DEMUX circuits MX, MX1', MX2', and MX3' are not limited to any one embodiment. The configurations of the selection circuitry SC and the selection circuitry SC' may vary depending on the arrangement of the pixel drivers to which the data lines DLa, DLb, and DLc are connected and may vary depending on the design of the selection signals SS (refer to FIG. 1) transmitted to the signal selection lines SLL1, SLL2, SLL3, SLL1', and SLL2'. The configurations of the selection circuitry SC and the selection circuitry SC' are not limited to any one embodiment as long as data signals are able to be selectively applied to appropriate data lines among the data lines DLa, DLb, and DLc.

Figure 6A:
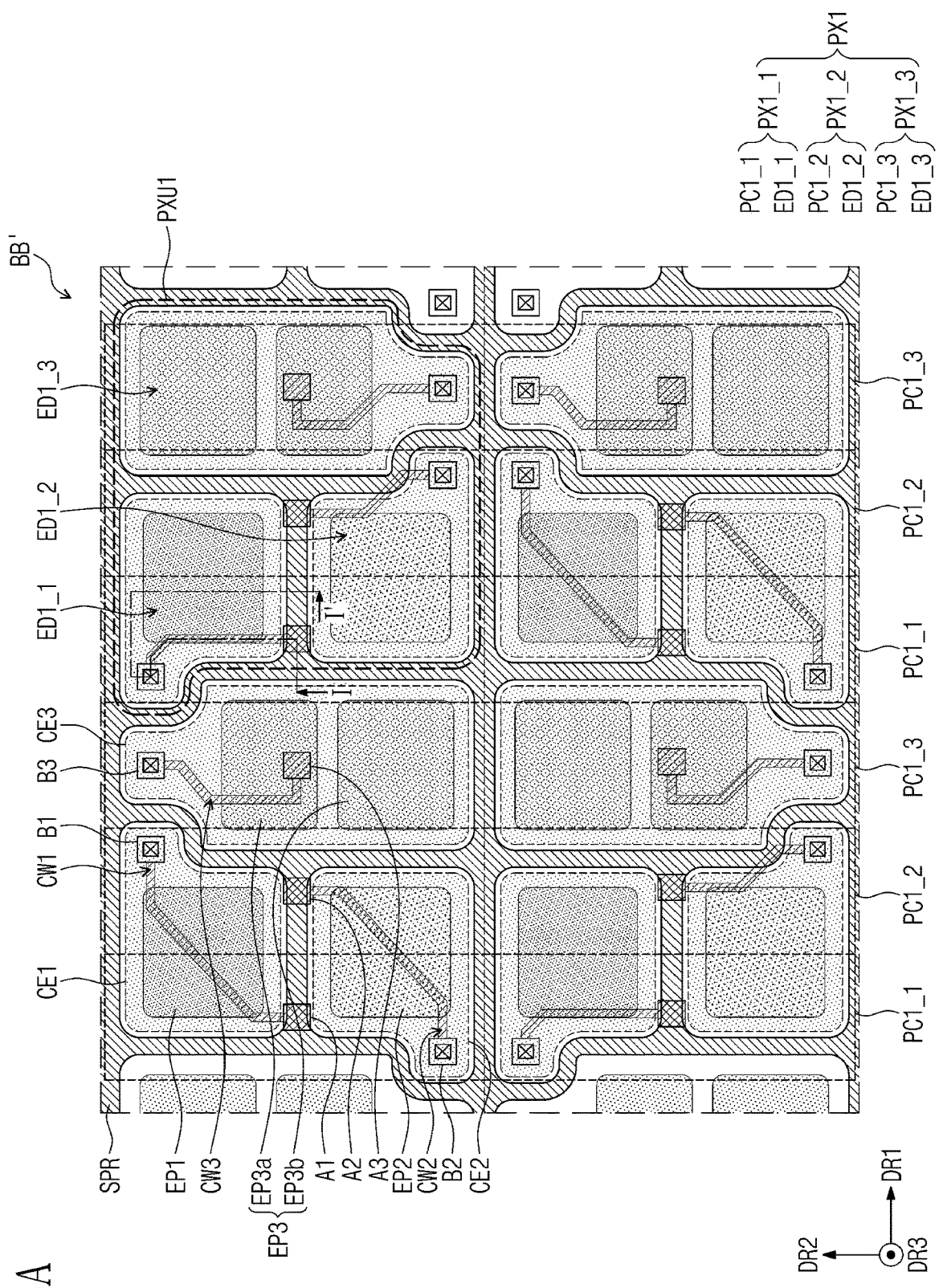
FIGS. 6A and 6B are enlarged schematic plan views of region BB' in FIG. 4A according to an embodiment of the disclosure.
Figure 6B:
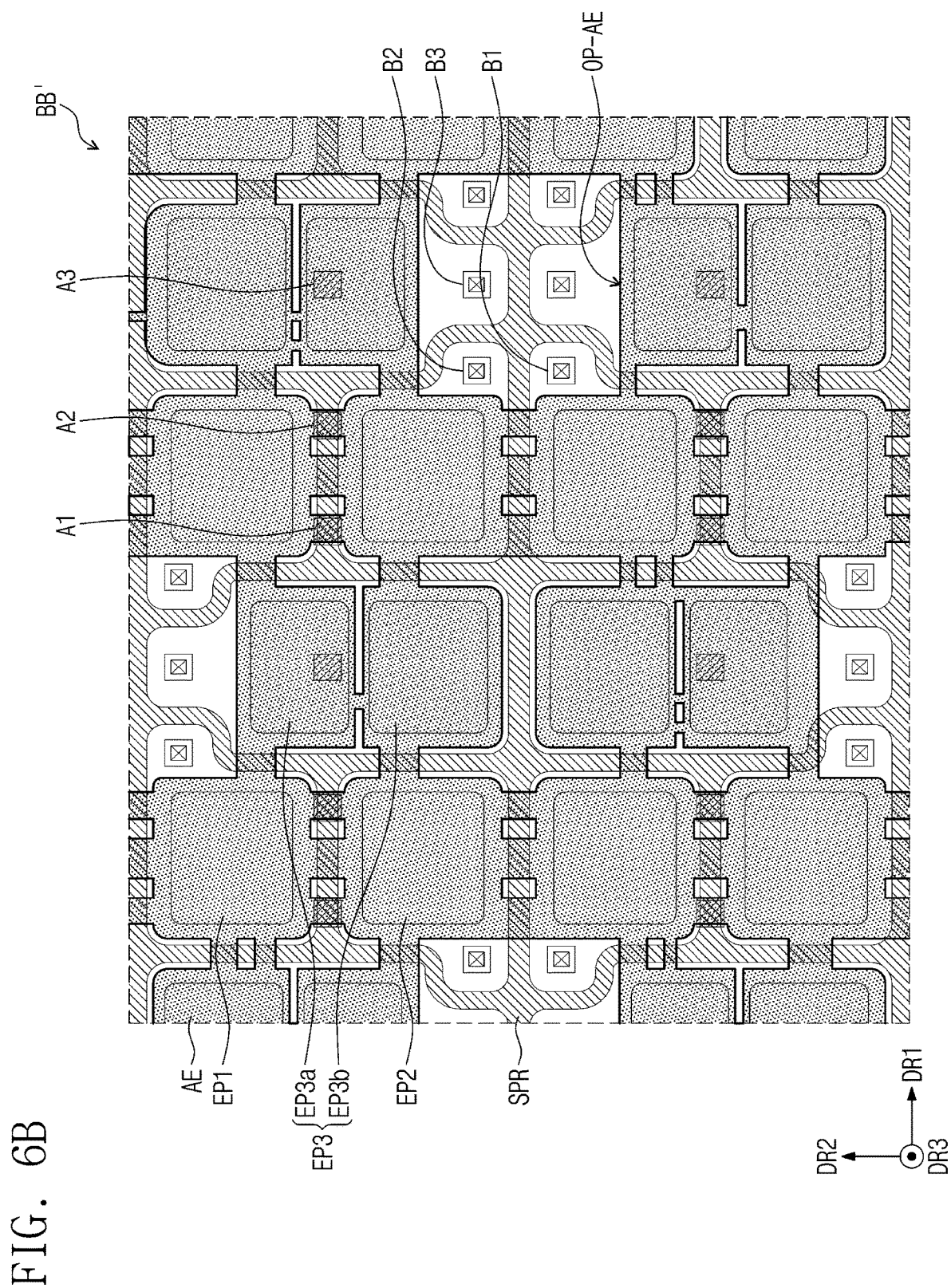
Figure 7:
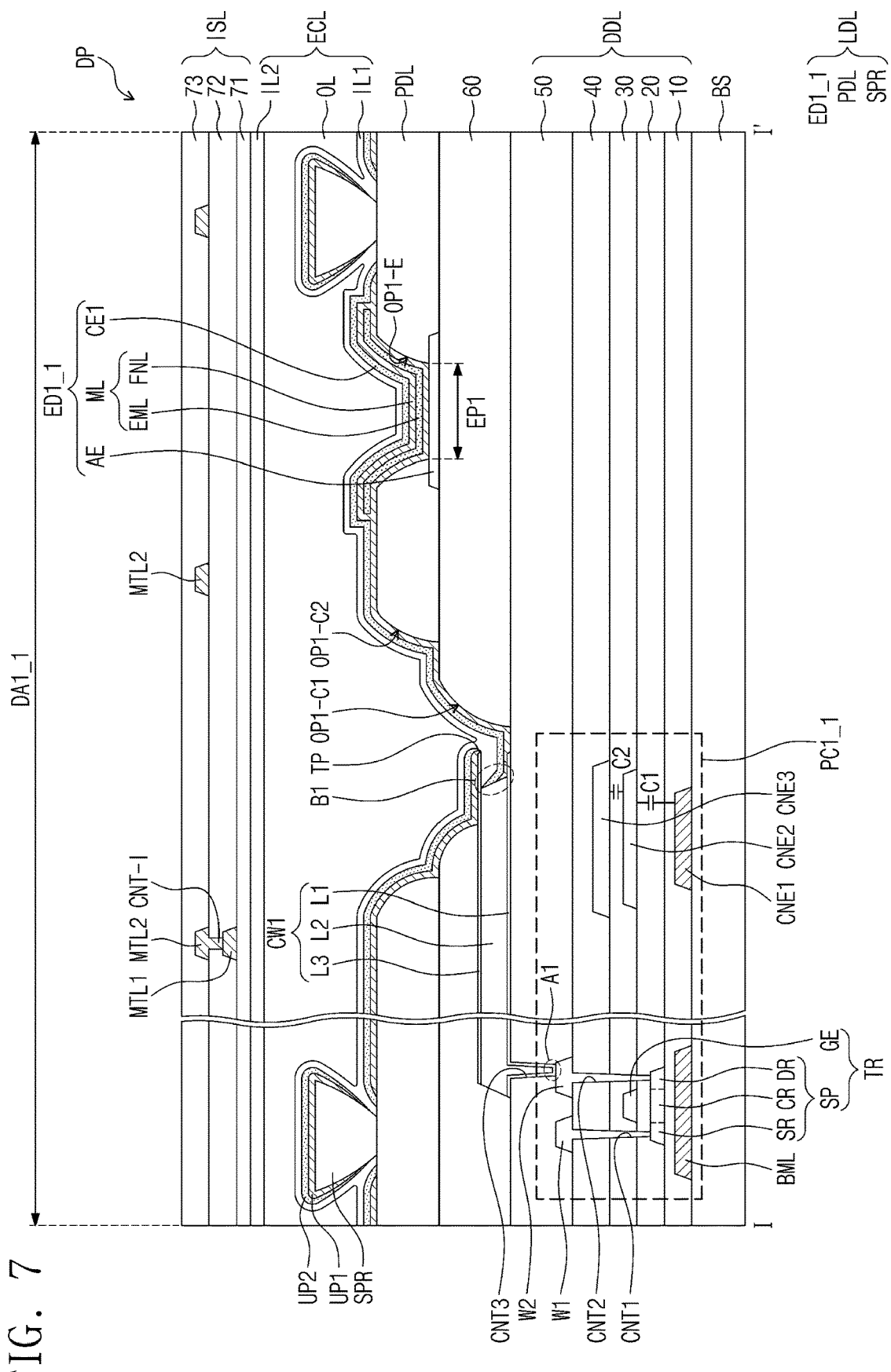
FIG. 7 is an enlarged schematic sectional view of the display panel taken along line I-I' of FIG. 6A according to an embodiment of the disclosure.

FIGS. 6A and 6B are enlarged schematic plan views of region BB' in FIG. 4A according to an embodiment of the disclosure. FIG. 7 is an enlarged schematic sectional view of the display panel taken along line I-I' of FIG. 6A according to an embodiment of the disclosure. FIGS. 6A and 6B illustrate normal pixel units PXU1 at the second row and second column. In FIG. 6B, some of the components illustrated in FIG. 6A are omitted or emphasized.

Referring to FIGS. 6A and 6B, the normal pixel units PXU1 may include first to third normal pixel drivers PC1_1, PC1_2, and PC1_3 and first to third normal light emitting elements ED1_1, ED1_2, and ED1_3.

Each of the first to third normal light emitting elements ED1_1, ED1_2, and ED1_3 may include a first electrode AE (or anode), a second electrode CE1, CE2, or CE3 (or a cathode), and an intermediate layer disposed between the first electrode AE and the second electrode CE1, CE2, or CE3.

In this specification, normal light emitting parts EP1, EP2, EP3 may be regions where light provided by the normal light emitting elements ED1_1, ED1_2, and ED1_3 is displayed and may correspond to units constituting an image displayed on the display panel DP (refer to FIG. 1). The second electrodes CE1, CE2, and CE3 and the normal light emitting parts EP1, EP2, and EP3 are illustrated in FIG. 6A, and the first electrode AE is illustrated in FIG. 6B.

As illustrated in FIG. 6A, the second electrodes CE1, CE2, and CE3 of the first to third normal light emitting elements ED1_1, ED1_2, and ED1_3 may be divided from one another by a separator SPR. For example, the boundaries between the second electrodes CE1, CE2, and CE3 of the first to third normal light emitting elements ED1_1, ED1_2, and ED1_3 may be defined by the separator SPR.

The separator SPR may have a closed-line shape corresponding to each of the first to third normal light emitting parts EP1, EP2, and EP3, and thus the second electrodes CE1, CE2, and CE3 may have divided shapes for the respective first to third normal light emitting parts EP1, EP2, and EP3. For example, the second electrodes CE1, CE2, and CE3 may be electrically independent for respective adjacent pixels.

The first to third normal light emitting elements ED1_1, ED1_2, and ED1_3 may include the first to third normal light emitting parts EP1, EP2, and EP3 that provide light having different colors. The first to third normal light emitting parts EP1, EP2, and EP3 may be regions where light provided by the first to third normal light emitting elements ED1_1, ED1_2, and ED1_3 is displayed. For example, the first normal light emitting element ED1_1 may provide red light through the first normal light emitting part EP1, the second normal light emitting element ED1_2 may provide green light through the second normal light emitting part EP2, and the third normal light emitting element ED1_3 may emit blue light through the third normal light emitting part EP3. Each of the first to third normal light emitting parts EP1, EP2, and EP3 may correspond to a normal pixel opening to be described below.

In an embodiment, the third normal light emitting part EP3 may include two sub-normal light emitting parts EP3a and EP3b spaced apart from each other in the second direction DR2. However, without being limited thereto, the third normal light emitting part EP3 may be provided as one pattern having an integrated shape, and at least one of the first and second normal light emitting parts EP1 and EP2 may include sub-normal light emitting parts.

The third normal light emitting parts EP3 of the normal pixel units PXU1 disposed in the same row so as to be adjacent to each other may have shapes horizontally symmetrical to each other. The first normal light emitting parts EP1 of the normal pixel units PXU1 disposed in the same row so as to be adjacent to each other may have shapes having line symmetry with respect to a virtual line extending in the second direction DR2. The second normal light emitting parts EP2 of the normal pixel units PXU1 disposed in the same row so as to be adjacent to each other may have shapes having line symmetry with respect to the virtual line extending in the second direction DR2.

The first to third normal light emitting parts EP1, EP2, and EP3 of the normal pixel unit PXU1 at the k-th row and l-th column (k and l being natural numbers except zero) may have the same shapes as the first to third normal light emitting elements EP1, EP2, and EP3 of the normal pixel unit PXU1 at the (k+1)th row and (l+1) column.

The first to third normal pixel drivers PC1_1, PC1_2, and PC1_3 may be connected to the first to third normal light emitting elements ED1_1, ED1_2, and ED1_3 constituting the first to third normal light emitting parts EP1, EP2, and EP3.

The first to third normal pixel drivers PC1_1, PC1_2, and PC1_3 may be disposed in positions different from the regions divided by the separator SPR, for example, the positions in which the first to third second electrodes CE1, CE2, and CE3 are disposed, or may be designed to have shapes different from the shapes of the first to third second electrodes CE1, CE2, and CE3. In another embodiment, the first to third normal pixel drivers PC1_1, PC1_2, and PC1_3 may be disposed to overlap the positions in which the first to third normal light emitting parts EP1, EP2, and EP3 exist and may be designed in shapes similar to the shapes of the regions divided by the separator SPR, for example, the first to third second electrodes CE1, CE2, and CE3.

In this embodiment, the first to third normal pixel drivers PC1_1, PC1_2, and PC1_3 are illustrated in a rectangular shape, the first to third normal light emitting parts EP1, EP2, and EP3 are arranged in different forms, and the first to third second electrodes CE1, CE2, and CE3 are disposed in positions overlapping the first to third normal light emitting parts EP1, EP2 and EP3 and illustrated in an irregular shape.

Accordingly, as illustrated in FIG. 6A, the first normal pixel driver PC1_1 may be disposed on a position that partially overlaps the first normal light emitting part EP1, the second normal light emitting part EP2, and another adjacent normal pixel unit. The second normal pixel driver PC1_2 may be disposed in a position that overlaps the first normal light emitting part EP1, the second normal light emitting part EP2, and the third normal light emitting part EP3. The third normal pixel driver PC1_3 may be disposed in a position that overlaps the third normal light emitting part EP3. This is illustrative, and the positions of the first to third normal pixel drivers PC1_1, PC1_2, and PC1_3 may be designed in various forms and arrangements independently of the first to third normal light emitting parts EP1, EP2, and EP3 and are not limited to any one embodiment.

The first to third normal light emitting elements ED1_1, ED1_2, and ED1_3 may be connected to the first to third normal pixel drivers PC1_1, PC1_2, and PC1_3 through normal connecting wires CW1, CW2, and CW3, respectively. Specifically, the normal connecting wires CW1, CW2, and CW3 may correspond to nodes (refer to N4 of FIG. 2A or N2 of FIG. 2B) where the normal light emitting elements ED1_1, ED1_2, and ED1_3 are connected to the normal pixel drivers PC1_1, PC1_2, and PC1_3, respectively.

The normal connecting wires CW1, CW2, and CW3 may include the first normal connecting wire CW1 connecting the first normal light emitting element ED1_1 and the first normal pixel driver PC1_1, the second normal connecting wire CW2 connecting the second normal light emitting element ED1_2 and the second normal pixel driver PC1_2, and the third normal connecting wire CW3 connecting the third normal light emitting element ED1_3 and the third normal pixel driver PC1_3.

Each of the first to third normal connecting wires CW1, CW2, and CW3 may include a normal driving connection A1, A2, or A3 connected to a corresponding normal pixel driver among the first to third normal pixel drivers PC1_1, PC1_2, and PC1_3 and a normal light emitting connection B1, B2, or B3 connected to a corresponding normal light emitting element among the first to third normal light emitting elements ED1_1, ED1_2, and ED1_3.

Specifically, the normal driving connections A1, A2, and A3 may be portions where the normal connecting wires CW1, CW2, and CW3 are connected with the normal pixel drivers PC1_1, PC1_2, and PC1_3, respectively. The normal driving connections A1, A2, and A3 may correspond to the positions of connection transistors constituting the first to third normal pixel drivers PC1_1, PC1_2, and PC1_3. A connection transistor may be a transistor that includes, as one electrode, a connection node to which a normal pixel driver and a normal light emitting element are connected in one pixel and, for example, may correspond to the sixth transistor T6 of FIG. 2A or the first transistor T1 of FIG. 2B.

The normal driving connections A1, A2, and A3 may include the first normal driving connection A1 included in the first normal connecting wire CW1, the second normal driving connection A2 included in the second normal connecting wire CW2, and the third normal driving connection A3 included in the third normal connecting wire CW3. The first to third normal driving connections A1, A2, and A3 may overlap the first to third normal pixel drivers PC1_1, PC1_2, and PC1_3. In an embodiment, the first to third normal driving connections A1, A2, and A3 may be aligned in the first direction DR1.

The normal light emitting connections B1, B2, and B3 may be portions where the first to third normal connecting wires CW1, CW2, and CW3 are connected to the second electrodes CE1, CE2, and CE3 of the first to third normal light emitting elements ED1_1, ED1_2, and ED1_3, respectively.

The normal light emitting connections B1, B2, and B3 may include the first normal light emitting connection B1 included in the first normal connecting wire CW1, the second normal light emitting connection B2 included in the second normal connecting wire CW2, and the third normal light emitting connection B3 included in the third normal connecting wire CW3.

In an embodiment, the third normal light emitting connections B3 may be spaced apart from the third normal light emitting part EP3 in the second direction DR2. Two adjacent first normal light emitting connections B1 may be spaced apart from each other in the first direction DR1 with one third normal light emitting connection B3 therebetween. Two adjacent second normal light emitting connections B2 may be spaced apart from each other in the first direction DR1 with the other one third normal light emitting connection B3 therebetween. The first and second normal light emitting connections B1 and B2 adjacent to each other may be spaced apart from each other in the second direction DR2.

The normal light emitting connections B1, B2, and B3 may be disposed in positions spaced apart from the normal light emitting parts EP1, EP2, and EP3, and the second electrodes CE1, CE2, and CE3 may include partial regions protruding from the first to third normal light emitting parts EP1, EP2, and EP3 to provide positions in which the first to third normal light emitting connections B1, B2, and B3 are disposed.

In an embodiment, a part of the first normal light emitting connections B1 may be disposed to overlap the corresponding first normal pixel driver PC1_1, and another part may be disposed to overlap the adjacent second normal pixel driver PC1_2. A part of the second normal light emitting connections B2 may be disposed to overlap the corresponding second normal pixel driver PC1_2, and another part may be disposed to overlap the adjacent first normal pixel driver PC1_1. Each of the third normal light emitting connections B3 may overlap the corresponding third normal pixel driver PC1_3.

Since the first to third normal pixel drivers PC1_1, PC1_2, and PC1_3 are electrically connected with the first to third normal light emitting elements ED1_1, ED1_2, and ED1_3 by the normal connecting wires CW1, CW2, and CW3, the positions of the first to third normal light emitting connections B1, B2, and B3 may not be limited to the positions of the first to third normal pixel drivers PC1_1, PC1_2, and PC1_3. Accordingly, in the design of the normal pixel drivers, a limitation depending on the positions or shapes of the normal light emitting parts may be decreased, and the degree of freedom of circuit design may be improved.

Referring to FIG. 6B, the first electrode AE according to an embodiment of the disclosure may be commonly provided for the normal light emitting parts EP1, EP2, and EP3. For example, the first electrode AE may be provided in an integrated shape and may be disposed to overlap the normal light emitting parts EP1, EP2, and EP3 or the separator SPR. The first power supply voltage VDD (refer to FIG. 2A) may be applied to the first electrode AE, and a common voltage may be provided to all of the normal light emitting parts EP1, EP2, and EP3. Furthermore, the first electrode AE may be commonly provided for main light emitting parts and sub-light emitting parts to be described below.

The first electrode AE may be connected with the first power line VDL (refer to FIG. 2A), which provides the first power supply voltage VDD (refer to FIG. 2A), in the non-display region NDA (refer to FIG. 3) or may be connected with the first power line VDL (refer to FIG. 2A) in the display region DA (refer to FIG. 3) and is not limited to any one embodiment.

Multiple openings OP-AE may be defined in the first electrode AE according to this embodiment. The openings OP-AE may be defined through the first electrode AE. The openings OP-AE may be disposed in positions not overlapping the light emitting parts EP1, EP2, and EP3 and may be defined in positions overlapping the separator SPR. The openings OP-AE may facilitate discharge of gas generated from an organic layer disposed under the first electrode AE, for example, a sixth insulating layer 60 (refer to FIG. 7) to be described below. Accordingly, degradation of a light emitting element due to the gas discharged from the organic layer may be improved.

According to the disclosure, unlike light emitting parts in which a connection transistor of a corresponding pixel driver and a cathode overlap each other in plan view, light emitting parts including a cathode having a shape not overlapping a connection transistor of a pixel driver may further include a connecting wire and thus may be readily connected to the pixel driver. According to the disclosure, since the light emitting parts further include the connecting wire, the light emitting parts may be stably connected to the pixel driver by changing only the shape of a cathode without changing the design of the light emitting parts. Accordingly, an influence of the arrangement or shapes of the light emitting parts on the connection with the pixel driver may be reduced. Thus, the degree of freedom in design of the pixel driver may be improved, and a decrease in the aperture ratio of the light emitting part may be prevented.

Referring to FIG. 7, the display panel DP according to an embodiment of the disclosure may include a base layer BS, a driving element layer DDL, a light emitting element layer LDL, and a sensing layer ISL. The display panel DP may include multiple insulating layers 10, 20, 30, 40, and 50 disposed on the base layer BS and multiple conductive patterns and semiconductor patterns disposed between the insulating layers 10, 20, 30, 40, and 50. In the inner display region DA1_1, the conductive patterns and the semiconductor patterns may be disposed between the insulating layers 10, 20, 30, 40, and 50 to configure the first to third normal pixel drivers PC1_1, PC1_2, and PC1_3 (refer to FIG. 6A) and the first to third normal connecting wires CW1, CW2, and CW3 (refer to FIG. 6A). For ease of description, the first normal light emitting element ED1_1, some components of the first normal pixel driver PC1_1, and the first normal connecting wire CW1 (hereinafter, referred to as the normal connecting wire) electrically connecting the first normal light emitting element ED1_1 (hereinafter, referred to as the normal light emitting element) and the first normal pixel driver PC1_1 (hereinafter, referred to as the normal pixel driver) are illustrated in FIG. 7.

The base layer BS may be a member that provides a base surface on which the normal pixel driver PC1_1 is disposed. The base layer BS may be a rigid substrate, or a flexible substrate that can be bent, folded, and/or rolled. The base layer BS may be a glass substrate, a metal substrate, and/or a polymer substrate. However, without being limited thereto, the base layer BS may be an inorganic layer, an organic layer, or a composite layer.

The base layer BS may have a multi-layer structure. For example, the base substrate BS may have a three-layer structure including a polymer resin layer, an adhesive layer, and a polymer resin layer. In particular, the polymer resin layer may include a polyimide-based resin. In another embodiment, the polymer resin layer may include at least one of an acrylate-based resin, a methacrylate-based resin, a polyisoprene-based resin, a vinyl-based resin, an epoxy-based resin, a urethane-based resin, a celluose-based resin, a siloxane-based resin, a polyamide-based resin, and a perylene-based resin. A "—"-based resin used herein may refer to a resin including a "—" functional group.

Insulating layers disposed on the base layer BS or conductive layers and semiconductor layers may be formed by a method such as coating and deposition. Thereafter, an organic layer, an inorganic layer, a semiconductor layer, and a conductive layer may be selectively subjected to patterning by performing a photolithography process multiple times, and a hole may be formed in an insulating layer, thus a semiconductor pattern, a conductive pattern, and a signal line may be formed.

The driving element layer DDL may include the first to fifth insulating layers 10, 20, 30, 40, and 50 stacked on each other on the base layer BS and the normal pixel driver PC1_1. One transistor TR and two capacitors C1 and C2 of the normal pixel driver PC1_1 are illustrated in FIG. 7. The one transistor TR may correspond to a transistor connected to the normal light emitting element ED1_1 through the normal connecting wire CW1, for example, a transistor (hereinafter, referred to as the connection transistor) connected to a node (refer to the fourth node N4 of FIG. 2A or the second node N2 of FIG. 2B) corresponding to the cathode of the normal light emitting element ED1_1. Specifically, the one transistor TR may correspond to the sixth transistor T6 of FIG. 2A or the first transistor T1 of FIG. 2B. Although not illustrated, other transistors constituting the normal pixel driver PC1_1 may have the same structure as the connection transistor TR illustrated in FIG. 7. However, without being limited thereto, the other transistors constituting the normal pixel driver PC1_1 may have a structure different from that of the connection transistor TR and are not limited to any one embodiment.

The first insulating layer 10 may be disposed on the base layer BS. The first insulating layer 10 may be an inorganic layer and/or an organic layer and may have a single-layer structure or a multi-layer structure. The first insulating layer 10 may include at least one of aluminum oxide, titanium oxide, silicon oxide, silicon nitride, silicon oxy-nitride, zirconium oxide, and hafnium oxide. In this embodiment, the first insulating layer 10 is illustrated as a single silicon oxide layer. Insulating layers to be described below may be inorganic layers and/or organic layers and may have a single-layer structure or a multi-layer structure. The inorganic layers may include at least one of the aforementioned materials, but are not limited thereto.

The first insulating layer 10 may cover a lower conductive layer BML. For example, the display panel DP may further include the lower conductive layer BML disposed under the connection transistor TR so as to overlap the connection transistor TR. The lower conductive layer BML may block an influence of an electrical potential due to a polarization phenomenon of the base layer BS on the connection transistor TR. Furthermore, the lower conductive layer BML may block light incident on the connection transistor TR from below the lower conductive layer BML. At least one of an inorganic barrier layer and a buffer layer may be additionally disposed between the lower conductive layer BML and the base layer BS.

The lower conductive layer BML may include reflective metal. For example, the lower conductive layer BML may include titanium (Ti), molybdenum (Mo), an alloy containing molybdenum, aluminum (Al), an alloy containing aluminum, aluminum nitride (AlN), tungsten (W), tungsten nitride, and/or copper (Cu).

In an embodiment, the lower conductive layer BML may be connected with a source of the connection transistor TR through a source electrode pattern W1. The lower conductive layer BML may be synchronized with the source of the connection transistor TR. However, this is illustrative, and the lower conductive layer BML may be connected to a gate of the connection transistor TR and may be synchronized with the gate. In another embodiment, the lower conductive layer BML may be connected to another electrode and may independently receive a constant voltage or a pulse signal. In another case, the lower conductive layer BML may be provided in a form isolated from another conductive pattern. The lower conductive layer BML according to an embodiment of the disclosure may be provided in various forms and is not limited to any one embodiment.

The connection transistor TR may be disposed on the first insulating layer 10. The connection transistor TR may include a semiconductor pattern SP and a gate electrode GE. The semiconductor pattern SP may be disposed on the first insulating layer 10. The semiconductor pattern SP may include an oxide semiconductor. For example, the oxide semiconductor may include transparent conductive oxide (TCO) such as indium tin oxide (ITO), indium zinc oxide (IZO), indium gallium zinc oxide (IGZO), zinc oxide (ZnO), and/or indium oxide ($In_2O_3$) However, without being limited thereto, the semiconductor pattern SP may include amorphous silicon, low-temperature polycrystalline silicon, or other oxide semiconductor.

The second insulating layer 20 may commonly overlap multiple pixels and may cover the semiconductor pattern SP. The second insulating layer 20 may be an inorganic layer and/or an organic layer and may have a single-layer structure or a multi-layer structure. The second insulating layer 20 may include at least one of aluminum oxide, titanium oxide, silicon oxide, silicon nitride, silicon oxy-nitride, zirconium oxide, and hafnium oxide. In this embodiment, the second insulating layer 20 may be a single silicon oxide layer.

The semiconductor pattern SP may include a source region SR, a drain region DR, and a channel region CR that are distinguished from one another depending on the degree of conductivity. The channel region CR may be a portion overlapping the gate electrode GE in plan view. The source region SR and the drain region DR may be portions spaced apart from each other with the channel region CR therebetween.

In a case in which the semiconductor pattern SP is an oxide semiconductor, the source region SR and the drain region DR may be reduced regions. Accordingly, the source region SR and the drain region DR may have higher reduced-metal content than the channel region CR. In another embodiment, in a case in which the semiconductor pattern SP is polycrystalline silicon, the source region SR and the drain region DR may be heavily doped regions.

The source region SR and the drain region DR may have a higher conductivity than the channel region CR. The source region SR may correspond to a source electrode of the connection transistor TR, and the drain region DR may correspond to a drain electrode of the connection transistor TR.

As illustrated in FIG. 7, the conductive patterns may include the source electrode pattern W1 and a drain electrode pattern W2, and the source electrode pattern W1 and the drain electrode pattern W2 may be connected to the source region SR and the drain region DR, respectively. The source electrode pattern W1 and the source region SR of the semiconductor pattern SP may function as the source of the connection transistor TR. The drain electrode pattern W2 and the drain region DR of the semiconductor pattern SP may function as a drain of the connection transistor TR.

Each of the source electrode pattern W1 and the drain electrode pattern W2 may be integrally formed with one of lines constituting the pixel drivers PC and PC-1 (refer to FIGS. 2A and 2B) and are not limited to any one embodiment.

The gate electrode GE is disposed on the second insulating layer 20. The gate electrode GE may correspond to the gate of the connection transistor TR. The gate electrode GE may be disposed over the semiconductor pattern SP. However, this is illustrative, and the gate electrode GE may be disposed under the semiconductor pattern SP and is not limited to any one embodiment.

The gate electrode GE may include titanium (Ti), silver (Ag), molybdenum (Mo), aluminum (Al), aluminum nitride (AlN), tungsten (W), tungsten nitride (WN), copper (Cu), or an alloy thereof, but is not particularly limited thereto.

Among multiple conductive patterns W1, W2, CNE1, CNE2, and CNE3, the first capacitor electrode CNE1 and the second capacitor electrode CNE2 constitutes the first capacitor C1. The first capacitor C1 of FIG. 7 may correspond to the first capacitor C1 described above with reference to FIG. 2A and the capacitor C1 described above with reference to FIG. 2B.

The first capacitor electrode CNE1 and the second capacitor electrode CNE2 may be spaced apart from each other with the first insulating layer 10 and the second insulating layer 20 therebetween.

In an embodiment of the disclosure, the first capacitor electrode CNE1 and the lower conductive layer BML may be integrally formed. Furthermore, the second capacitor electrode CNE2 and the gate electrode GE may be integrally formed.

The third capacitor electrode CNE3 may be disposed on the third insulating layer 30. The third capacitor electrode CNE3 may be spaced apart from the second capacitor electrode CNE2 with the third insulating layer 30 therebetween and may overlap the second capacitor electrode CNE2 in plan view. The third capacitor electrode CNE3 may constitute the second capacitor C2 together with the second capacitor electrode CNE2. The second capacitor C2 of FIG. 7 may correspond to the second capacitor C2 described above with reference to FIG. 2A.

The fourth insulating layer 40 may be disposed on the third insulating layer 30 and may cover the third capacitor electrode CNE3. Among the conductive patterns W1, W2, CNE1, CNE2, and CNE3, the source electrode pattern W1 and the drain electrode pattern W2 (or the connecting electrode) may be disposed on the fourth insulating layer 40. The source electrode pattern W1 may be connected to the source region SR of the connection transistor TR through a first contact hole CNT1. The drain electrode pattern W2 may be connected to the drain region DR of the connection transistor TR through a second contact hole CNT2.

The fifth insulating layer 50 may be disposed on the source electrode pattern W1 and the drain electrode pattern W2. The normal connecting wire CW1 may be disposed on the fifth insulating layer 50.

The normal connecting wire CW1 may connect the connection transistor TR and the normal light emitting element ED1_1. The normal connecting wire CW1 may be a connection node that connects the normal pixel driver PC1_1 and the normal light emitting element ED1_1. For example, the normal connecting wire CW1 may correspond to the fourth node N4 illustrated in FIG. 2A (refer to FIG. 2A) or may correspond to the second node N2 illustrated in FIG. 2B (refer to FIG. 2B). This is illustrative, and the normal connecting wire CW1 may be defined as a connection node with various elements among elements constituting the normal pixel driver PC1_1 depending on the design of the normal pixel driver PC1_1 if the normal connecting wire CW1 is able to be connected with the normal light emitting element ED1_1, and is not limited to any one embodiment.

The normal connecting wire CW1 may be connected to the drain electrode pattern W2 through a third contact hole CNT3 penetrating the fifth insulating layer 50 and may be electrically connected to the drain region DR. The point at which the normal connecting wire CW1 is connected to the connection transistor TR is represented by a first normal driving connection A1.

The sixth insulating layer 60 may be disposed between the driving element layer DDL and the light emitting element layer LDL. The sixth insulating layer 60 is disposed on the fifth insulating layer 50 and covers the normal connecting wire CW1. The fifth insulating layer 50 and the sixth insulating layer 60 may be organic layers. For example, each of the fifth insulating layer 50 and the sixth insulating layer 60 may include a general purpose polymer, such as benzocyclobutene (BCB), polyimide, hexamethyldisiloxane (HMDSO), Polymethylmethacrylate (PMMA), or Polystyrene (PS), a polymer derivative having a phenolic group, an acrylate-based polymer, an imide-based polymer, an aryl ether-based polymer, an amide-based polymer, a fluorine-based polymer, a p-xylene-based polymer, a vinyl alcohol-based polymer, and a blend thereof.

The normal connecting wire CW1 may have conductivity and may be formed in a three-layer structure. The normal connecting wire CW1 may include a first layer L1, a second layer L2, and a third layer L3 that are stacked on each other in the third direction DR3.

The first and third layers L1 and L3 may have a smaller thickness than the second layer L2. The first and third layers L1 and L3 may include the same material, and the second layer L2 may include a material different from those of the first and third layers L1 and L3. The etch rate of the second layer may be greater than the etch rate of the first and third layers L1 and L3. For example, the second layer L2 may include a material having high etch selectivity with respect to each of the first and third layers L1 and L3. For example, the first and third layers L1 and L3 may include titanium (Ti), and the second layer L2 may include aluminum (Al). However, the materials of the first to third layers L1, L2, and L3 are not limited to any one embodiment.

A side surface of the second layer L2 may be defined inward of a side surface of the third layer L3. For example, the side surface of the third layer L3 may protrude outward from the side surface of the second layer L2. A portion of the third layer L3 that protrudes from the second layer L2 may be a tip portion TP. One end portion of a normal connecting wire CW1 where the tip portion TP is defined may be exposed from the sixth insulating layer 60 by a first normal contact opening OP1-C1 of the sixth insulating layer 60.

In the inner display region DA1_1, the light emitting element layer LDL is disposed on the sixth insulating layer 60. The light emitting element layer LDL may include a pixel defining layer PDL, the normal light emitting element ED1_1, and the separator SPR. In the display panel DP according to an embodiment of the disclosure, the sixth insulating layer 60 may be omitted, or multiple sixth insulating layers 60 may be provided. However, the sixth insulating layer 60 is not limited to any one embodiment.

The pixel defining layer PDL may have a property of absorbing light. For example, the pixel defining layer PDL may be black in color. The pixel defining layer PDL may include a black coloring agent. The black coloring agent may include a black dye or a black pigment. The black coloring agent may include carbon black, metal such as chromium, or oxide thereof. The pixel defining layer PDL may correspond to a light blocking pattern having light blocking characteristics.

A normal light emitting opening OP1-E and a second normal contact opening OP1-C2 may be defined in the pixel defining layer PDL. The normal light emitting opening OP1-E may expose at least a portion of the first electrode AE of the normal light emitting element ED1_1. An emissive region of the normal light emitting element ED1_1 may substantially correspond to the shape of the first electrode AE exposed by the normal light emitting opening OP1-E. Accordingly, the shapes of the above-described normal light emitting parts EP1, EP2, and EP3 (refer to FIG. 6A) may substantially correspond to the shape of the normal light emitting opening OP1-E in plan view.

The second normal contact opening OP1-C2 may correspond to the first normal contact opening OP1-C1 of the sixth insulating layer 60. The one end portion of the normal connecting wire CW1 where the tip portion TP is defined may be exposed from the pixel defining layer PDL by the second normal contact opening OP1-C2.

The normal light emitting element ED1_1 may include the first electrode AE, an intermediate layer ML, and the second electrode CE1. The first electrode AE may be a transparent, translucent, or reflective electrode. According to an embodiment of the disclosure, the first electrode AE may include a reflective layer formed of silver (Ag), magnesium (Mg), aluminum (Al), platinum (Pt), palladium (Pd), gold (Au), nickel (Ni), neodymium (Nd), iridium (Jr), chromium (Cr), or a compound thereof and a transparent or translucent electrode layer formed on the reflective layer. The transparent or translucent electrode layer may include at least one selected from the group consisting of indium tin oxide (ITO), indium zinc oxide (IZO), indium gallium zinc oxide (IGZO), zinc oxide (ZnO), indium oxide ($In_2O_3$) and aluminum-doped zinc oxide (AZO). For example, the first electrode AE may include a stacked structure of ITO/Ag/ITO.

In this embodiment, the first electrode AE may be an anode of the normal light emitting element ED1_1. The first electrode AE of FIG. 7 may correspond to the first electrode AE of FIG. 6B. For example, the first electrode AE may be connected with the first power line VDL (refer to FIG. 2A) and may receive the first power supply voltage VDD (refer to FIG. 2A). The first electrode AE may be connected with the first power line VDL (refer to FIG. 2A) in the display region DA (refer to FIG. 3) and may be connected with the first power line VDL (refer to FIG. 2A) in the non-display region NDA (refer to FIG. 3). In the latter case, the first power line VDL (refer to FIG. 2A) may be disposed in the non-display region NDA (refer to FIG. 3), and the first electrode AE may have a shape extending to the non-display region NDA (refer to FIG. 3).

The intermediate layer ML may be disposed between the first electrode AE and the second electrode CE1. In this embodiment, the intermediate layer ML may include an emissive layer EML and a functional layer FNL. However, this is illustrative, and the normal light emitting element ED1_1 may include intermediate layers ML having various structures and is not limited to any one embodiment. For example, the functional layer FNL may include multiple layers, or may include two or more layers spaced apart from each other with the emissive layer EML therebetween. In another embodiment, the functional layer FNL may be omitted.

The emissive layer EML may emit light by absorbing energy corresponding to a potential difference between the first electrode AE and the second electrode CE1. The emissive layer EML is illustrated as including an organic light emitting material. However, without being limited thereto, the emissive layer EML may include an inorganic light emitting material, or may be implemented with a mixed layer of an organic light emitting material and an inorganic light emitting material.

The emissive layer EML may be disposed to overlap the normal light emitting opening OP1-E. In this embodiment, the emissive layer EML may be separately formed for each of the pixels. In a case in which the emissive layer EML is separately formed for each of the normal light emitting parts EP1, EP2, and EP3 (refer to FIG. 6A), the emissive layer EML may emit at least one of blue light, red light, and green light. However, without being limited thereto, the emissive layer EML may have an integrated shape commonly provided for the adjacent normal light emitting parts EP1, EP2, and EP3 (refer to FIG. 6A). The emissive layer EML may provide blue light or white light. The emissive layer EML may have the same shape as the functional layer FNL and may be provided as an intermediate layer ML having an integrated shape without a limitation in a layer boundary with the functional layer FNL.

The functional layer FNL may be disposed between the first electrode AE and the second electrode CE1. Specifically, the functional layer FNL may be disposed between the first electrode AE and the emissive layer EML, or may be disposed between the second electrode CE1 and the emissive layer EML. In another embodiment, the functional layer FNL may be disposed between the first electrode AE and the emissive layer EML and between the second electrode CE1 and the emissive layer EML. In this embodiment, the emissive layer EML is illustrated as being inserted into the functional layer FNL. However, this is illustrative, and the functional layer FNL may include a layer disposed between the emissive layer EML and the first electrode AE and/or a layer disposed between the emissive layer EML and the second electrode CE1 and is not limited to any one embodiment.

The functional layer FNL may control the movement of charges. The functional layer FNL may include a hole injection/transport material and/or an electron injection/transport material. The functional layer FNL may include at least one of an electron blocking layer, a hole transport layer, a hole injection layer, a hole blocking layer, an electron transport layer, an electron injection layer, and a charge generating layer.

The second electrode CE1 may be disposed on the intermediate layer ML. The second electrode CE1 may be a cathode of the normal light emitting element ED1_1. The second electrode CE1 in FIG. 7 may correspond to one of the second electrodes CE1, CE2, and CE3 in FIG. 6A. As described above, the second electrode CE1 is connected with the pixel driver (refer to PC of FIG. 2A or PC-1 of FIG. 2B) through one node (refer to N4 of FIG. 2A or N2 of FIG. 2B). In this embodiment, the second electrode CE1 may be electrically connected with the connection transistor TR through the normal connecting wire CW1.

Each of the intermediate layer ML and the second electrode CE1 may be commonly formed for the pixels PXij (refer to FIG. 1) using an open mask. The intermediate layer ML and the second electrode CE1 may be divided for the respective pixels through the separator SPR. The separator SPR may have a closed-line shape for each of the normal light emitting parts EP1, EP2, and EP3 (refer to FIG. 6A)

such that the normal light emitting parts EP1, EP2, and EP3 (refer to FIG. 6A) are independent. Accordingly, the second electrode CE1 may have a shape that is divided for the respective normal light emitting parts EP1, EP2, and EP3 (refer to FIG. 6A). For example, the second electrode CE1 may be electrically independent for each of the adjacent pixels PXij (refer to FIG. 1).

The separator SPR may be disposed on the pixel defining layer PDL. The second electrode CE1 may be commonly formed for the pixels by using an open mask. The second electrode CE1 may be divided for the respective pixels by the separator SPR. The separator SPR may have a shape in which the width is decreased from top to bottom. Accordingly, even though there is no separate patterning process through a mask, the second electrode CE1 may not be formed, or may be formed to be thin, on the side surface of the separator SPR in a process of forming the second electrode CE1, and the second electrode CE1 may be readily disconnected for each pixel. However, this is illustrative, and as long as the second electrode CE1 is able to be disconnected, the shape of the separator SPR may be diversely changed and is not limited to any one embodiment.

Dividing patterns UP1 and UP2 may be disposed on the separator SPR. The dividing patterns UP1 and UP2 may include the first dividing pattern UP1 and the second dividing pattern UP2.

The first dividing pattern UP1 may include the same material as the intermediate layer ML. For example, the first dividing pattern UP1 may correspond to a remaining substance separated from the intermediate layer ML by the separator SPR in case that the intermediate layer ML is commonly formed. According to an embodiment, in case that the intermediate layer ML is commonly formed, the intermediate layer ML may not be separated on the separator SPR. A separate first dividing pattern may not be disposed on the separator SPR, and the intermediate layer ML may be disposed thereon.

The second dividing pattern UP2 may include the same material as the second electrode CE1. For example, the second dividing pattern UP2 may correspond to a remaining substance separated from the second electrode CE1 by the separator SPR in case that the second electrode CE1 is commonly formed. Accordingly, the first and second dividing patterns UP1 and UP2 and the separator SPR may have substantially the same shape in plan view. According to an embodiment of the disclosure, the first and second dividing patterns UP1 and UP2 may be omitted.

An encapsulation layer ECL may be disposed on the pixel defining layer DPL and may cover the separator SPR. The encapsulation layer ECL may include a first inorganic layer IL1, an organic layer OL, and a second inorganic layer IL2 that are stacked on each other. However, without being limited thereto, the encapsulation layer ECL may further include multiple inorganic layers and organic layers.

The first and second inorganic layers IL1 and IL2 may protect the light emitting element layer LDL from moisture and oxygen, and the organic layer OL may protect the light emitting element layer LDL from foreign matter such as dust particles. The first and second inorganic layers IL1 and IL2 may include a silicon nitride layer, a silicon oxy-nitride layer, a silicon oxide layer, a titanium oxide layer, and/or an aluminum oxide layer. The organic layer OL may include an acrylate-based organic layer, but is not limited thereto.

The sensing layer ISL may sense an external input. In this embodiment, the sensing layer ISL may be formed on the encapsulation layer ECL through a continuous process. The sensing layer ISL may be directly disposed on the encapsulation layer ECL. The expression "directly disposed" may mean that another component is not disposed between the sensing layer ISL and the encapsulation layer ECL. For example, a separate adhesive member may not be disposed between the sensing layer ISL and the encapsulation layer ECL. However, this is illustrative, and in the display panel DP according to an embodiment of the disclosure, the sensing layer ISL may be separately formed and provided or may be coupled with the encapsulation layer ECL through an adhesive member and is not limited to any one embodiment.

The sensing layer ISL may include multiple conductive layers MTL1 and MTL2 and multiple insulating layers 71, 72, and 73. The insulating layers 71, 72, and 73 may include the first to third sensing insulation layers 71, 72, and 73. However, this is illustrative, and the number of insulating layers constituting the insulating layer 71, 72, and 73 is not limited to any one embodiment.

The first sensing insulation layer 71 may be an inorganic layer including at least one of silicon nitride, silicon oxynitride, and silicon oxide. In another embodiment, the first sensing insulation layer 71 may be an organic layer including an epoxy-based resin, an acrylic-based resin, and/or an imide-based resin. The first sensing insulation layer 71 may have a single-layer structure, or may have a multi-layer structure stacked in the third direction DR3.

The conductive layers MTL1 and MTL2 may include the first conductive layer MTL1 and the second conductive layer MTL2. The first conductive layer MTL1 may be disposed between the first sensing insulation layer 71 and the second sensing insulation layer 72, and the second conductive layer MTL2 may be disposed between the second sensing insulation layer 72 and the third sensing insulation layer 73. A portion of the second conductive layer MTL2 may be connected with the first conductive layer MTL1 through a contact hole CNT-I formed in the second sensing insulation layer 72. Each of the conductive layers MTL1 and MTL2 may have a single-layer structure, or may have a multi-layer structure stacked in the third direction DR3.

The conductive layer having a single-layer structure may include a metal layer or a transparent conductive layer. The metal layer may include molybdenum, silver, titanium, copper, aluminum, and/or an alloy thereof. The transparent conductive layer may include transparent conductive oxide such as indium tin oxide (ITO), indium zinc oxide (IZO), zinc oxide (ZnO), and/or indium zinc tin oxide (IZTO). The transparent conductive layer may include a conductive polymer such as PEDOT, a metal nano wire, or graphene.

The conductive layer having a multi-layer structure may include metal layers. The metal layers may have, for example, a three-layer structure of titanium/aluminum/titanium. The conductive layer having a multi-layer structure may include at least one metal layer and at least one transparent conductive layer.

In the sensing layer ISL, the first conductive layer MTL1 and the second conductive layer MTL2 may configure a sensor for sensing an external input. The sensor may be driven by a capacitive method and may be driven by one of a mutual-cap method or a self-cap method. However, this is illustrative, and the sensor may be driven by a resistive method, an ultrasonic method, or an infrared method in addition to the capacitive method and is not limited to any one embodiment.

The first conductive layer MTL1 and the second conductive layer MTL2 may include transparent conductive oxide and may have a metal mesh shape formed of an opaque conductive material. As long as the visibility of an image displayed by light generated by the light emitting element layer LDL is not deteriorated, the first conductive layer MTL1 and the second conductive layer MTL2 may have various materials and various shapes and are not limited to any one embodiment.

The third sensing insulation layer 73 may include an inorganic film. The inorganic film may include at least one of aluminum oxide, titanium oxide, silicon oxide, silicon nitride, silicon oxy-nitride, zirconium oxide, and hafnium oxide.

In another embodiment, the third sensing insulation layer 73 may include an organic film. The organic film may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

Figure 8A:
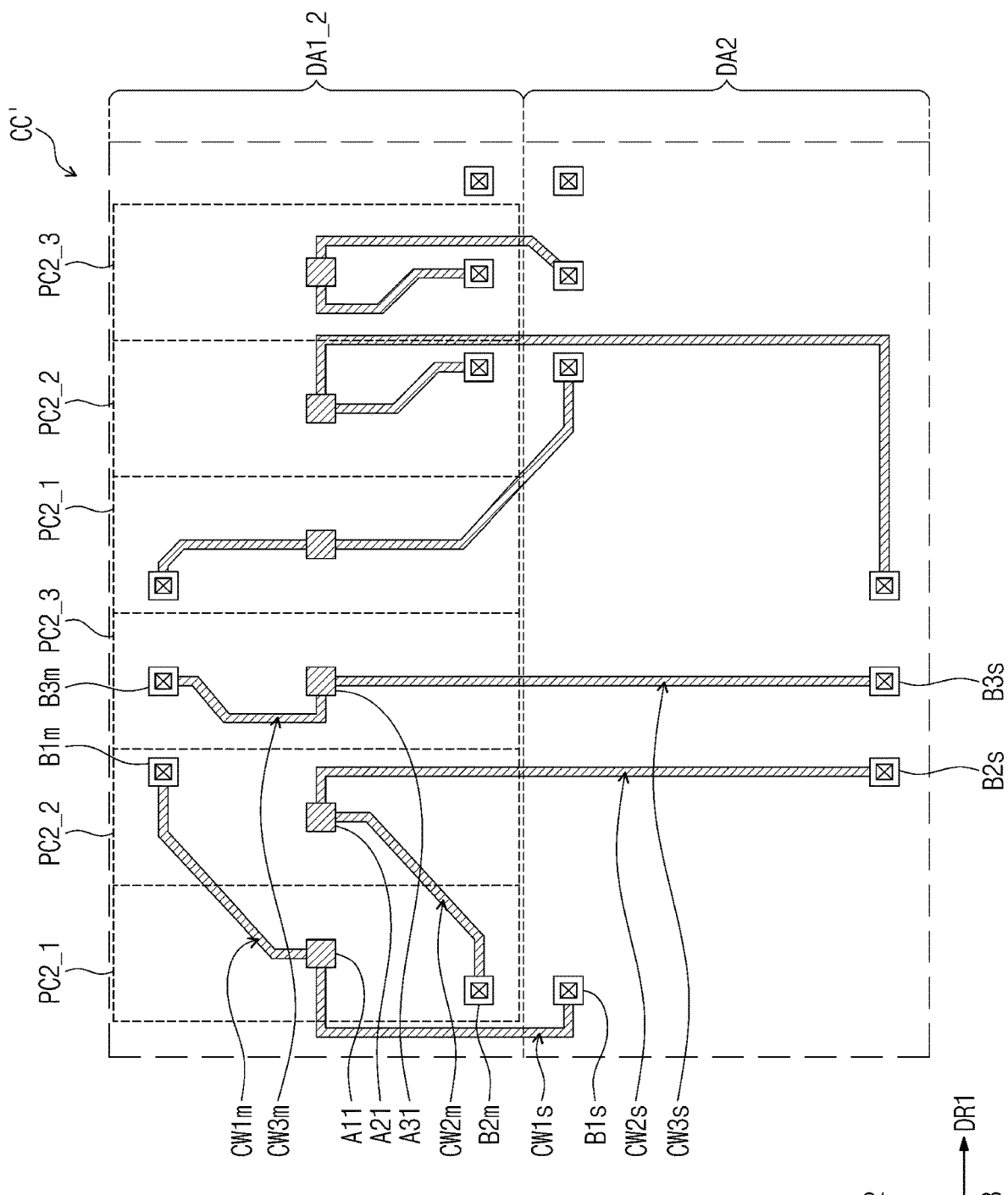
FIGS. 8A and 8B are enlarged schematic plan views of region CC' in FIG. 4A according to an embodiment of the disclosure.
Figure 8B:
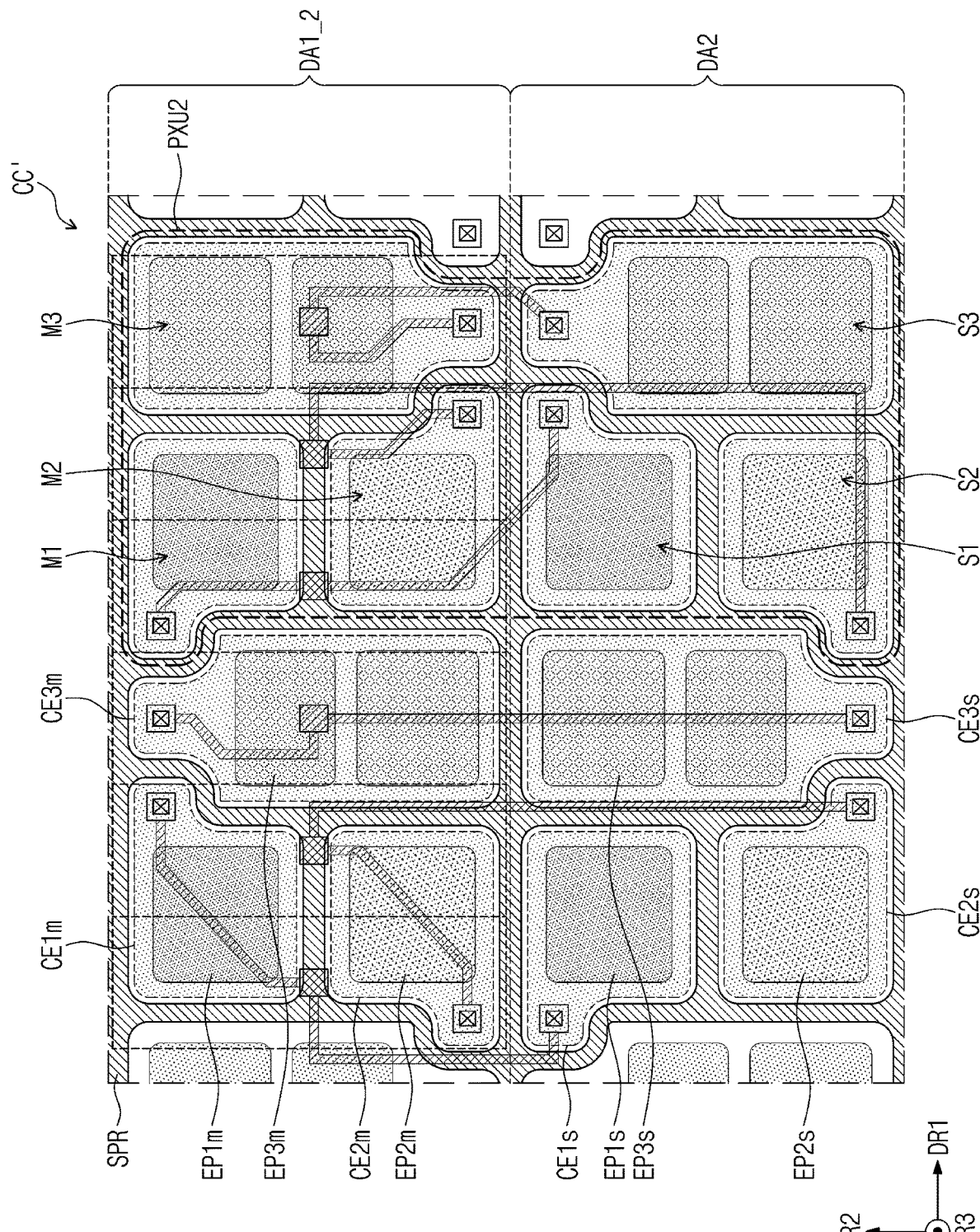
Figure 9A:
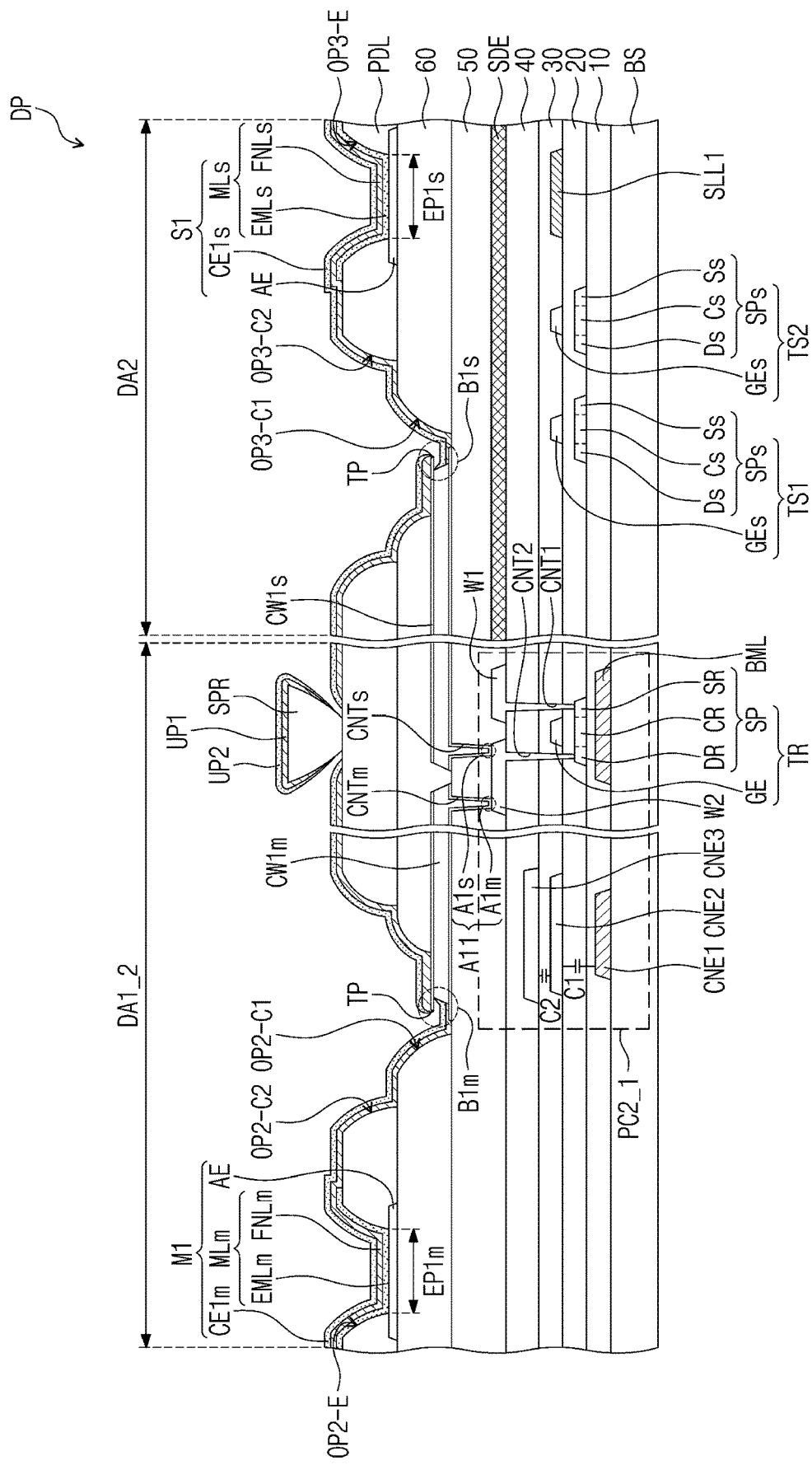
FIGS. 9A and 9B are enlarged schematic sectional views of a partial region of the display panel according to an embodiment of the disclosure.
Figure 9B:
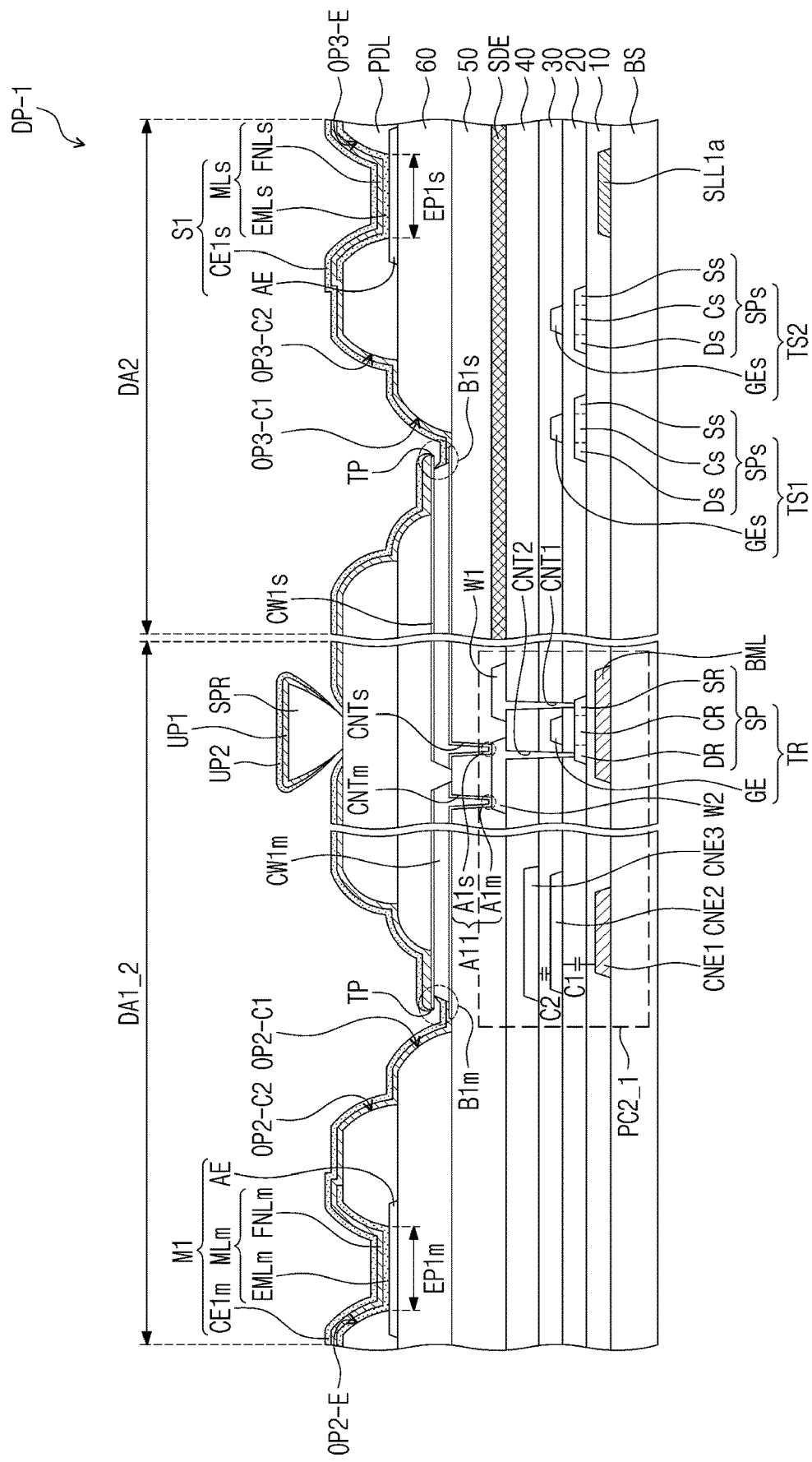

FIGS. 8A and 8B are enlarged schematic plan views of region CC' in FIG. 4A according to an embodiment of the disclosure. FIGS. 9A and 9B are enlarged sectional views of a partial region of the display panel according to an embodiment of the disclosure.

FIGS. 8A and 8B illustrate extended pixel units PXU2 at the first row and second column. For convenience of description, only extended pixel drivers PC2_1, PC2_2, and PC2_3 of the extended pixel units PXU2 and connecting wires CW1m, CW2m, CW3m, CW1s, CW2s, and CW3s connected thereto are illustrated in FIG. 8A, and reference numerals of the extended pixel drivers PC2_1, PC2_2, and PC2_3 and the connecting wires CW1m, CW2m, CW3m, CW1s, CW2s, and CW3s are omitted in FIG. 8B.

Referring to FIGS. 8A and 8B, the first to third extended pixel drivers PC2_1, PC2_2, and PC2_3 according to this embodiment may be disposed in the same arrangement as the first to third normal pixel drivers PC1_1, PC1_2, and PC1_3 (refer to FIG. 6A).

First to third main light emitting elements M1, M2, and M3 may be disposed in the same arrangement as the first to third normal light emitting elements ED1_1, ED1_2, and ED1_3 (refer to FIG. 6A) disposed in one row (hereinafter, referred to as the k-th row (k being a natural number except zero)).

First to third sub-light emitting elements S1, S2, and S3 may be disposed in the same arrangement as the first to third normal light emitting elements ED1_1, ED1_2, and ED1_3 (refer to FIG. 6A) disposed in the (k+1)th row.

Each of the first to third main light emitting elements M1, M2, and M3 and the first to third sub-light emitting elements S1, S2, and S3 may include a first electrode AE (refer to FIG. 6B), a second electrode CE1m, CE2m, CE3m, CE1s, CE2s, or CE3s, and an intermediate layer disposed between the first electrode AE (refer to FIG. 6B) and the second electrode CE1m, CE2m, CE3m, CE1s, CE2s, or CE3s. The second electrodes CE1m, CE2m, and CE3m of the first to third main light emitting elements M1, M2, and M3 and the second electrodes CE1s, CE2s, and CE3s of the first to third sub-light emitting elements S1, S2, and S3 may be separated by the separator SPR.

In this specification, main light emitting parts EP1m, EP2m, and EP3m may be regions where light provided by the main light emitting elements M1, M2, and M3 is displayed and may correspond to units constituting an image displayed on the display panel DP (refer to FIG. 1). The first to third main light emitting parts EP1m, EP2m, and EP3m may be disposed in the same arrangement as the first to third normal light emitting parts EP1, EP2, and EP3 (refer to FIG. 6A) disposed in the k-th row.

In this specification, sub-light emitting parts EP1s, EP2s, and EP3s may be regions where light provided by the sub-light emitting elements S1, S2, and S3 is displayed and may correspond to units constituting an image displayed on the display panel DP (refer to FIG. 1). The first to third sub-light emitting parts EP1s, EP2s, and EP3s may be disposed in the same arrangement as the first to third normal light emitting parts EP1, EP2, and EP3 (refer to FIG. 6A) disposed in the (k+1)th row.

The first to third main light emitting elements M1, M2, and M3 may be connected to the first to third extended pixel drivers PC2_1, PC2_2, and PC2_3 through the main connecting wires CW1m, CW2m, and CW3m, respectively.

The main connecting wires CW1m, CW2m, and CW3m may include the first main connecting wire CW1m connecting the first main light emitting element M1 and the first extended pixel driver PC2_1, the second main connecting wire CW2m connecting the second main light emitting element M2 and the second extended pixel driver PC2_2, and the third main connecting wire CW3m connecting the third main light emitting element M3 and the third extended pixel driver PC2_3.

Each of the first to third main connecting wires CW1m, CW2m, and CW3m may include an extended driving connection A11, A21, or A31 connected to a corresponding extended pixel driver among the first to third extended pixel drivers PC2_1, PC2_2, and PC2_3 and a main light emitting connection B1m, B2m, or B3m connected to a corresponding main light emitting element among the first to third main light emitting elements M1, M2, and M3.

The first main connecting wire CW1m may include the first extended driving connection A11 and the first main light emitting connection B1m, the second main connecting wire CW2m may include the second extended driving connection A21 and the second main light emitting connection B2m, and the third main connecting wire CW3m may include the third extended driving connection A31 and the third main light emitting connection B3m.

The first to third sub-light emitting elements S1, S2, and S3 may be connected to the first to third extended pixel drivers PC2_1, PC2_2, and PC2_3 through the sub-connecting wires CW1s, CW2s, and CW3s, respectively. The sub-connecting wires CW1s, CW2s, and CW3s may include the first sub-connecting wire CW1s connecting the first sub-light emitting element S1 and the first extended pixel driver PC2_1, the second sub-connecting wire CW2s connecting the second sub-light emitting element S2 and the second extended pixel driver PC2_2, and the third sub-connecting wire CW3s connecting the third sub-light emitting element S3 and the third extended pixel driver PC2_3.

Each of the first to third sub-connecting wires CW1s, CW2s, and CW3s may include an extended driving connection A11, A21, or A31 connected to a corresponding extended pixel driver among the first to third extended pixel drivers PC2_1, PC2_2, and PC2_3 and a sub-light emitting connection B1s, B2s, or B3s connected to a corresponding sub-light emitting element among the first to third sub-light emitting elements S1, S2, and S3.

The first sub-connecting wire CW1s may include the first extended driving connection A11 and the first sub-light emitting connection B1s, the second sub-connecting wire CW2s may include the second extended driving connection A21 and the second sub-light emitting connection B2s, and the third sub-connecting wire CW3s may include the third extended driving connection A31 and the third sub-light emitting connection B3s.

The first to third extended driving connections A11, A21, and A31 may be disposed in the outer display region DA1_2 and may overlap the first to third extended pixel drivers PC2_1, PC2_2, and PC2_3. Similarly to the first to third normal driving connections A1, A2, and A3, the first to third extended driving connections A11, A21, and A31 may be connected to the drain of the sixth transistor T6 illustrated in FIG. 2A or the drain of the first transistor T1 illustrated in FIG. 2B.

The first extended driving connection A11 may include a main driving connection A1m (refer to FIG. 9A) of the first main connecting wire CW1m and a sub-driving connection A1s (refer to FIG. 9A) of the first sub-connecting wire CW1s that will be described below. In FIG. 8A, the main driving connection A1m (refer to FIG. 9A) and the sub-driving connection A1s (refer to FIG. 9A) are illustrated as forming the same connection. However, in practice, this means that the main driving connection A1m (refer to FIG. 9A) and the sub-driving connection A1s (refer to FIG. 9A) are spaced apart from each other, but connected to the same transistor in the first extended pixel driver PC2_1. Description thereabout is also similarly applied to the second and third extended driving connections A21 and A31.

In this specification, one of the first to third sub-connecting wires CW1s, CW2s, and CW3s may be referred to as a "first connecting wire", one of the sub-driving connections A1s (refer to FIG. 9A) of the first to third sub-connecting wires CW1s, CW2s, and CW3s may be referred to as a "first connection", and one of the first to third sub-light emitting connections B1s, B2s, and B3s may be referred to as a "second connection". One of the first to third main connecting wires CW1m, CW2m, and CW3m may be referred to as a "second connecting wire", one of the main driving connections A1m (refer to FIG. 9A) of the first to third main connecting wires CW1m, CW2m, and CW3m may be referred to as a "third connection", and one of the first to third main light emitting connections B1m, B2m, and B3m may be referred to as a "fourth connection".

The first sub-light emitting connection Bis may not overlap the first to third extended pixel drivers PC2_1, PC2_2, and PC2_3. The first sub-light emitting connection Bis may be spaced apart from the first sub-light emitting part EP1s in the first direction DR1.

The second sub-light emitting connection B2s may not overlap the first to third extended pixel drivers PC2_1, PC2_2, and PC2_3. The second sub-light emitting connection B2s may be spaced apart from the second sub-light emitting part EP2s in the first direction DR1.

The third sub-light emitting connection B3s may not overlap the first to third extended pixel drivers PC2_1, PC2_2, and PC2_3. The third sub-light emitting connection B3s may be spaced apart from the third sub-light emitting part EP3s in the second direction DR2.

In an embodiment, the first to third main connecting wires CW1m, CW2m, and CW3m and the first to third sub-connecting wires CW1s, CW2s, and CW3s may be spaced apart from each other in plan view. For example, the shapes of the first to third main connecting wires CW1m, CW2m, and CW3m and the first to third sub-connecting wires CW1s, CW2s, and CW3s are not limited to those illustrated in FIGS. 8A and 8B and may be designed without limitation as long as there are no portions in contact with each other.

FIGS. 9A and 9B are enlarged schematic sectional views of partial regions of the first main light emitting element M1 and the first sub-light emitting element S1. Referring to FIG. 9A, the display panel DP according to an embodiment of the disclosure may include the base layer BS, the insulating layers 10, 20, 30, 40, 50, and 60, the pixel defining layer PDL, and separator SPR disposed on the base layer BS, and multiple conductive patterns and semiconductor patterns disposed between the insulating layers 10, 20, 30, 40, 50, and 60, the pixel defining layer PDL, and separator SPR.

In the outer display region DA1_2, the conductive patterns and the semiconductor patterns may constitute the first to third extended pixel drivers PC2_1, PC2_2, and PC2_3 (refer to FIG. 8A), the first to third main connecting wires CW1m, CW2m, and CW3m (refer to FIG. 8A), a portion of each of the first to third sub-connecting wires CW1s, CW2s, and CW3s (refer to FIG. 8A), and the first to third main light emitting elements M1, M2, and M3 (refer to FIG. 8B).

In the second display region DA2, the conductive patterns and the semiconductor patterns may constitute the DEMUX circuits MX (refer to FIG. 5A), the signal selection lines SLL1 to SLL3 (refer to FIG. 5A), a shielding electrode SDE, the remaining portion of each of the first to third sub-connecting wires CW1s, CW2s, and CW3s (refer to FIG. 8A), and the first to third sub-light emitting elements S1, S2, and S3 (refer to FIG. 8B).

For ease of description, the first main light emitting element M1, some components of the first extended pixel driver PC2_1, the first main connecting wire CW1m (hereinafter, referred to as the main connecting wire) electrically connecting the first main light emitting element M1 (hereinafter, referred to as the main light emitting element) and the first extended pixel driver PC2_1, the first sub-light emitting element S1, and the first sub-connecting wire CW1s (hereinafter, referred to as the sub-connecting wire) electrically connecting the first sub-light emitting element S1 (hereinafter, referred to as the sub-light emitting element) and the first extended pixel driver PC2_1 (hereinafter, referred to as the extended pixel driver) are illustrated in FIGS. 9A and 9B.

The above description of FIG. 7 may be similarly applied to the base layer BS and the insulating layers 10, 20, 30, 40, 50, and 60, the pixel defining layer PDL, and the separator SPR. FIG. 9A illustrates a connection transistor TR of the extended pixel driver PC2_1, and a source electrode pattern W1, a drain electrode pattern W2, and capacitors C1 and C2 that are connected to the connection transistor TR. The descriptions of the connection transistor TR, the source electrode pattern W1, the drain electrode pattern W2, and the capacitors C1 and C2 of the normal pixel driver PC1_1 in FIG. 7 may be similarly applied.

The main connecting wire CW1m may connect the extended pixel driver PC2_1 and the main light emitting element M1. In this embodiment, the main connecting wire CW1m may be disposed between the fifth and sixth insulating layers 50 and 60. The main connecting wire CW1m may be connected to the drain electrode pattern W2 through a main contact hole CNTm penetrating the fifth insulating layer 50 and may be electrically connected to a drain region DR. The point at which the main connecting wire CW1m is connected to the connection transistor TR is represented by the main driving connection A1m.

One end portion of the main connecting wire CW1m where a tip portion TP is defined may be exposed by a first main contact opening OP2-C1 of the sixth insulating layer 60 and a second main contact opening OP2-C2 of the pixel defining layer PDL. The stacked structure of the main connecting wire CW1m may be the same as the stacked structure of the normal connecting wire CW1 (refer to FIG.

7). For example, the main connecting wire CW1m may be provided in a three-layer structure that includes the first to third layers L1, L2, and L3 (refer to FIG. 7) and in which the tip portion TP is defined in the third layer L3 (refer to FIG. 7).

The main light emitting element M1 may include a first electrode AE, an intermediate layer MLm, and a second electrode CE1m, and the intermediate layer MLm of the main light emitting element M1 may include an emissive layer EMLm and a functional layer FNLm. The descriptions of the first electrode AE, the intermediate layer ML, and the second electrode CE1 of the normal light emitting element ED1_1 in FIGS. 6A, 6B, and 7 may be similarly applied to the first electrode AE, the intermediate layer MLm, and the second electrode CE1m of the main light emitting element M1. A main light emitting opening OP2-E may be further defined in the pixel defining layer PDL, and the light emitting layer EMLm of the main light emitting element M1 may be disposed to overlap the main light emitting opening OP2-E. An electron transport layer disposed between the emissive layer EMLm and the second electrode CE1m is illustrated as an example of the functional layer FNLm in FIGS. 9A and 9B. However, without being limited thereto, the functional layer FNLm may include the various examples described above with reference to FIG. 7.

A portion of the second electrode CE1m of the main light emitting element M1 may be separated from the tip portion TP of the main connecting wire CW1m and may be connected to the exposed main connecting wire CW1m in the first main contact opening OP2-C 1. The point at which the second electrode CE1m is connected to the main connecting wire CW1m is represented by the first main light emitting connection B1m described with reference to FIG. 8A.

In this embodiment, the sub-connecting wire CW1s may be disposed on the same layer as the main connecting wire CW1m. The sub-connecting wire CW1s may be disposed between the fifth and sixth insulating layers 50 and 60. The sub-connecting wire CW1s may be connected to the drain electrode pattern W2 through a sub-contact hole CNTs penetrating the fifth insulating layer 50 and may be electrically connected to the drain region DR. The point at which the sub-connecting wire CW1s is connected to the connection transistor TR is represented by the sub-driving connection A1s.

One end portion of the sub-connecting wire CW1s where a tip portion TP is defined may be exposed by a first sub-contact opening OP3-C1 of the sixth insulating layer 60 and a second sub-contact opening OP3-C2 of the pixel defining layer PDL. The stacked structure of the sub-connecting wire CW1s may be the same as the stacked structure of the normal connecting wire CW1 (refer to FIG. 7). For example, the sub-connecting wire CW1s may be provided in a three-layer structure in which the tip portion TP is defined.

The sub-light emitting element S1 may include a first electrode AE, an intermediate layer MLs, and a second electrode CE1s, and the intermediate layer MLs of the sub-light emitting element S1 may include an emissive layer EMLs and a functional layer FNLs. The descriptions of the first electrode AE, the intermediate layer ML, and the second electrode CE1 of the normal light emitting element ED1_1 in FIGS. 6A, 6B, and 7 may be similarly applied to the first electrode AE, the intermediate layer MLs, and the second electrode CE1s of the sub-light emitting element S1. A sub-light emitting opening OP3-E may be further defined in the pixel defining layer PDL, and the light emitting layer EMLs of the sub-light emitting element S1 may be disposed to overlap the sub-light emitting opening OP3-E. An electron transport layer disposed between the emissive layer EMLs and the second electrode CE1s is illustrated as an example of the functional layer FNLs in FIGS. 9A and 9B. However, without being limited thereto, the functional layer FNLs may include the various examples described above with reference to FIG. 7.

A portion of the second electrode CE1s of the sub-light emitting element S1 may be separated from the tip portion TP of the sub-connecting wire CW1s and may be connected to the exposed sub-connecting wire CW1s. The point at which the second electrode CE1s is connected to the sub-connecting wire CW1s is represented by the first sub-light emitting connection B1s described with reference to FIG. 8A.

Two switching transistors TS1 and TS2 of the DEMUX circuits MX (refer to FIG. 5A) are illustrated in FIG. 9A. Each of the switching transistors TS1 and TS2 may include a DEMUX semiconductor pattern SPs and a DEMUX gate electrode GEs. The DEMUX semiconductor pattern SPs may be disposed between the first and second insulating layers 10 and 20, and the DEMUX gate electrode GEs may be disposed between the second and third insulating layers 20 and 30. For example, the DEMUX semiconductor pattern SPs may be disposed on the same layer as a semiconductor pattern SP of the connection transistor TR, and the DEMUX gate electrode GEs may be disposed on the same layer as a gate electrode GE of the connection transistor TR. The DEMUX semiconductor pattern SPs may include a source region Ss, a drain region Ds, and a channel region Cs, and the DEMUX gate electrode GEs may overlap the channel region Cs.

One signal selection line SLL1 among the signal selection lines SLL1, SLL2, and SLL3 (refer to FIG. 5A) is illustrated in FIG. 9A. The signal selection line SLL1 may be disposed on the same layer as the DEMUX gate electrode GEs and may be integrally formed with the DEMUX gate electrode GEs. For example, the signal selection line SLL1 may be disposed between the second and third insulating layers 20 and 30 and may be disposed on the same layer as the gate electrode GE of the connection transistor TR.

In this embodiment, the shielding electrode SDE may be disposed in the second display region DA2. The shielding electrode SDE may be disposed between the signal selection line SLL1 and the sub-light emitting element S1 and between the switching transistors TS1 and TS2 and the sub-connecting wire CW1s. The shielding electrode SDE may be in a ground state or a floated state.

In this embodiment, the shielding electrode SDE may be disposed between the fourth and fifth insulating layers 40 and 50. For example, the shielding electrode SDE may be disposed on the same layer as the source electrode pattern W1 and the drain electrode pattern W2. However, without being limited thereto, the shielding electrode SDE may be disposed on the same layer as a third capacitor electrode CNE3.

As the signal selection line SLL1 repeatedly receives an activation signal, the current flowing through the signal selection line SLL1 may be repeatedly varied to cause electrical interference to the sub-connecting wire CW and the sub-light emitting element S1. However, according to this embodiment, the shielding electrode SDE may be disposed between the signal selection line SLL1 and the sub-light emitting element S1 and between the switching transistors TS1 and TS2 and the sub-connecting wire CW1s, and thus the electrical interference to the sub-connecting wire CW1s and the sub-light emitting element S1 may be minimized. Accordingly, noise in the sub-light emitting element S1 may be reduced so that the display panel DP having improved electrical reliability of the sub-light emitting element S1 may be provided.

Referring to FIG. 9B, a signal selection line SLL1a according to an embodiment of the disclosure may be disposed between the base layer BS and the first insulating layer 10. For example, the signal selection line SLL1a may be disposed on the same layer as the lower conductive layer BML. The signal selection line SLL1a may be electrically connected with the DEMUX gate electrode GEs through a separate contact hole.

In this embodiment, the signal selection line SLL1a disposed under the insulating layers 10 to 60 may be disposed farther away from the sub-connecting wire CW1s and the sub-light emitting element S1. Accordingly, an influence of electrical interference of the signal selection line SLL1a on the sub-connecting wire CW1s and the sub-light emitting element S1 may be reduced, and noise in the sub-light emitting element S1 may be reduced. Thus, a display panel DP-1 having improved electrical reliability of the sub-light emitting element S1 may be provided.

The shielding electrode SDE may be disposed between the signal selection line SLL1a and the sub-light emitting element S1 and between the switching transistors TS1 and TS2 and the sub-connecting wire CW1s. As illustrated in FIG. 9B, the shielding electrode SDE may be disposed on the same layer as the source electrode pattern W1 and the drain electrode pattern W2, or may be disposed on the same layer as the third capacitor electrode CNE3.

The positions of the switching transistors TS1 and TS2, the signal selection lines SLL1 and SLL1a, and the shielding electrode SDE are not limited to those illustrated in FIGS. 9A and 9B. As long as electrical interference by activation signals of the signal selection lines SLL1 and SLL1a is able to be blocked, the positions of the switching transistors TS1 and TS2, the signal selection lines SLL1 and SLL1a, and the shielding electrode SDE are not limited to any one embodiment.

Figure 10A:
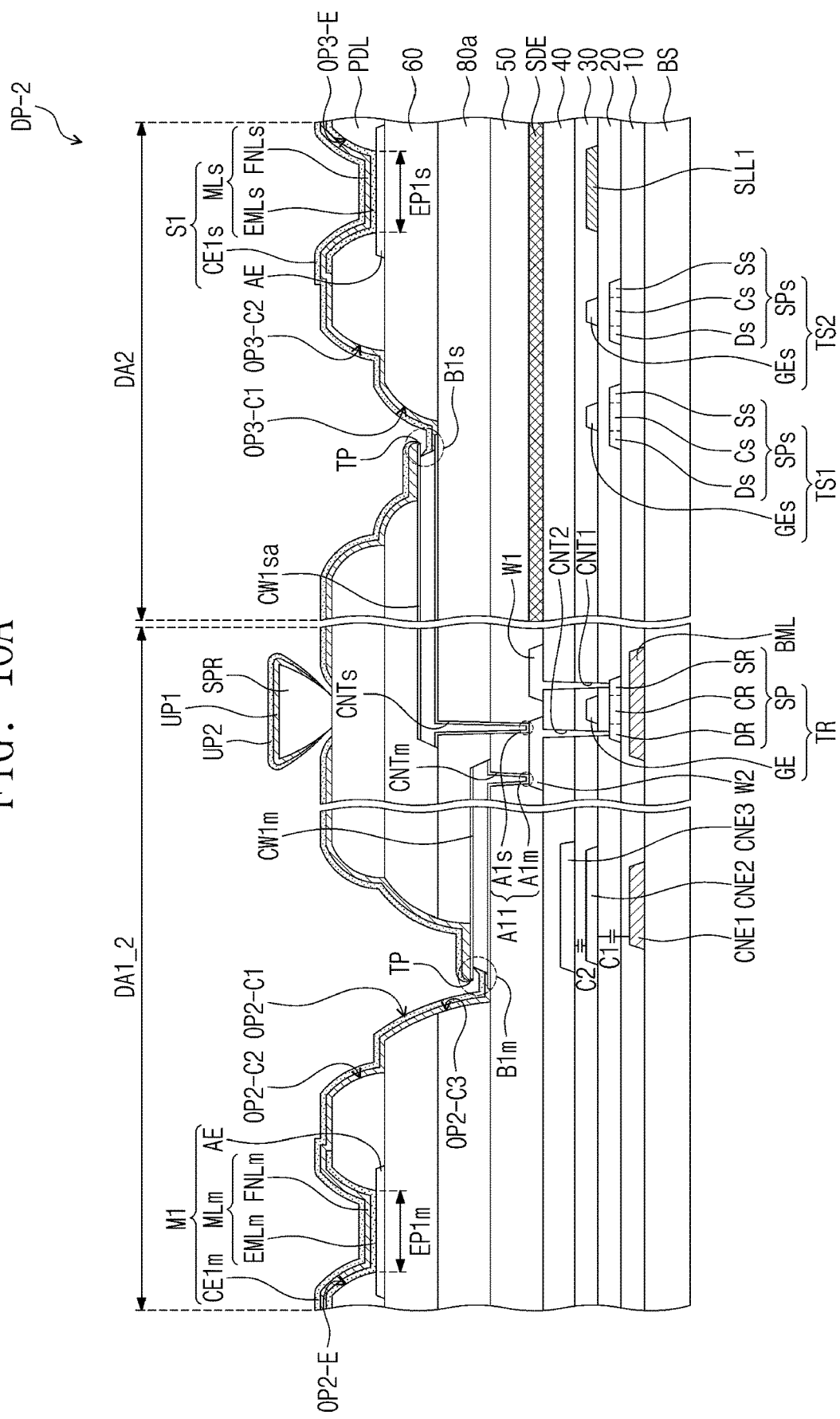
FIGS. 10A and 10B are enlarged schematic sectional views of partial regions of display panels according to embodiments of the disclosure.
Figure 10B:
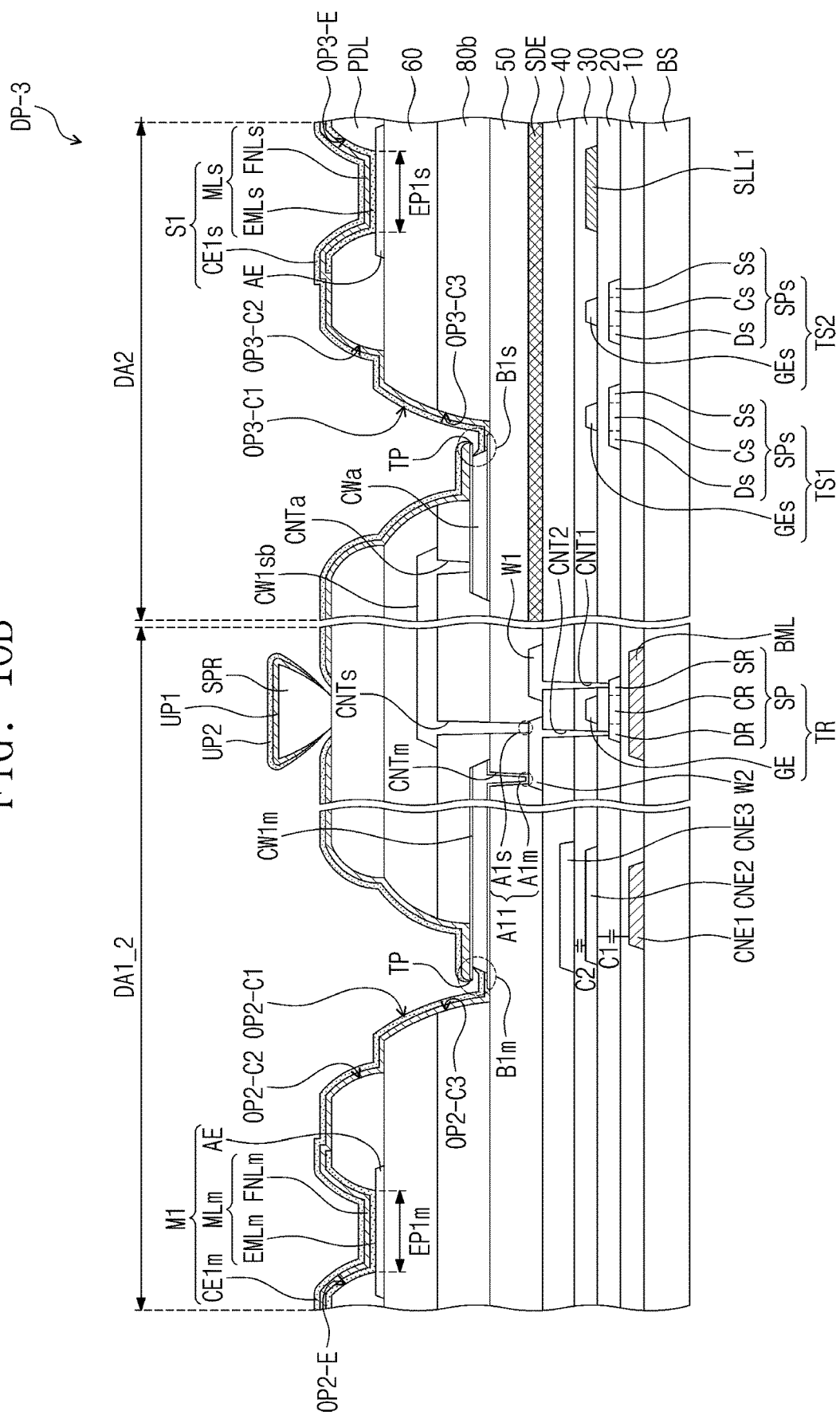

FIGS. 10A and 10B are enlarged schematic sectional views of partial regions of display panels according to embodiments of the disclosure. Components identical/similar to the components described with reference to FIGS. 8A to 9B will be assigned with identical/similar reference numerals, and repetitive descriptions will be omitted.

Referring to FIG. 10A, a display panel DP-2 according to this embodiment may further include an additional insulating layer 80a disposed between the fifth and sixth insulating layers 50 and 60. A third main contact opening OP2-C3 may be defined in the additional insulating layer 80a.

The main connecting wire CW1m may be disposed on the fifth insulating layer 50 and may be partially covered by the additional insulating layer 80a. The one end portion of the main connecting wire CW1m where the tip portion TP is defined may be exposed by the third main contact opening OP2-C3 of the additional insulating layer 80a, and the second electrode CE1m of the main light emitting element M1 may be connected with the main connecting wire CW1m in the third main contact opening OP2-C3.

A sub-connecting wire CW1sa may be disposed on the additional insulating layer 80a and may be partially covered by the sixth insulating layer 60. The sub-connecting wire CW1sa may be disposed on a layer different from that of the main connecting wire CW1m. The sub-connecting wire CW1sa may be connected with the drain electrode pattern W2 by the sub-contact hole CNTs penetrating the fifth insulating layer 50 and the additional insulating layer 80a.

One end portion of the sub-connecting wire CW1sa where a tip portion TP is defined may be exposed by the first sub-contact opening OP3-C1 of the sixth insulating layer 60, and the second electrode CE1s of the sub-light emitting element S1 may be connected with the sub-connecting wire CW1sa in the first sub-contact opening OP3-C1.

According to this embodiment, the main connecting wire CW1m and the sub-connecting wire CW1sa may be disposed in different layers, and thus the main connecting wire CW1m and the sub-connecting wire CW1sa may be electrically insulated by the additional insulating layer 80a. Accordingly, the main connecting wire CW1m and the sub-connecting wire CW1sa may be disposed to partially overlap each other in plan view, and restrictions on shape design of the connecting wires may be reduced.

Referring to FIG. 10B, a display panel DP-3 according to this embodiment may further include an additional insulating layer 80b disposed between the fifth and sixth insulating layers 50 and 60. A third main contact opening OP2-C3 and a third sub-contact opening OP3-C3 may be defined in the additional insulating layer 80b. Components identical/similar to the components described with reference to FIG. 10A will be assigned with identical/similar reference numerals, and repetitive descriptions will be omitted.

The display panel DP-3 according to this embodiment may further include an additional connecting wire CWa connected with a sub-connecting wire CW1sb. In this embodiment, the sub-connecting wire CW1sb may be disposed on the additional insulating layer 80b, and all of the sub-connecting wire CW1sb may be covered by the sixth insulating layer 60. A tip portion TP may not be defined at one end portion of the sub-connecting wire CW1sb.

In this embodiment, the sub-connecting wire CW1sb may include a metallic material or transparent conductive oxide. For example, the transparent conductive oxide may include at least one selected from the group consisting of indium tin oxide (ITO), indium zinc oxide (IZO), indium gallium zinc oxide (IGZO), zinc oxide (ZnO), indium oxide ($In_2O_3$) and aluminum-doped zinc oxide (AZO).

The sub-connecting wire CW may include a material different from that of the main connecting wire CW1m, or may have a stacked structure different from that of the main connecting wire CW1m. However, without being limited thereto, the sub-connecting wire CW1sb may include the same material as the main connecting wire CW1m and may have the same stacked structure as the main connecting wire CW1m.

The additional connecting wire CWa may be disposed in the second display region DA2. The additional connecting wire CWa may be disposed on the fifth insulating layer 50 and may be partially covered by the additional insulating layer 80b. For example, the additional connecting wire CWa may be disposed on the same layer as the main connecting wire CW1m. The additional connecting wire CWa and the sub-connecting wire CW1sb may be connected by an additional contact hole CNTa penetrating the additional insulating layer 80b.

The additional connecting wire CWa may have the same stacked structure as the main connecting wire CW1m. For example, the additional connecting wire CWa may be provided in a three-layer structure in which a tip portion TP is defined at one end portion. The one end portion of the additional connecting wire CWa where the tip portion TP is defined may be exposed by the third sub-contact opening OP3-C3 of the additional insulating layer 80b, and the second electrode CE1s of the sub-light emitting element S1 may be connected with the additional connecting wire CWa in the third sub-contact opening OP3-C3. For example, the second electrode CE1s of the sub-light emitting element S1 may be connected to a corresponding connecting wire on the same layer as the second electrode CE1m of the main light emitting element M1.

Figure 11A:
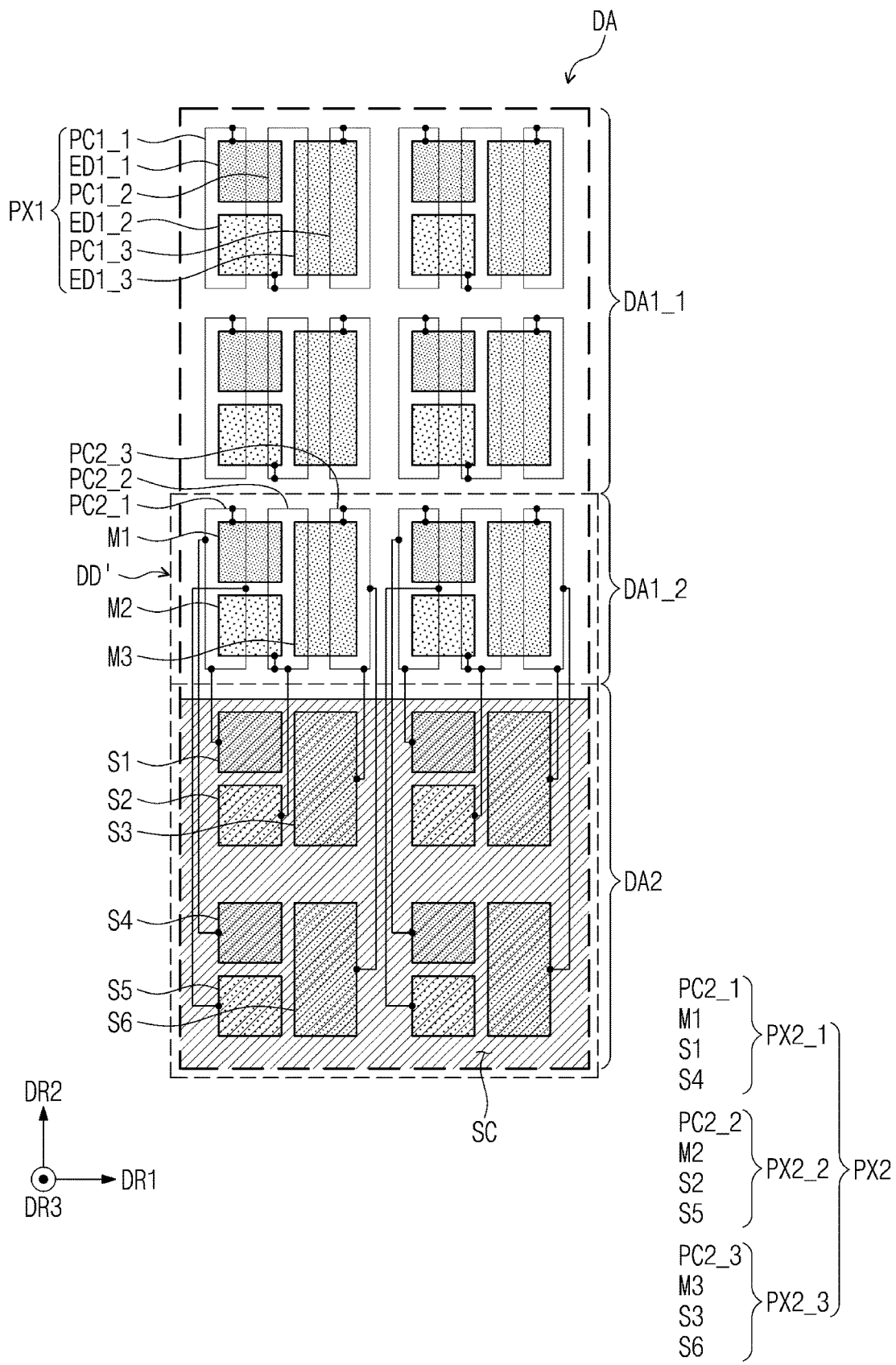
FIG. 11A is an enlarged schematic plan view of a partial region of a display panel according to an embodiment of the disclosure.
Figure 11B:
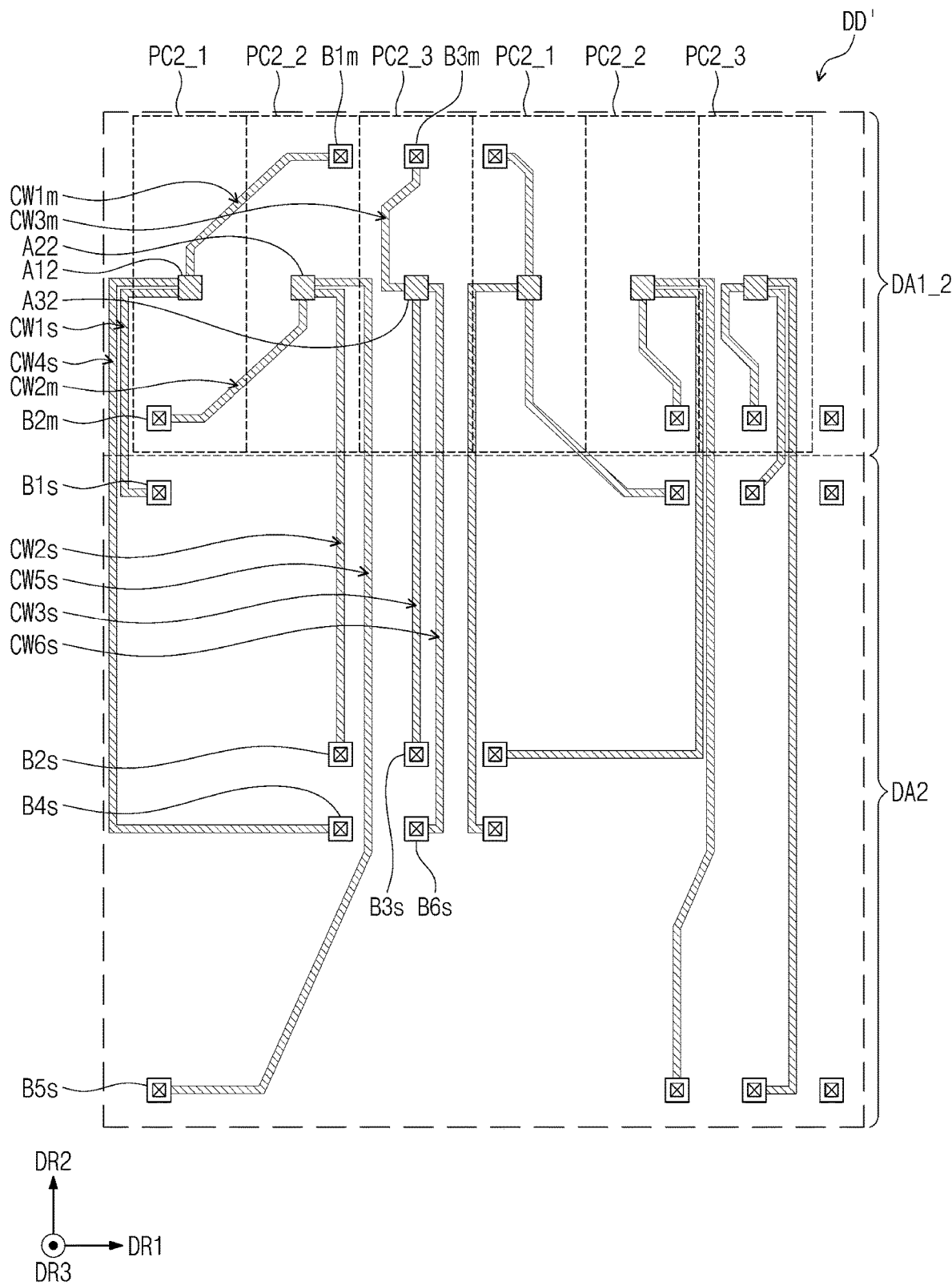
FIGS. 11B and 11C are enlarged schematic plan views of region DD' in FIG. 11A according to an embodiment of the disclosure.
Figure 11C:
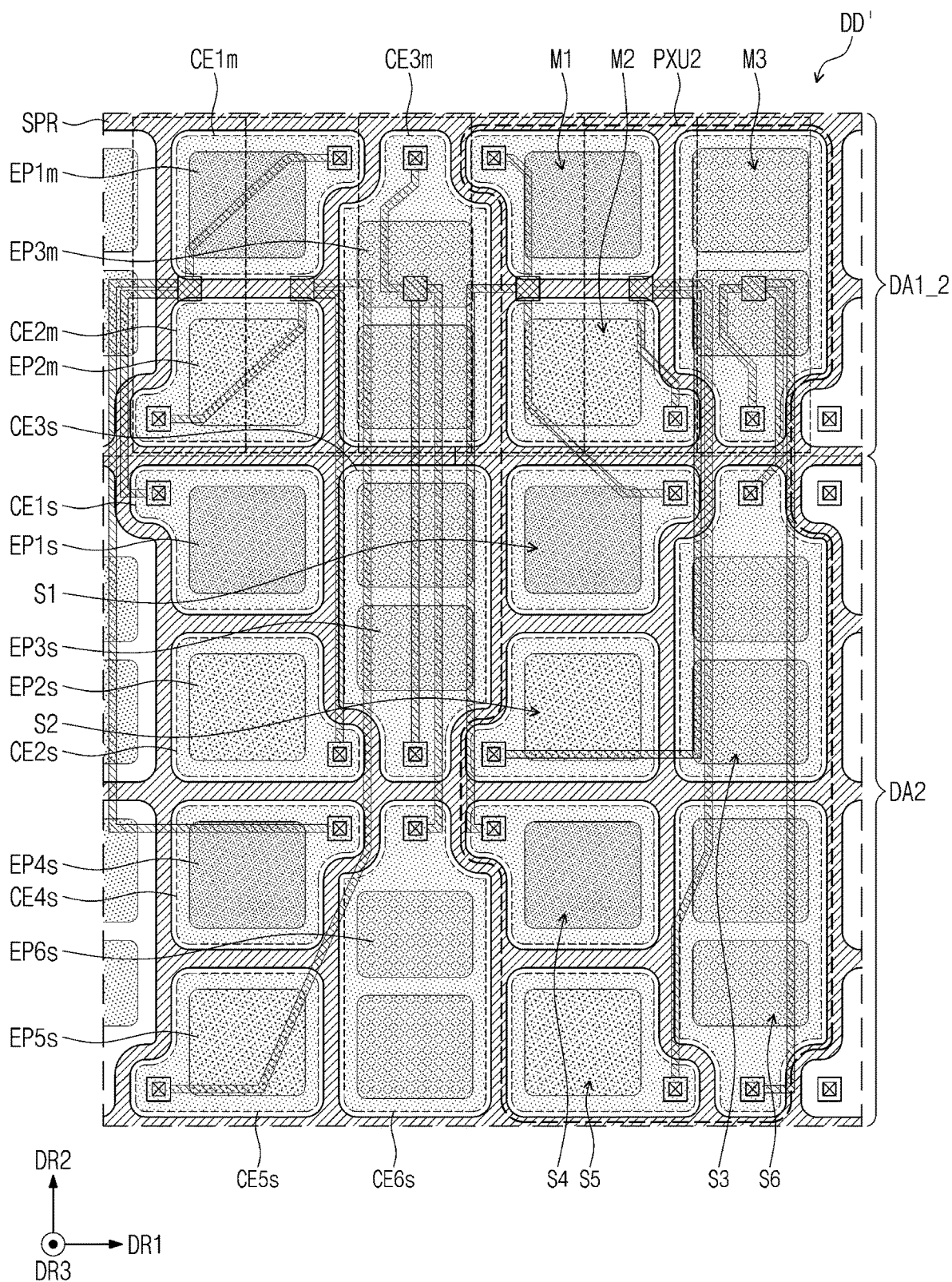

FIG. 11A is an enlarged schematic plan view of a partial region of a display panel according to an embodiment of the disclosure. FIGS. 11B and 11C are enlarged schematic plan views of region DD' in FIG. 11A according to an embodiment of the disclosure. Normal pixel units PXU1 (refer to FIG. 4A) at the second row and second column and extended pixel units PXU2 (refer to FIG. 4A) at the first row and second column are illustrated in FIG. 11A. Components identical/similar to the components described with reference to FIGS. 4A to 10B will be assigned with identical/similar reference numerals, and repetitive descriptions will be omitted.

Referring to FIG. 11A, a first extended pixel PX2_1 may include a first extended pixel driver PC2_1 and three first extended light emitting elements M1, S1, and S4. The three first extended light emitting elements M1, S1, and S4 may include the first main light emitting element M1 and two sub-light emitting elements (or copy light emitting elements) including the first sub-light emitting element S1 (or the first copy light emitting element) and the fourth sub-light emitting element S4 (or the fourth copy light emitting element). The first main light emitting element M1 may be disposed in an outer display region DA1_2, and the first and fourth sub-light emitting elements S1 and S4 may be disposed in a second display region DA2.

The first extended pixel driver PC2_1 may be commonly connected to the three first extended light emitting elements M1, S1, and S4. For example, the first extended pixel driver PC2_1 may simultaneously control driving of the three first extended light emitting elements M1, S1, and S4.

A second extended pixel PX2_2 may include a second extended pixel driver PC2_2 and three second extended light emitting elements M2, S2, and S5. The three second extended light emitting elements M2, S2, and S5 may include the second main light emitting element M2 and two sub-light emitting elements including the second sub-light emitting element S2 (or the second copy light emitting element) and the fifth sub-light emitting element S5 (or the fifth copy light emitting element). The second main light emitting element M2 may be disposed in the outer display region DA1_2, and the second and fifth sub-light emitting elements S2 and S5 may be disposed in the second display region DA2.

The second extended pixel driver PC2_2 may be commonly connected to the three second extended light emitting elements M2, S2, and S5. For example, the second extended pixel driver PC2_2 may simultaneously control driving of the three second extended light emitting elements M2, S2, and S5.

A third extended pixel PX2_3 may include a third extended pixel driver PC2_3 and three third extended light emitting elements M3, S3, and S6. The three third extended light emitting elements M3, S3, and S6 may include the third main light emitting element M3 and two sub-light emitting elements including the third sub-light emitting element S3 (or the third copy light emitting element) and the sixth sub-light emitting element S6 (or the sixth copy light emitting element). The third main light emitting element M3 may be disposed in the outer display region DA1_2, and the third and sixth sub-light emitting elements S3 and S6 may be disposed in the second display region DA2.

The third extended pixel driver PC2_3 may be commonly connected to the three third extended light emitting elements M3, S3, and S6. For example, the third extended pixel driver PC2_3 may simultaneously control driving of the three third extended light emitting elements M3, S3, and S6.

In this specification, one sub-light emitting element among the fourth to sixth sub-light emitting elements S4, S5, and S6 may be referred to as a "fourth light emitting element".

In this embodiment, the first to sixth sub-light emitting elements S1 to S6 may overlap selection circuitry SC in plan view. For example, the first to sixth sub-light emitting elements S1 to S6 may overlap, in plan view, at least one of the DEMUX circuits MX and MX1' to MX3' and the signal selection lines SLL1 to SLL3, SLL1', and SLL2' described above with reference to FIGS. 5A and 5B.

In this embodiment, multiple sub-light emitting elements may be connected to one extended pixel driver. Thus, a display region in a lower portion where the selection circuitry SC is disposed may be extended, and a dead space may be further reduced. The number of sub-light emitting elements included in each of extended light emitting elements is not limited thereto, and two or more sub-light emitting elements may be provided.

FIGS. 11B and 11C illustrate the extended pixel units PXU2 at the first row and second column. Only the extended pixel drivers PC2_1, PC2_2, and PC2_3 of the extended pixel units PXU2 and connecting wires CW1m, CW2m, CW3m, CW1s, CW2s, CW3s, CW4s, CW5s, and CW6s connected thereto are illustrated in FIG. 11B, and reference numerals of the extended pixel drivers PC2_1, PC2_2, and PC2_3 and the connecting wires CW1m, CW2m, CW3m, CW1s, CW2s, CW3s, CW4s, CW5s, and CW6s are omitted in FIG. 11C.

Referring to FIGS. 11B and 11C, the fourth to sixth sub-light emitting elements S4, S5, and S6 according to this embodiment may be disposed in the same arrangement as the first to third main light emitting elements M1, M2, and M3.

Each of the fourth to sixth sub-light emitting elements S4, S5, and S6 may include a first electrode AE (refer to FIG. 6B), a second electrode CE4s, CE5s, or CE6s, and an intermediate layer disposed between the first electrode AE (refer to FIG. 6B) and the second electrode CE4s, CE5s, or CE6s. The intermediate layer of each of the fourth to sixth sub-light emitting elements S4, S5, and S6 may include an emissive layer and a functional layer. The descriptions of the first electrode AE, the intermediate layer ML, and the second electrode CE1 of the normal light emitting element ED1 in FIGS. 6A, 6B, and 7 may be similarly applied to the first electrode AE (refer to FIG. 6B), the second electrode CE4s, CE5s, or CE6s, and the intermediate layer of each of the fourth to sixth sub-light emitting elements S4, S5, and S6. The second electrodes CE4s, CE5s, and CE6s of the fourth to sixth sub-light emitting elements S4, S5, and S6 may be separated by a separator SPR.

In this specification, fourth to sixth sub-light emitting parts EP4s, EP5s, and EP6s may be regions where light provided by the fourth to sixth sub-light emitting elements S4, S5, and S6 is displayed and may correspond to a unit constituting an image displayed on the display panel DP (refer to FIG. 1). The fourth to sixth sub-light emitting parts EP4s, EP5s, and EP6s may be disposed in the same arrangement as first to third main light emitting parts EP1m, EP2m, and EP3m. The fourth to sixth sub-light emitting parts EP4s, EP5s, and EP6s may display light having substantially the same color as the first to third main light emitting parts EP1m, EP2m, and EP3m.

The fourth to sixth sub-light emitting elements S4, S5, and S6 may be connected to the first to third extended pixel drivers PC2_1, PC2_2, and PC2_3 through the fourth to sixth sub-connecting wires CW4s, CW5s, and CW6s. The fourth sub-connecting wire CW4s may connect the first extended pixel driver PC2_1 and the fourth sub-light emitting element S4, the fifth sub-connecting wire CW5s may connect the second extended pixel driver PC2_2 and the fifth sub-light emitting element S5, and the sixth sub-connecting wire CW6s may connect the third extended pixel driver PC2_3 and the sixth sub-light emitting element S6.

In this specification, one sub-connecting wire among the fourth to sixth sub-connecting wires CW4s, CW5s, and CW6s may be referred to as a "third connecting wire".

In this embodiment, the fourth sub-connecting wire CW4s may include a fourth sub-driving connection included in a first extended driving connection A12 and a fourth sub-light emitting connection B4s, the fifth sub-connecting wire CW5s may include a fifth sub-driving connection included in a second extended driving connection A22 and a fifth sub-light emitting connection B5s, and the sixth sub-connecting wire CW6s may include a sixth sub-driving connection included in a third extended driving connection A32 and a sixth sub-light emitting connection B6s. For example, the first to third extended driving connections A12, A22, and A32 may further include the fourth to sixth sub-driving connections, respectively. Hereinafter, the fourth to sixth sub-driving connections will be assigned with the same reference numerals as those of the first to third extended driving connections A12, A22, and A32.

The fourth to sixth sub-driving connections A12, A22, and A32 may be disposed in the outer display region DA1_2 and may overlap the first to third extended pixel drivers PC2_1, PC2_2, and PC2_3. The fourth to sixth sub-driving connections A12, A22, and A32 may be connected to the drain of the sixth transistor T6 illustrated in FIG. 2A or the drain of the first transistor T1 illustrated in FIG. 2B.

The fourth sub-light emitting connection B4s may overlap the fourth sub-light emitting element S4 and may not overlap the first to third extended pixel drivers PC2_1, PC2_2, and PC2_3. The fourth sub-light emitting connection B4s may be spaced apart from the fourth sub-light emitting part EP4s in the first direction DR1.

The fifth sub-light emitting connection B5s may overlap the fifth sub-light emitting element S5 and may not overlap the first to third extended pixel drivers PC2_1, PC2_2, and PC2_3. The fifth sub-light emitting connection B5s may be spaced apart from the fifth sub-light emitting part EP5s in the first direction DR1.

The sixth sub-light emitting connection B6s may overlap the sixth sub-light emitting element S6 and may not overlap the first to third extended pixel drivers PC2_1, PC2_2, and PC2_3. The sixth sub-light emitting connection B6s may be spaced apart from the sixth sub-light emitting part EP6s in the second direction DR2.

In an embodiment, the first to third main connecting wires CW1m, CW2m, and CW3m and the first to sixth sub-connecting wires CW1s, CW2s, CW3s, CW4s, CW5s, and CW6s may all be disposed on the same layer.

For example, the first to third main connecting wires CW1m, CW2m, and CW3m and the first to sixth sub-connecting wires CW1s, CW2s, CW3s, CW4s, CW5s, and CW6s may all be disposed between the fifth and sixth insulating layers 50 and 60 (refer to FIG. 9A). The first to third main connecting wires CW1m, CW2m, and CW3m and the first to sixth sub-connecting wires CW1s, CW2s, CW3s, CW4s, CW5s, and CW6s may be spaced apart from each other in plan view.

In an embodiment of the disclosure, some of the first to third main connecting wires CW1m, CW2m, and CW3m and the first to sixth sub-connecting wires CW1s, CW2s, CW3s, CW4s, CW5s, and CW6s may be disposed in different layers.

For example, the display panels DP-2 and DP-3 (refer to FIGS. 10A and 10B) may further include the additional insulating layers 80a and 80b, respectively. Some of the first to third main connecting wires CW1m, CW2m, and CW3m and the first to sixth sub-connecting wires CW1s, CW2s, CW3s, CW4s, CW5s, and CW6s may be disposed between the fifth insulating layer 50 and the additional insulating layers 80a and 80b, and the others may be disposed between the additional insulating layers 80a and 80b and the sixth insulating layer 60.

For example, the first to third main connecting wires CW1m, CW2m, and CW3m may be disposed on the same layer, and the first to sixth sub-connecting wires CW1s, CW2s, CW3s, CW4s, CW5s, and CW6s may be disposed on the same layer, but may be disposed on a layer different from that of the first to third main connecting wires CW1m, CW2m, and CW3m. In another embodiment, the first to third sub-connecting wires CW1s, CW2s, and CW3s and the fourth to sixth sub-connecting wires CW4s, CW5s, and CW6s may be disposed on different layers.

The connecting wires disposed on the same layer may be spaced apart from each other in plan view, whereas the connecting wires disposed on the different layers may be electrically insulated by the additional insulating layers 80a or 80b. Accordingly, the connecting wires may be designed to partially overlap each other in plan view, and thus restrictions on shape design of the connecting wires may be reduced.

Figure 12:
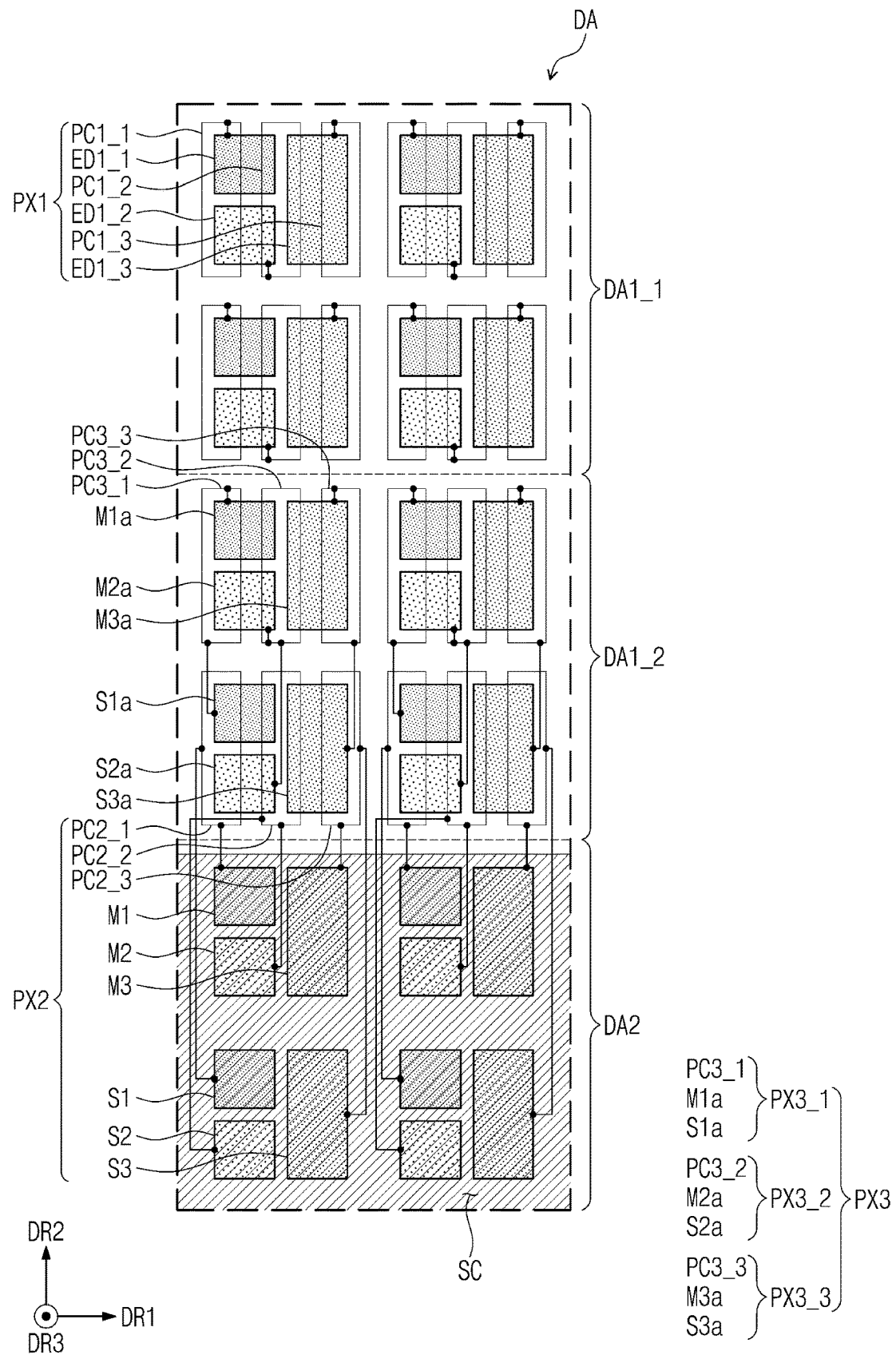
FIG. 12 is an enlarged schematic plan view of a partial region of a display panel according to an embodiment of the disclosure.

FIG. 12 is an enlarged schematic plan view of a partial region of a display panel according to an embodiment of the disclosure. Components identical/similar to the components described with reference to FIGS. 4A to 10B will be assigned with identical/similar reference numerals, and repetitive descriptions will be omitted.

Referring to FIG. 12, pixels PX (refer to FIG. 3) according to this embodiment may further include additional pixels PX3 (or third pixels). The additional pixels PX3 may be disposed between normal pixels PX1 and extended pixels PX2.

In this embodiment, the additional pixels PX3 may be disposed in an outer display region DA1_2. The additional pixels PX3 may be disposed to form an additional pixel unit, and the additional pixel unit may be constituted by one first additional pixel PX3_1, one second additional pixel PX3_2, and one third additional pixel PX3_3. However, the configuration of the additional pixel unit is not limited to any one embodiment, and in the additional pixel unit, a part of the first to third additional pixels PX3_1, PX3_2, and PX3_3 may be provided in plural.

The first additional pixel PX3_1 may include a first additional pixel driver PC3_1 and two first additional light emitting elements M1a and S1a. The two first additional light emitting elements M1a and S1a may include the first additional main light emitting element M1a and the first additional sub-light emitting element S1a (or the first additional copy light emitting element). In this embodiment, the first additional main light emitting element M1a and the first additional sub-light emitting element S1a may be disposed in the outer display region DA1_2. The first additional pixel driver PC3_1 may be commonly connected to the two first additional light emitting elements M1a and S1a.

The second additional pixel PX3_2 may include a second additional pixel driver PC3_2 and two second additional light emitting elements M2a and S2a. The two second additional light emitting elements M2a and S2a may include the second additional main light emitting element M2a and the second additional sub-light emitting element S2a (or the second additional copy light emitting element). In this embodiment, the second additional main light emitting element M2a and the second additional sub-light emitting element S2a may be disposed in the outer display region DA1_2. The second additional pixel driver PC3_2 may be commonly connected to the two second additional light emitting elements M2a and S2a.

The third additional pixel PX3_3 may include a third additional pixel driver PC3_3 and two third additional light emitting elements M3a and S3a. The two third additional light emitting elements M3a and S3a may include the third additional main light emitting element M3a and the third additional sub-light emitting element S3a (or the third additional copy light emitting element). In this embodiment, the third additional main light emitting element M3a and the third additional sub-light emitting element S3a may be disposed in the outer display region DA1_2. The third additional pixel driver PC3_3 may be commonly connected to the two third additional light emitting elements M3a and S3a.

In this specification, one of the first to third additional pixel drivers PC3_1, PC3_2, and PC3_3 may be referred to as a "third pixel driver", one of the first to third additional main light emitting elements M1a, M2a, and M3a may be referred to as a "fifth light emitting element", and one of the first to third additional sub-light emitting elements S1a, S2a, and S3a may be referred to as a "sixth light emitting element".

In this embodiment, first to third extended pixel drivers PC2_1, PC2_2, and PC2_3 of the extended pixels PX2 may be spaced apart from the first to third additional pixel drivers PC3_1, PC3_2, and PC3_3 of the additional pixels PX3 in the second direction DR2. The first to third extended pixel drivers PC2_1, PC2_2, and PC2_3 may be disposed to overlap the first to third additional sub-light emitting elements S1a, S2a, and S3a.

In this embodiment, first to third main light emitting elements M1, M2, M3 of the extended pixels PX2 may not overlap the first to third additional pixel drivers PC3_1, PC3_2, and PC3_3 and may be disposed in a second display region DA2. The first to third main light emitting elements M1, M2, and M3 may overlap selection circuitry SC. For example, in this embodiment, the first to third main light emitting elements M1, M2, and M3 and first to third sub-light emitting elements S1, S2, and S3 may all be disposed in the second display region DA2 and may overlap at least a part of DEMUX circuits MX and MX1' to MX3' (refer to FIGS. 5A and 5B) and signal selection lines SLL1 to SLL3, SLL1', and SLL2' (refer to FIGS. 5A and 5B) included in the selection circuitry SC.

Figure 13A:
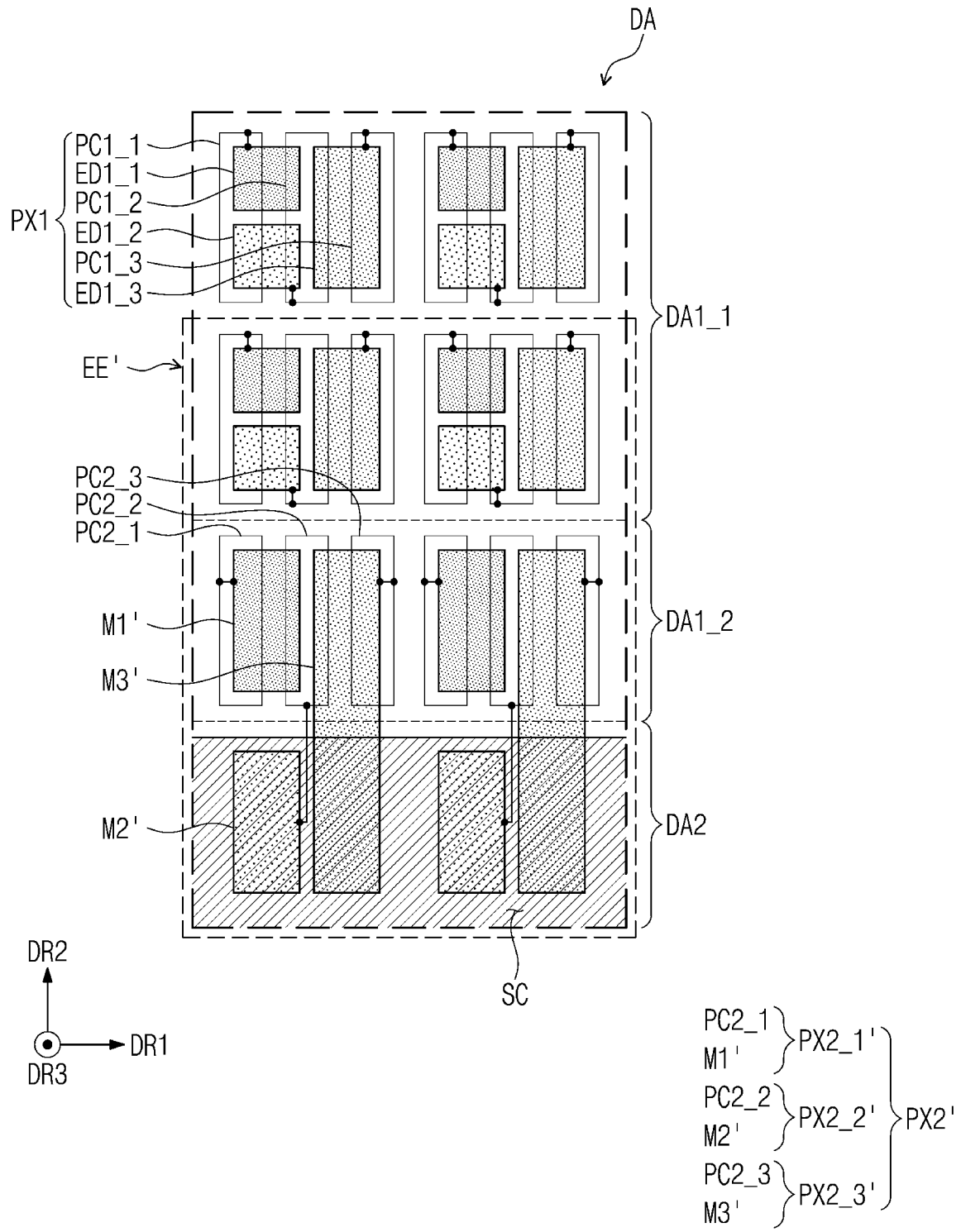
FIG. 13A is an enlarged schematic plan view of a partial region of a display panel according to an embodiment of the disclosure.
Figure 13B:
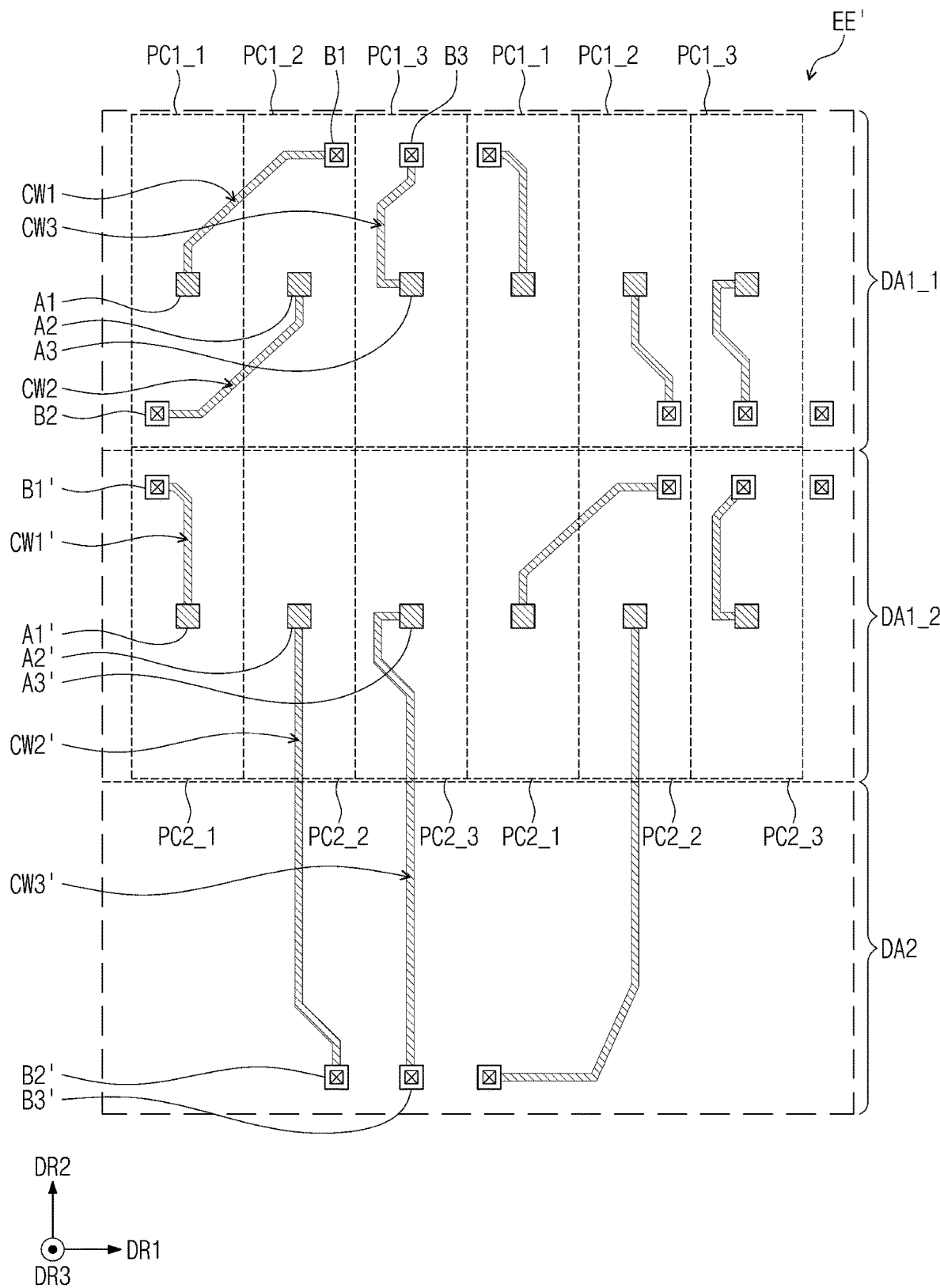
FIGS. 13B and 13C are enlarged schematic plan views of region EE' in FIG. 13A according to an embodiment of the disclosure.
Figure 13C:
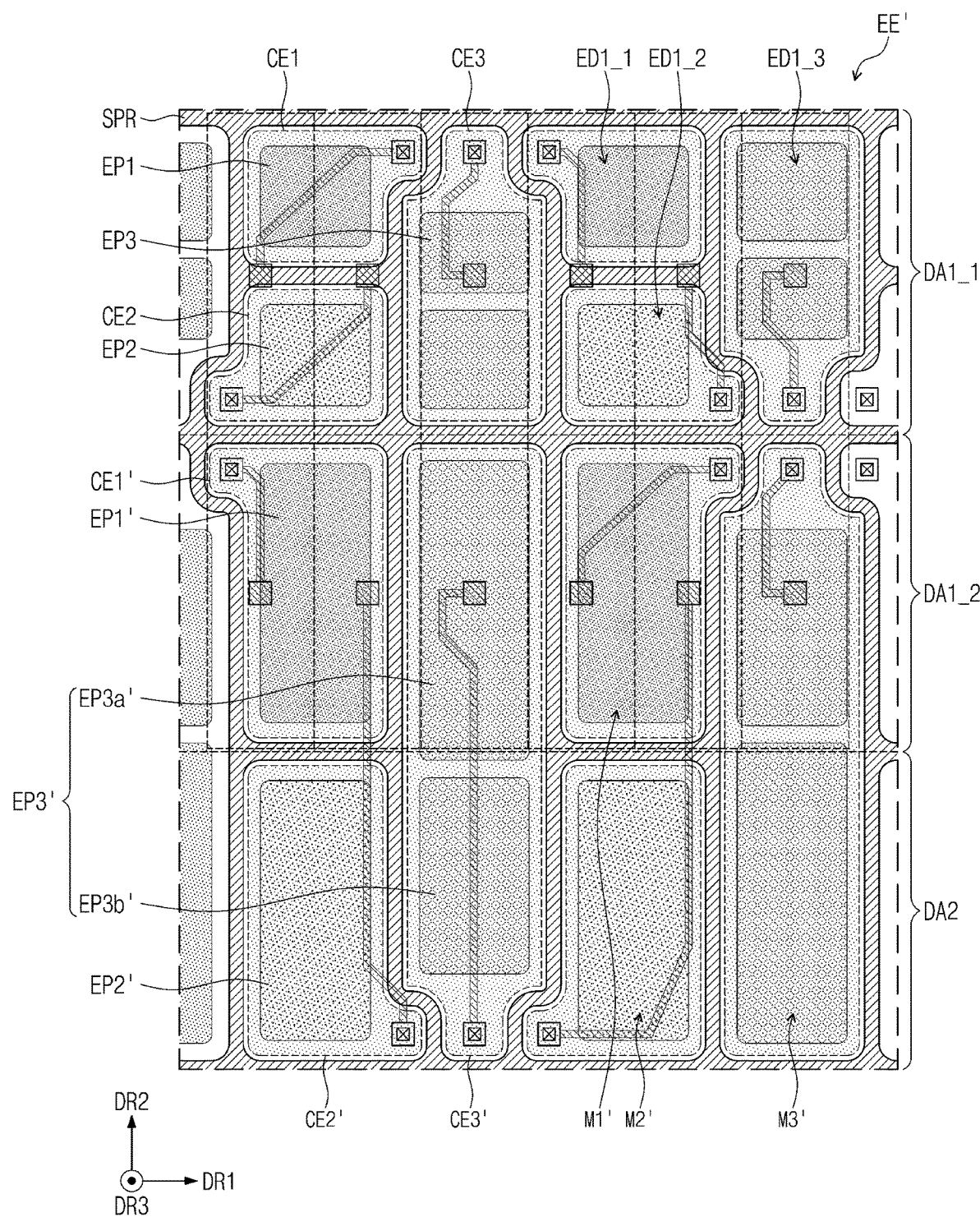

FIG. 13A is an enlarged schematic plan view of a partial region of a display panel according to an embodiment of the disclosure. FIGS. 13B and 13C are enlarged schematic plan views of region EE' in FIG. 13A according to an embodiment of the disclosure. Only normal pixel drivers PC1_1, PC1_2, and PC1_3 of normal pixels PX1 and normal connecting wires CW1, CW2, and CW3 connected thereto and extended pixel drivers PC2_1, PC2_2, and PC2_3 of extended pixels PX2' and extended connecting wires CW1', CW2', and CW3' connected thereto are illustrated in FIG. 13B, and reference numerals of the normal pixel drivers PC1_1, PC1_2, and PC1_3, the extended pixel drivers PC2_1, PC2_2, and PC2_3 and the connecting wires CW1, CW2, CW3, CW1', CW2', and CW3' are omitted in FIG. 13C.

Referring to FIGS. 13A to 13C, pixels PX (refer to FIG. 3) according to this embodiment may include normal pixels PX1 and the extended pixels PX2'. The descriptions of the normal pixels PX1 in FIG. 6A may be identically applied to the normal pixels PX1 of FIG. 13A.

In this embodiment, the extended pixels PX2' may include first to third extended pixels PX2_1', PX2_2', and PX2_3'. The first extended pixel PX2_1' may include the first extended pixel driver PC2_1 and one first extended light emitting element M1'. The second extended pixel PX2_2' may include the second extended pixel driver PC2_2 and one second extended light emitting element M2'. The third extended pixel PX2_3' may include the third extended pixel driver PC2_3 and one third extended light emitting element M3'. For example, in this embodiment, each of the first to third extended pixel drivers PC2_1, PC2_2, and PC2_3 may control driving of one light emitting element.

Each of the first to third extended light emitting elements M1', M2', and M3' may include a first electrode AE (refer to FIG. 6B), a second electrode CE1', CE2', or CE3', and an intermediate layer disposed between the first electrode AE (refer to FIG. 6B) and the second electrode CE1', CE2', or CE3'. The intermediate layer of each of the first to third extended light emitting elements M1', M2', and M3' may include an emissive layer and a functional layer. The descriptions of the first electrode AE, the intermediate layer ML, and the second electrode CE1 of the normal light emitting element ED1 in FIGS. 6A, 6B, and 7 may be similarly applied to the first electrode AE (refer to FIG. 6B), the second electrode CE1', CE2', or CE3', and the intermediate layer of each of the first to third extended light emitting elements M1', M2', and M3'.

In this specification, first to third extended light emitting parts EP1', EP2', and EP3' may be regions where light provided by the first to third extended light emitting elements M1', M2', and M3' is displayed and may correspond to a unit constituting an image displayed on the display panel DP (refer to FIG. 1).

In this embodiment, the area of the first extended light emitting part EP1' may be greater than the area of a first normal light emitting part EP1. The first extended light emitting part EP1' may overlap the corresponding first extended pixel driver PC2-1 and the adjacent second extended pixel driver PC2_2.

The area of the second extended light emitting part EP2' may be greater than the area of a second normal light emitting part EP2. The second extended light emitting part EP2' may not overlap the first to third extended pixel drivers PC2_1, PC2_2, and PC2_3 and may be disposed in a second display region DA2.

The area of the third extended light emitting part EP3' may be greater than the area of a third normal light emitting part EP3. The third extended light emitting part EP3' may include first and second extended sub-light emitting parts EP3a' and EP3b'. The first extended sub-light emitting part EP3a' may be disposed to overlap the corresponding third extended pixel driver PC2_3, and the second extended sub-light emitting part EP3b' may not overlap the first to third extended pixel drivers PC2_1, PC2_2, and PC2_3 and may be disposed in the second display region DA2. However, without being limited thereto, the third extended light emitting part EP3' may be provided as one pattern. A portion of the third extended light emitting part EP3' may be disposed in an outer display region DA1_2 and may overlap the third extended pixel driver PC2_3, and another portion of the third extended light emitting part EP3' may be disposed in the second display region DA2.

However, an arrangement of the first to third extended light emitting parts EP1', EP2', and EP3' is not limited thereto, and an overlapping relationship between the first to third extended light emitting parts EP1', EP2', and EP3' and the first to third extended pixel drivers PC2_1, PC2_2, and PC2_3 may vary depending on the ratio of the increased areas of the first to third extended light emitting parts EP1', EP2', and EP3' to the areas of the first to third normal light emitting parts EP1, EP2, and EP3.

As illustrated in FIGS. 13B and 13C, the first to third extended light emitting elements M1', M2', and M3' may be connected to the first to third extended pixel drivers PC2_1, PC2_2, and PC2_3 through the extended connecting wires CW1', CW2', and CW3' respectively. The extended connecting wires CW1', CW2', and CW3' may include the first extended connecting wire CW1' connecting the first extended light emitting element M1' and the first extended pixel driver PC2_1, the second extended connecting wire CW2' connecting the second extended light emitting element M2' and the second extended pixel driver PC2_2, and the third extended connecting wire CW3' connecting the third extended light emitting element M3' and the third extended pixel driver PC2_3.

The first extended connecting wire CW1' may include a first extended driving connection A1' and a first extended light emitting connection B1', the second extended connecting wire CW2' may include a second extended driving connection A2' and a second extended light emitting connection B2', and the third extended connecting wire CW3' may include a third extended driving connection A3' and a third extended light emitting connection B3'.

In an embodiment, the first and second extended driving connections A1' and A2' may be disposed to overlap the corresponding first extended light emitting part EP1', and the third extended driving connection A3' may be disposed to overlap the corresponding third extended light emitting part EP3'.

In an embodiment, some of the first extended light emitting connections B1' may be disposed to overlap the corresponding first extended pixel driver PC2_1, and the others may be disposed to overlap the adjacent second extended pixel driver PC2_2. The second extended light emitting connections B2' may not overlap the first to third extended pixel drivers PC2_1, PC2_2, and PC2_3 and may be disposed in the second display region DA2. Some of the third extended light emitting connections B3' may overlap the corresponding third extended pixel driver PC2_3, and the others may not overlap the first to third extended pixel drivers PC2_1, PC2_2, and PC2_3 and may be disposed in the second display region DA2.

According to this embodiment, some of the extended light emitting elements M1', M2', and M3' may be disposed in the second display region DA2. For example, some of the extended light emitting elements M1', M2', and M3' (specifically, some of the extended light emitting parts EP1', EP2', and EP3') may overlap selection circuitry SC and may overlap at least a part of DEMUX circuits MX and MX1' to MX3' (refer to FIGS. 5A and 5B) and signal selection lines SLL1 to SLL3, SLL1', and SLL2' (refer to FIGS. 5A and 5B) included in the selection circuitry SC.

In this embodiment, in the first to third extended pixel drivers PC2_1, PC2_2, and PC2_3, the shape/area of a first transistor T1 (refer to FIGS. 2A and 2B) or the capacity of a first capacitor C1 (refer to FIGS. 2A and 2B) may be controlled such that a driving current corresponding to a light emitting area increased from the light emitting area of each of the first to third normal light emitting elements ED1_1, ED1_2, and ED1_3 flows in each of the first to third extended pixel drivers PC2_1, PC2_2, and PC2_3.

Figure 14A:
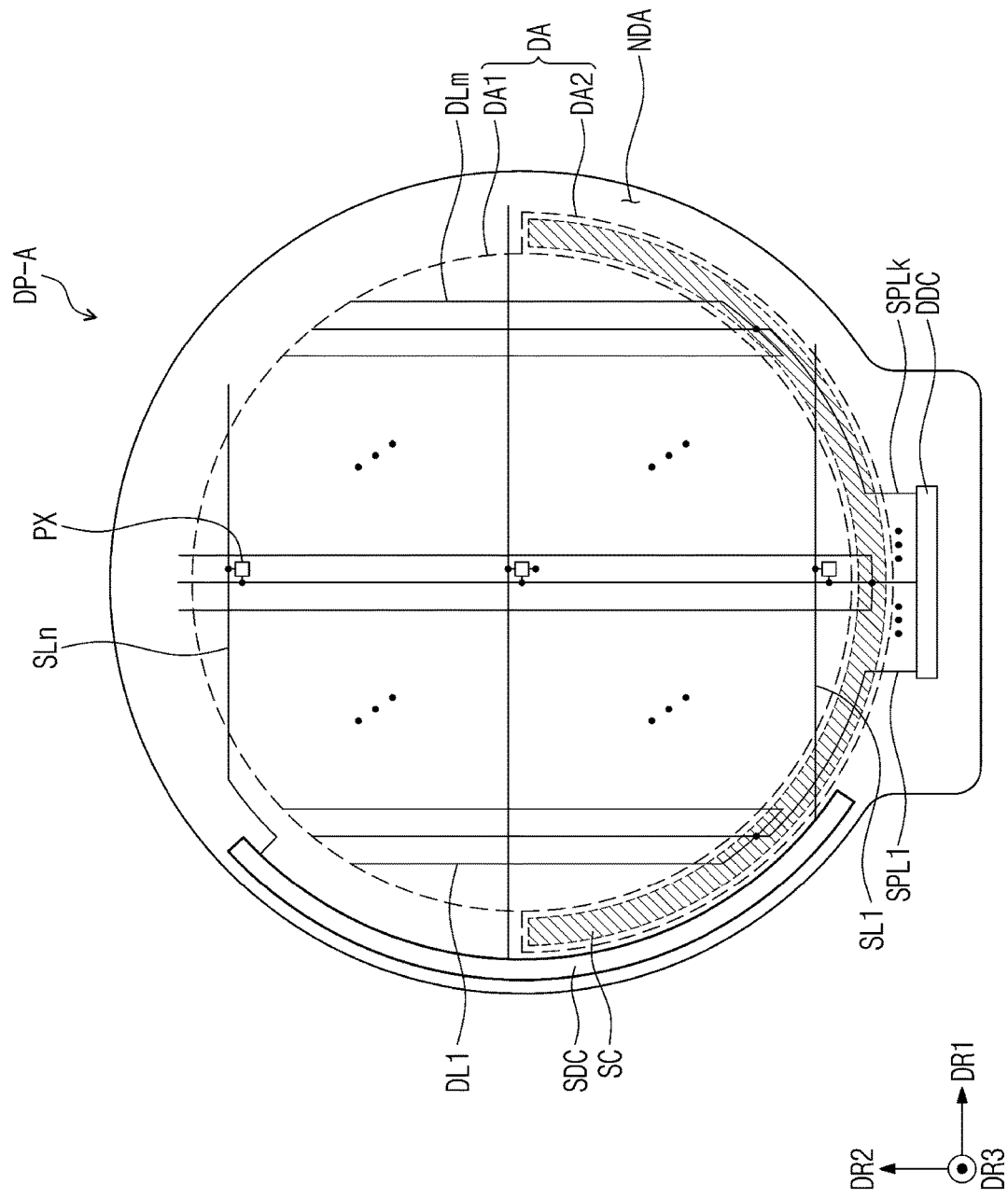
FIG. 14A is a schematic plan view of a display panel according to an embodiment of the disclosure.
Figure 14B:
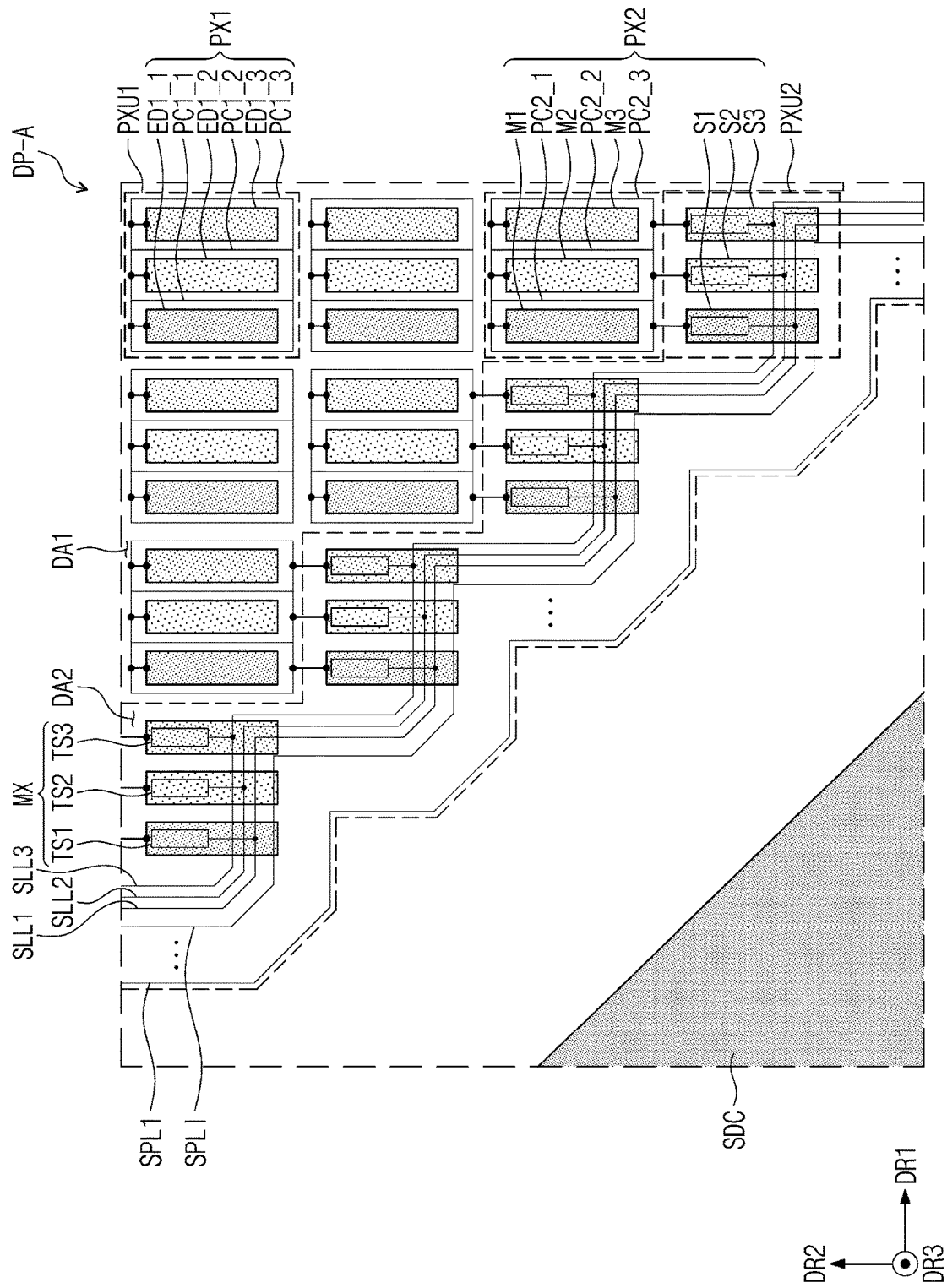
FIG. 14B is an enlarged schematic plan view of a partial region of the display panel according to an embodiment of the disclosure.

FIG. 14A is a schematic plan view of a display panel according to an embodiment of the disclosure. FIG. 14B is an enlarged schematic plan view of a partial region of the display panel according to an embodiment of the disclosure.

Referring to FIG. 14A, the display panel DP-A may have a circular shape. In an embodiment, in the display panel DP-A having a circular shape, a lower end of the display panel DP-A may protrude downward and may have a rectangular shape.

The display panel DP-A may include a display region DA and a non-display region NDA adjacent to the display region DA. The display region DA may include a first display region DA1 and a second display region DA2. In this embodiment, the first display region DA1 may have a circular shape, and the second display region DA2 may be disposed at a lower end of the first display region DA1 and may extend along a lower end portion of the first display region DA1 (e.g., a portion having a semicircular shape).

Selection circuitry SC may be disposed in the second display region DA2 and may overlap at least some of multiple pixels PX in plan view. As the selection circuitry SC is disposed in the display region DA, the area of the non-display region NDA may be decreased, as compared with a case where the selection circuitry SC is disposed in the non-display region NDA. Accordingly, the area of the display region DA may be increased, and the display device 1000 (refer to FIG. 1) having a narrow bezel may be readily implemented.

FIG. 14B is an enlarged view of a partial region of a lower left end of the display panel DP-A of FIG. 14A that includes the second display region DA2. Furthermore, FIG. 14B illustrates an arrangement of normal pixel units PXU1 constituted by normal pixels PX1 and extended pixel units PXU2 constituted by extended pixels PX2 in the display panel DP-A having a circular shape. An extended pixel PX2 constituting one extended pixel unit PXU2 is illustrated as including one main light emitting element M1, M2, or M3 and one sub-light emitting element S1, S2, or S3.

Referring to FIG. 14B, in an embodiment, first to third normal light emitting elements ED1_1, ED1_2, and ED1_3 may be arranged in the first direction DR1 and may be disposed to overlap first to third normal pixel drivers PC1_1, PC1_2, and PC1_3. The first to third main light emitting elements M1, M2, and M3 may be arranged in the first direction DR1 and may be disposed to overlap first to third extended pixel drivers PC2_1, PC2_2, and PC2_3. The first to third sub-light emitting elements S1, S2, and S3 may be arranged in the first direction DR1.

In this embodiment, the extended pixel units PXU2 may be arranged in a direction inclined with respect to the first direction DR1. The extended pixel units PXU2 may be disposed such that first to third sub-light emitting elements S1, S2, and S3 constituting one extended pixel unit PXU2 are arranged in the first direction DR1 side by side with first to third main light emitting elements M1, M2, and M3 constituting another adjacent extended pixel unit PXU2.

In FIG. 14B, DEMUX circuits MX including first to third switching transistors TS1, TS2, and TS3 of the selection circuitry SC, first to third signal selection lines SLL1, SLL2, and SLL3 connected to the first to third switching transistors TS1, TS2, and TS3, and signal supply lines SPL1 to SPL1 connected to output nodes of the DEMUX circuits MX are illustrated.

In an embodiment, each of the DEMUX circuits MX may be disposed under the first to third main light emitting elements M1, M2, and M3 of the corresponding extended pixel unit PXU2. For example, each of the DEMUX circuits MX may overlap the first to third sub-light emitting elements S1, S2, and S3 of the corresponding extended pixel unit PXU2.

Although FIG. 14B illustrates one example that the signal supply lines SPL1 to SPL1 are disposed between a scan driver SDC and the selection circuitry SC, the disclosure is not limited thereto, and the data lines DL1 to DLm, the first scan lines GWL1 to GWLn, the second scan lines GCL1 to GCLn, the third scan lines GIL1 to GILn, the fourth scan lines GBL1 to GBLn, the fifth scan lines GRL1 to GRLn, or the emission lines eS11 to ESLn described above with reference to FIG. 1 may be additionally disposed.

According to the disclosure, the display panel may have the display region extended to the region where the DEMUX circuit is disposed. According to the disclosure, the display panel may minimize electrical interference of the DEMUX circuit that reaches the light emitting elements, thereby improving electrical reliability of the light emitting elements.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure.

What is claimed is:

1. A display panel, comprising:
 a base layer including:
  a first display region;
  a second display region adjacent to the first display region; and
  a non-display region adjacent to the first display region and the second display region;
 a demultiplexer circuit overlapping the second display region;
 a first pixel including:
  a first pixel driver overlapping the first display region; and
  a first light emitting element overlapping the first display region and electrically connected with the first pixel driver; and
 a second pixel including:
  a second pixel driver overlapping the first display region; and
  a second light emitting element and a third light emitting element that are electrically connected with the second pixel driver, wherein
 the second light emitting element overlaps the second pixel driver, and
 the third light emitting element overlaps both the demultiplexer circuit and the second display region, and is electrically connected with the second pixel driver in the second display region.

2. The display panel of claim 1, wherein
 the second light emitting element overlaps the first display region and is electrically connected with the second pixel driver in the first display region in plan view.

3. The display panel of claim 1, further comprising:
 a first signal selection line and a second signal selection line that provide a first selection signal and a second selection signal to the demultiplexer circuit, respectively,
 wherein the demultiplexer circuit includes:
  a first switching transistor electrically connected with the first signal selection line; and
  a second switching transistor electrically connected with the second signal selection line.

4. The display panel of claim 3, wherein at least one of the second light emitting element and the third light emitting element overlaps at least one of the first switching transistor and the second switching transistor and the first signal selection line and the second signal selection line.

5. The display panel of claim 3, wherein
 the first pixel includes a plurality of first pixels,
 the second pixel includes a plurality of second pixels,
 the display panel further includes:
  a first data line electrically connected to a part of the plurality of first pixels and a part of the plurality of second pixels;
  a second data line electrically connected to another part of the plurality of first pixels and another part of the plurality of second pixels; and
  a signal supply line that provides a data signal to the first and second data lines, and
 the first switching transistor is electrically connected to the first data line and the signal supply line, and
 the second switching transistor is electrically connected to the second data line and the signal supply line.

6. The display panel of claim 5, wherein
 the first switching transistor includes:
  a first electrode electrically connected with the first data line;
  a second electrode electrically connected with the signal supply line; and
  a first gate electrode electrically connected with the first signal selection line, and
 the second switching transistor includes:
  a first electrode electrically connected with the second data line;
  a second electrode electrically connected with the signal supply line; and
  a second gate electrode electrically connected with the second signal selection line.

7. The display panel of claim 3, further comprising:
 a first connecting wire that electrically connects the second pixel driver and the third light emitting element; and
 a shielding electrode, wherein the first and second signal selection lines and the first and second switching transistors are disposed below the shielding electrode, and the third light emitting element and the first connecting wire are disposed on the shielding electrode.

8. The display panel of claim 7, further comprising:
a connecting electrode disposed between the second pixel driver and the first connecting wire, the first connecting wire being electrically connected to the connecting electrode, wherein
the second pixel driver includes:
a semiconductor pattern to which the connecting electrode is electrically connected; and
a gate electrode disposed on the semiconductor pattern, and the shielding electrode and the connecting electrode are disposed on a same layer.

9. The display panel of claim 8, wherein the first and second signal selection lines and the gate electrode are disposed on a same layer.

10. The display panel of claim 8, wherein
the second pixel driver further includes a lower conductive layer disposed under the semiconductor pattern, and
wherein the first and second signal selection lines and one of the gate electrode and the lower conductive layer are disposed on a same layer.

11. The display panel of claim 1, further comprising:
a first connecting wire that electrically connects the second pixel driver and the third light emitting element.

12. The display panel of claim 11, wherein
the second light emitting element overlaps the first display region,
the third light emitting element overlaps the second display region, and
the first connecting wire includes:
a first connection electrically connected with the second pixel driver and overlapping the first display region; and
a second connection electrically connected with the third light emitting element and overlapping the second display region.

13. The display panel of claim 11, further comprising:
a second connecting wire that electrically connects the second pixel driver and the second light emitting element and is spaced apart from the first connecting wire,
wherein the second connecting wire includes:
a third connection electrically connected with the second pixel driver; and
a fourth connection electrically connected with the second light emitting element and spaced apart from the third connection in plan view.

14. The display panel of claim 13, wherein the first and second connecting wires are disposed on a same layer.

15. The display panel of claim 13, wherein the first and second connecting wires are disposed on different layers.

16. The display panel of claim 15, further comprising:
an additional connecting wire electrically connected with the first connecting wire and that makes contact with a second electrode of the third light emitting element, wherein
the first and second connecting wires are disposed on different layers, and the first connecting wire is disposed on the second connecting wire, and
the additional connecting wire and the second connecting wire are disposed on a same layer.

17. The display panel of claim 16, wherein the first connecting wire includes at least one of a metallic material and transparent conductive oxide.

18. The display panel of claim 11, wherein
the first connecting wire includes:
a first layer;
a second layer disposed on the first layer; and
a third layer disposed on the second layer and including a same material as the first layer, and
an edge of the second layer is disposed inward of the first connecting wire, compared to edges of the first and third layers.

19. The display panel of claim 18, wherein
the third light emitting element includes:
a first electrode;
a second electrode disposed on the first electrode; and
an intermediate layer disposed between the first electrode and the second electrode, and
the second electrode of the third light emitting element is brought into contact with a side surface of the second layer of the first connecting wire.

20. The display panel of claim 1, wherein the second pixel further includes a fourth light emitting element overlapping the second display region and electrically connected with the second pixel driver, the fourth light emitting element being spaced apart from the second light emitting element with the third light emitting element between the fourth light emitting element and the second light emitting element.

21. The display panel of claim 20, further comprising:
a first connecting wire that electrically connects the second pixel driver and the third light emitting element; and
a third connecting wire that electrically connects the second pixel driver and the fourth light emitting element.

22. The display panel of claim 1, further comprising:
a third pixel disposed between the first and second pixels, wherein
the first display region includes:
an inner display region; and
an outer display region,
the first pixel overlaps the inner display region, and
the third pixel includes:
a third pixel driver overlapping the outer display region, and
a fifth light emitting element and a sixth light emitting element overlapping the outer display region and electrically connected with the third pixel driver.

23. The display panel of claim 22, wherein
the second pixel driver overlaps the outer display region, and
the second light emitting element and the third light emitting element overlaps the second display region.

24. The display panel of claim 1, wherein the first light emitting element, the second light emitting element, and the third light emitting element are sequentially arranged in a direction from the first display region toward the second display region.

25. The display panel of claim 1, wherein
the third light emitting element is disposed on the demultiplexer circuit in the second display region, and
a region where light is emitted from the third light emitting element overlaps the demultiplexer circuit.

26. The display panel of claim 1, wherein
each of the first and second pixel drivers includes a driving transistor, and
the driving transistor of the first pixel driver and the driving transistor of the second pixel driver differ from each other in terms of at least one of shape and area.

27. The display panel of claim 1, wherein
each of the first and second pixel drivers includes a capacitor, and capacitance of the capacitor of the first pixel driver differs from capacitance of the capacitor of the second pixel driver.

28. The display panel of claim 1, wherein the first display region has a circular or polygonal shape.

29. An electronic device, comprising:
a scan driver supplying a plurality of scan signals;
a data driver supplying a plurality of data signals; and
a display panel comprising:
a base layer including:
　a first display region;
　a second display region adjacent to the first display region; and
　a non-display region adjacent to the first display region and the second display region;
a first pixel group and a second pixel group that are disposed on the base layer;
a first data line and a second data line that are electrically connected to the first pixel group and the second pixel group, respectively;
a demultiplexer circuit overlapping the second display region and selectively that provides a data signal to the first data line and the second data line; and
a signal supply line overlapping the non-display region and that provides the data signal to the demultiplexer circuit, wherein
the first pixel group includes:
　a first pixel including:
　　a first pixel driver overlapping the first display region; and
　　a first light emitting element overlapping the first display region and electrically connected with the first pixel driver; and
　a second pixel including:
　　a second pixel driver overlapping the first display region; and
　　a second light emitting element and a third light emitting element that are electrically connected with the second pixel driver, and
the second light emitting element overlaps the second pixel driver, and
the third light emitting element overlaps both the demultiplexer circuit and the second display region, and is electrically connected with the second pixel driver in the second display region.

30. A display panel, comprising:
a base layer including:
　a first display region;
　a second display region adjacent to the first display region; and
　a non-display region adjacent to the first display region and the second display region;
a demultiplexer circuit overlapping the second display region;
a first pixel including:
　a first pixel driver overlapping the first display region; and
　a first light emitting element overlapping the first display region and electrically connected with the first pixel driver; and
a second pixel including:
　a second pixel driver overlapping the first display region; and
　a second light emitting element overlapping the first and second display regions and electrically connected with the second pixel driver, wherein
the second light emitting element overlaps the second pixel driver and the demultiplexer circuit, and
a region where light is emitted from the second light emitting element has a larger area than a region where light is emitted from the first light emitting element.

* * * * *